(12) United States Patent
Endo et al.

(10) Patent No.: US 11,901,460 B2
(45) Date of Patent: Feb. 13, 2024

(54) SEMICONDUCTOR DEVICE

(71) Applicant: SEMICONDUCTOR ENERGY LABORATORY CO., LTD., Atsugi (JP)

(72) Inventors: Yuta Endo, Kanagawa (JP); Hideomi Suzawa, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 17/708,084

(22) Filed: Mar. 30, 2022

(65) Prior Publication Data

US 2022/0352378 A1    Nov. 3, 2022

Related U.S. Application Data

(63) Continuation of application No. 16/637,384, filed as application No. PCT/IB2018/056301 on Aug. 21, 2018, now Pat. No. 11,296,231.

(30) Foreign Application Priority Data

Aug. 25, 2017 (JP) .................................. 2017-161809

(51) Int. Cl.
  *H01L 27/12* (2006.01)
  *H01L 29/786* (2006.01)
  *H10B 12/00* (2023.01)

(52) U.S. Cl.
  CPC ...... *H01L 29/7869* (2013.01); *H01L 27/1225* (2013.01); *H10B 12/05* (2023.02); *H10B 12/30* (2023.02)

(58) Field of Classification Search
  CPC ......... H01L 27/10805; H01L 27/10873; H01L 27/1225; H01L 29/7869; H01L 29/78642;
  (Continued)

(56) References Cited

U.S. PATENT DOCUMENTS 6,448,607 B1    9/2002  Hsu et al.
7,015,537 B2    3/2006  Lee et al.
(Continued)

FOREIGN PATENT DOCUMENTS

CN    103415921 A    11/2013
JP    2007-096055 A    4/2007
(Continued)

OTHER PUBLICATIONS

International Search Report (Application No. PCT/IB2018/056301) dated Nov. 20, 2018.

(Continued)

*Primary Examiner* — Nikolay K Yushin
(74) *Attorney, Agent, or Firm* — Fish & Richardson P.C.

(57) ABSTRACT

A semiconductor device that can be highly integrated is provided.
The semiconductor device includes first and second transistors and first and second capacitors. Each of the first and second transistors includes a gate insulator and a gate electrode over an oxide. Each of the first and second capacitors includes a conductor, a dielectric over the conductor, and the oxide. The first and second transistors are provided between the first capacitor and the second capacitor. One of a source and a drain of the first transistor is also used as one of a source and a drain of the second transistor. The other of the source and the drain of the first transistor is also used as one electrode of the first capacitor. The other of the source and the drain of the second transistor is also used as one electrode of the second capacitor. The channel lengths of the first and second transistors are larger than the lengths in a direction parallel to short sides of fourth and fifth conductors.

11 Claims, 33 Drawing Sheets

(58) Field of Classification Search
CPC ....... H01L 29/786; H10B 12/05; H10B 12/30; H10B 12/00; H10B 12/03
See application file for complete search history.

(56) References Cited

U.S. PATENT DOCUMENTS

| | | |
|---|---|---|
| 7,674,650 B2 | 3/2010 | Akimoto et al. |
| 8,120,095 B2 | 2/2012 | Ho et al. |
| 8,487,303 B2 | 7/2013 | Takemura |
| 8,709,889 B2 | 4/2014 | Saito |
| 8,809,854 B2 | 8/2014 | Isobe et al. |
| 8,860,108 B2 | 10/2014 | Yamazaki et al. |
| 9,029,822 B2 | 5/2015 | Satoh et al. |
| 9,029,929 B2 | 5/2015 | Saito |
| 9,059,029 B2 | 6/2015 | Arai |
| 9,142,549 B2 | 9/2015 | Takemura |
| 9,312,257 B2 | 4/2016 | Yamazaki et al. |
| 9,425,107 B2 | 8/2016 | Matsubayashi |
| 9,660,095 B2 | 5/2017 | Isobe et al. |
| 9,666,491 B1 | 5/2017 | Zhou et al. |
| 9,748,273 B2 | 8/2017 | Yamazaki et al. |
| 9,812,458 B2 | 11/2017 | Matsubayashi |
| 9,954,003 B2 | 4/2018 | Matsuda et al. |
| 10,038,011 B2 | 7/2018 | Yamazaki et al. |
| 10,079,238 B2 | 9/2018 | Matsubayashi |
| 10,170,630 B2 | 1/2019 | Arai |
| 10,192,995 B2 | 1/2019 | Tezuka et al. |
| 10,388,799 B2 | 8/2019 | Isobe et al. |
| 10,418,381 B2 | 9/2019 | Yamazaki et al. |
| 10,950,734 B2 | 3/2021 | Tezuka et al. |
| 2009/0251973 A1 | 10/2009 | Satoh |
| 2011/0228584 A1 | 9/2011 | Takemura |
| 2012/0228688 A1 | 9/2012 | Matsubayashi |
| 2013/0221356 A1 | 8/2013 | Yamazaki et al. |
| 2013/0228839 A1 | 9/2013 | Arai |
| 2013/0256658 A1 | 10/2013 | Takemura |
| 2015/0357473 A1 | 12/2015 | Arai |
| 2016/0225790 A1 | 8/2016 | Yamazaki et al. |
| 2016/0358923 A1 | 12/2016 | Matsubayashi |
| 2017/0236842 A1 | 8/2017 | Matsuda et al. |
| 2017/0358609 A1 | 12/2017 | Yamazaki et al. |
| 2018/0076204 A1 | 3/2018 | Matsubayashi |
| 2019/0371821 A1 | 12/2019 | Yamazaki et al. |

FOREIGN PATENT DOCUMENTS

| | | |
|---|---|---|
| JP | 2007-123861 A | 5/2007 |
| JP | 2011-119674 A | 6/2011 |
| JP | 2011-227981 A | 11/2011 |
| JP | 2012-256847 A | 12/2012 |
| JP | 2012-256877 A | 12/2012 |
| JP | 2013-012289 A | 1/2013 |
| JP | 2013-211090 A | 10/2013 |
| JP | 2013-211537 A | 10/2013 |
| JP | 2013-214729 A | 10/2013 |
| JP | 2015-038997 A | 2/2015 |
| JP | 2015-233155 A | 12/2015 |
| JP | 2016-225635 A | 12/2016 |
| JP | 2017-126763 A | 7/2017 |
| JP | 2017-126789 A | 7/2017 |
| JP | 2017-147445 A | 8/2017 |
| JP | 2017-157866 A | 9/2017 |
| JP | 2017-216474 A | 12/2017 |
| KR | 2013-0057423 A | 5/2013 |
| KR | 2013-0099847 A | 9/2013 |
| WO | WO-2011/114905 | 9/2011 |
| WO | WO-2012/121265 | 9/2012 |
| WO | WO-2016/174546 | 11/2016 |

OTHER PUBLICATIONS

Written Opinion (Application No. PCT/IB2018/056301) dated Nov. 20, 2018.

FIG. 6A
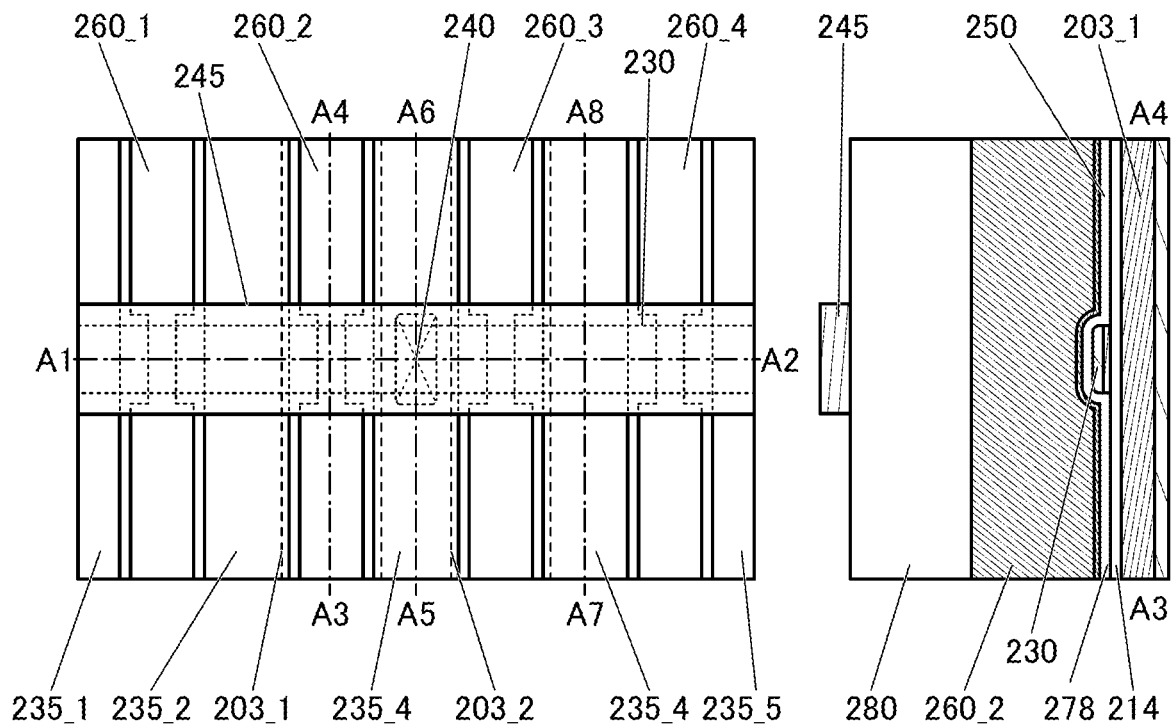
FIG. 6C
FIG. 6B
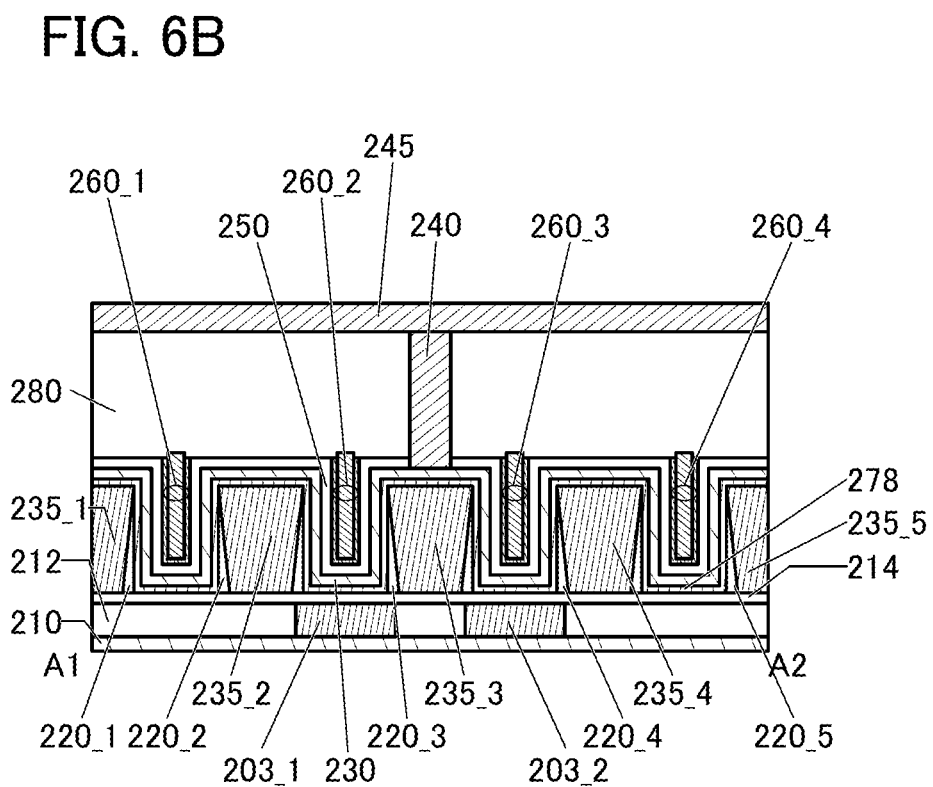

SEMICONDUCTOR DEVICE

CROSS REFERENCE TO RELATED APPLICATIONS

This application is a is a continuation of U.S. application Ser. No. 16/637,384, filed Feb. 7, 2020, now allowed, which is a U.S. National Phase application under 35 U.S.C. § 371 of International Application PCT/IB2018/056301, filed on Aug. 21, 2018, which is incorporated by reference, and which claims the benefit of a foreign priority application filed in Japan on Aug. 25, 2017, as Application No. 2017-161809.

TECHNICAL FIELD

One embodiment of the present invention relates to a semiconductor device and a method for driving the semiconductor device. Another embodiment of the present invention relates to a semiconductor wafer, a module, and an electronic device.

Note that in this specification and the like, a semiconductor device generally means a device that can function by utilizing semiconductor characteristics. As well as a semiconductor element such as a transistor, a semiconductor circuit, an arithmetic device, and a memory device are each an embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like each include a semiconductor device.

Note that one embodiment of the present invention is not limited to the above technical field. One embodiment of the invention disclosed in this specification and the like relates to an object, a method, or a manufacturing method. Another one embodiment of the present invention relates to a process, a machine, manufacture, or a composition of matter.

BACKGROUND ART

A technique in which a transistor is formed using a semiconductor thin film has attracted attention. The transistor is widely applied to electronic devices such as an integrated circuit (IC) and an image display device (also simply referred to as a display device). A silicon-based semiconductor material is widely known as a semiconductor thin film applicable to the transistor; in addition, an oxide semiconductor has been attracting attention as another material.

For example, techniques have been disclosed by each of which a display device is manufactured using a transistor whose active layer is formed of zinc oxide or an In—Ga—Zn-based oxide as an oxide semiconductor (see Patent Document 1 and Patent Document 2).

In recent years, a technique has been disclosed by which an integrated circuit of a memory device is manufactured using a transistor including an oxide semiconductor (see Patent Document 3). Furthermore, not only memory devices but also arithmetic devices and the like are manufactured using transistors including oxide semiconductors.

REFERENCES

Patent Documents

[Patent Document 1] Japanese Published Patent Application No. 2007-123861

[Patent Document 2] Japanese Published Patent Application No. 2007-96055

[Patent Document 3] Japanese Published Patent Application No. 2011-119674

SUMMARY OF THE INVENTION

Problems to be Solved by the Invention

Here, the integration of integrated circuits and miniaturization of transistors have progressed in accordance with an increase in performance and a reduction in size and weight of electronic devices. Thus, the process rule for fabricating a transistor has decreased year by year as follows: 45 nm, 32 nm, and 22 nm. Accordingly, transistors with fine structures including oxide semiconductors are required to have good electrical characteristics as designed.

An object of one embodiment of the present invention is to provide a semiconductor device that can be miniaturized or highly integrated. Another object of one embodiment of the present invention is to provide a semiconductor device having favorable electrical characteristics. Another object of one embodiment of the present invention is to provide a semiconductor device with a low off-state current. Another object of one embodiment of the present invention is to provide a transistor with a high on-state current. Another object of one embodiment of the present invention is to provide a highly reliable semiconductor device. Another object of one embodiment of the present invention is to provide a semiconductor device with low power consumption. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device in which power consumption can be reduced. Another object of one embodiment of the present invention is to provide a novel semiconductor device.

Note that the descriptions of these objects do not disturb the existence of other objects. One embodiment of the present invention does not need to achieve all of these objects. Other objects will be apparent from and can be derived from the description of the specification, the drawings, the claims, and the like.

Means for Solving the Problems

One embodiment of the present invention is a semiconductor device including a first insulator; a first conductor and a second conductor over the first insulator; a third conductor provided between the first conductor and the second conductor; a dielectric formed to cover the first insulator and the first to third conductors; an oxide over the dielectric; a second insulator positioned between the first conductor and the third conductor and in contact with the oxide; a third insulator positioned between the second conductor and the third conductor and in contact with the oxide; a fourth conductor in contact with the second insulator; a fifth conductor in contact with the third insulator; and a sixth conductor overlapping with the third conductor.

One embodiment of the present invention is a semiconductor device including a first insulator; a first conductor and a second conductor over the first insulator; a third conductor provided between the first conductor and the second conductor; a dielectric formed to cover the first insulator and the first to third conductors; an oxide over the dielectric; a second insulator positioned between the first conductor and the third conductor and in contact with the oxide; a third insulator positioned between the second conductor and the third conductor and in contact with the oxide; a fourth conductor in contact with the second insulator; a fifth conductor in contact with the third insulator; and a sixth conductor overlapping with the third conductor. A first transistor includes the oxide, the second insulator, and the fourth conductor. A second transistor includes the oxide, the third insulator, and the fifth conductor. A first capacitor includes the first conductor, the dielectric, and the oxide. A second capacitor includes the second conductor, the dielectric, and the oxide. The first transistor and the second transistor are provided between the first capacitor and the second capacitor. One of a source and a drain of the first transistor is also used as one of a source and a drain of the second transistor. The other of the source and the drain of the first transistor is also used as one electrode of the first capacitor. The other of the source and the drain of the second transistor is also used as one electrode of the second capacitor. The channel length of the first transistor is larger than the length in a direction parallel to a short side of the fourth conductor. The channel length of the second transistor is larger than the length in a direction parallel to a short side of the fifth conductor.

The semiconductor device described above includes a fourth insulator provided over the first transistor, the second transistor, the first capacitor, and the second capacitor; an opening which is included in the fourth insulator and through which the oxide is exposed; the sixth conductor provided in the opening; and a seventh conductor functioning as a wiring, over the fourth insulator and the sixth conductor.

In the semiconductor device described above, the first to fifth conductors are provided to be substantially perpendicular to a direction of a long side of the oxide, and the seventh conductor is provided to be substantially parallel to the direction of the long side of the oxide.

In the semiconductor device described above, the oxide includes In and an element M (M is Al, Ga, Y, or Sn), and Zn.

According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device with low off-state current can be provided. According to one embodiment of the present invention, a transistor with high on-state current can be provided. According to one embodiment of the present invention, a highly reliable semiconductor device can be provided. According to one embodiment of the present invention, a semiconductor device with reduced power consumption can be provided. According to one embodiment of the present invention, a semiconductor device with high productivity can be provided.

A semiconductor device capable of retaining data for a long time can be provided. A semiconductor device capable of high-speed data writing can be provided. A semiconductor device with high design flexibility can be provided. A semiconductor device in which power consumption can be reduced can be provided. A novel semiconductor device can be provided.

Note that the descriptions of the effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

FIGS. 6A to 6C A top view and cross-sectional views of a semiconductor device according to one embodiment of the present invention.

BEST MODE FOR CARRYING OUT THE INVENTION

Figure 1A:
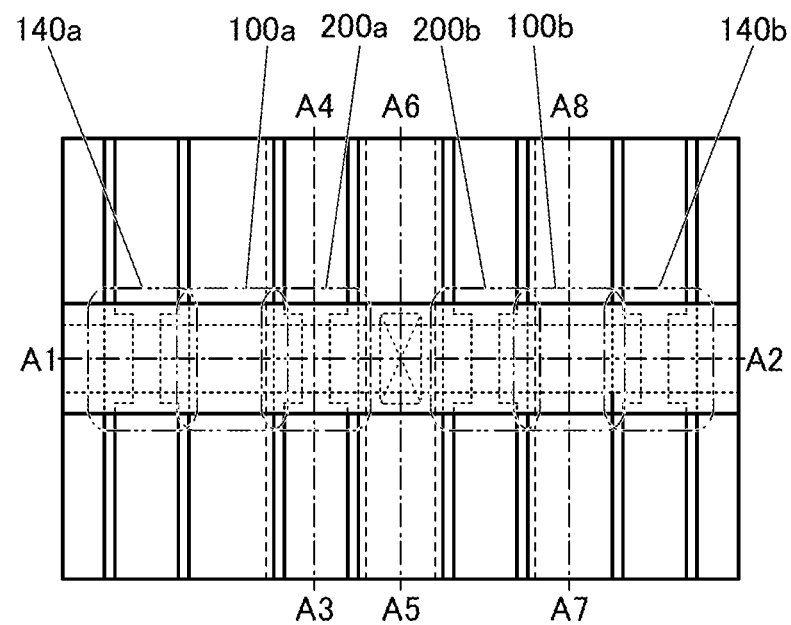
FIGS. 1A and 1B A top view and a cross sectional view of a semiconductor device according to one embodiment of the present invention.

Embodiments will be described below with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes, values, or the like shown in the drawings. For example, in the actual manufacturing process, a layer, a resist mask, or the like might be unintentionally reduced in size by treatment such as etching, which is not illustrated in some cases for easy understanding. Note that in drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like may be omitted.

Note that the ordinal numbers such as "first", "second", and the like in this specification and the like are used for convenience and do not denote the order of steps or the stacking order of layers. Therefore, for example, description can be made even when "first" is replaced with "second", "third", or the like as appropriate. In addition, the ordinal numbers in this specification and the like are not necessarily the same as the ordinal numbers which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, terms for the description are not limited to those used in this specification, and description can be made appropriately depending on the situation.

In this specification and the like, a transistor is an element having at least three terminals of a gate, a drain, and a source. A channel formation region is included between the drain (a drain terminal, a drain region, or a drain electrode) and the source (a source terminal, a source region, or a source electrode), and a current can flow between the source and the drain through the channel formation region. Note that in this specification and the like, a channel formation region refers to a region through which a current mainly flows.

Furthermore, functions of a source and a drain are sometimes interchanged with each other when transistors having different polarities are used or when the direction of current is changed in circuit operation, for example Therefore, in this specification and the like, the terms "source" and "drain" can be interchanged with each other in some cases.

Note that the channel length refers to, for example, the distance between a source and a drain in a region where a semiconductor (or a portion where current flows in a semiconductor when a transistor is on) and a gate electrode overlap with each other or a region where a channel is formed in a top view of the transistor. Note that in one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

Note that depending on transistor structures, a channel length in a region where a channel is actually formed (hereinafter, also referred to as an "effective channel length") is different from a channel length shown in a top view of a transistor (hereinafter, also referred to as an "apparent channel length") in some cases. For example, when a gate electrode covers a side surface of a semiconductor, an effective channel length is larger than an apparent channel length, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel length is larger than an apparent channel length.

The channel width refers to, for example, the length of a channel formation region in a direction perpendicular to a channel length direction in a region where a semiconductor (or a portion where current flows in a semiconductor when a transistor is in an on state) and a gate electrode overlap with each other, or a region where a channel is formed in a top view of the transistor. Note that in one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate electrode covers a side surface of a semiconductor, an effective channel width is larger than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is larger than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

Thus, in this specification, an apparent channel width is referred to as a "surrounded channel width (SCW)" in some cases. Furthermore, in this specification, the simple term "channel width" refers to a surrounded channel width or an apparent channel width in some cases. Alternatively, in this specification, the simple term "channel width" refers to an effective channel width in some cases. Note that values of a channel length, a channel width, an effective channel width, an apparent channel width, a surrounded channel width, and the like can be determined, for example, by analyzing a cross-sectional TEM image or the like.

Note that an impurity in a semiconductor refers to, for example, elements other than the main components of a semiconductor. For example, an element with a concentration lower than 0.1 atomic % can be regarded as an impurity. When an impurity is contained, for example, DOS (Density of States) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In the case of an oxide semiconductor, oxygen vacancies may be formed by entry of impurities. Furthermore, in the case where the semiconductor is silicon, examples of an impurity which changes the characteristics of the semiconductor include oxygen, Group 1 elements except hydrogen, Group 2 elements, Group 13 elements, and Group 15 elements.

Note that in this specification and the like, a silicon oxynitride film is a film in which oxygen content is higher than nitrogen content in its composition. A silicon oxynitride film preferably contains, for example, oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. Moreover, a silicon nitride oxide film is a film in which nitrogen content is higher than oxygen content in its composition. A silicon nitride oxide film preferably contains, for example, nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the term "film" and the term "layer" can be interchanged with each other. For example, the term "conductive layer" can be changed into the term "conductive film" in some cases. Alternatively, for example, the term "insulating film" can be changed into the term "insulating layer" in some cases.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "$V_{th}$") is larger than 0 V.

In this specification and the like, "parallel" indicates a state where two straight lines are placed such that the angle formed therebetween is greater than or equal to −10° and less than or equal to 10°. Accordingly, the case where the angle is greater than or equal to −5° and less than or equal to 5° is also included. Furthermore, the term "substantially parallel" indicates a state where two straight lines are placed such that the angle formed therebetween is greater than or equal to −30° and less than or equal to 30°. Moreover, "perpendicular" indicates a state where two straight lines are placed such that the angle formed therebetween is greater than or equal to 80° and less than or equal to 100°. Thus, the case where the angle is greater than or equal to 85° and less than or equal to 95° is also included. In addition, "substantially perpendicular" indicates a state where two straight lines are placed such that the angle formed therebetween is greater than or equal to 60° and less than or equal to 120°.

Note that in this specification, a barrier film refers to a film having a function of inhibiting the passage of oxygen and impurities such as hydrogen. The barrier film that has conductivity may be referred to as a conductive barrier film.

In this specification and the like, a metal oxide means an oxide of metal in a broad expression. Metal oxides are classified into an oxide insulator, an oxide conductor (including a transparent oxide conductor), an oxide semiconductor (or simply referred to as an OS), and the like. For example, in the case where a metal oxide is used in an active layer of a transistor, the metal oxide is referred to as an oxide semiconductor in some cases. That is, in the case where an OS FET (Field Effect Transistor) is stated, it can also be referred to as a transistor including an oxide or an oxide semiconductor.

Embodiment 1

A semiconductor device of one embodiment of the present invention is a semiconductor device including an oxide in a channel formation region. In this embodiment, embodiments of semiconductor devices will be described with reference to FIG. 1 to FIG. 20.

Structure Example of Semiconductor Device

An example of a semiconductor device of one embodiment of the present invention including a transistor 200a, a transistor 200b, a transistor 140a, a transistor 140b, a capacitor 100a, and a capacitor 100b will be described below. Embodiments of semiconductor devices will be described below with reference to FIG. 1 to FIG. 20.

Figure 1B:
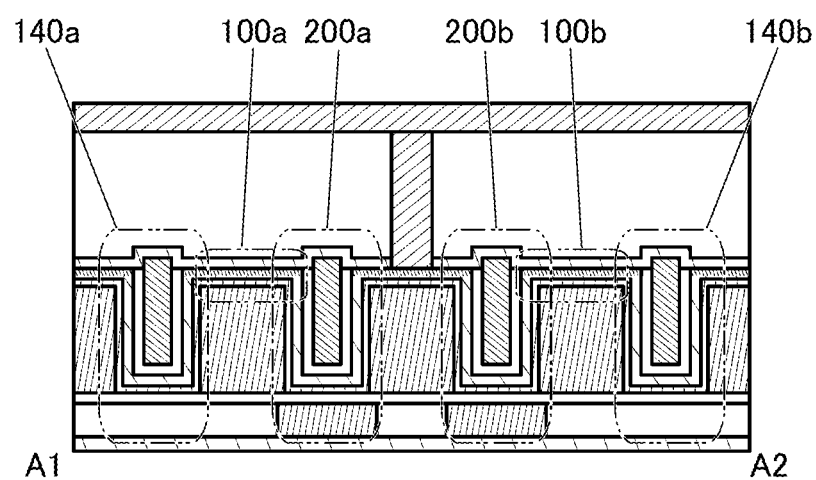
Figure 2A:
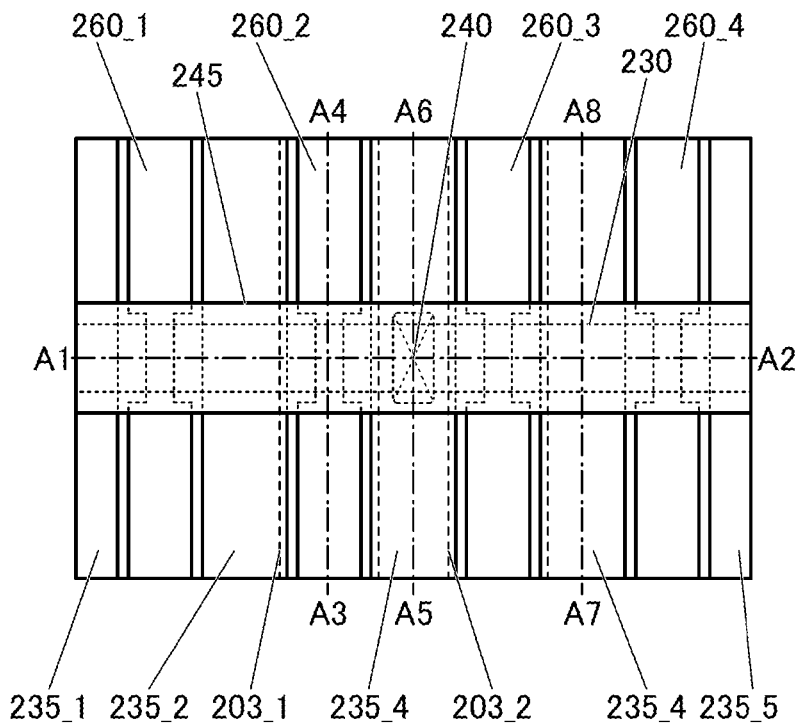
FIGS. 2A to 2C A top view and cross sectional views of a semiconductor device according to one embodiment of the present invention.
Figure 2C:
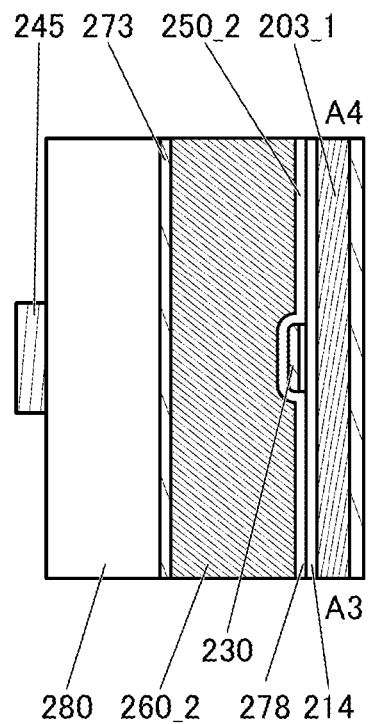
Figure 2B:
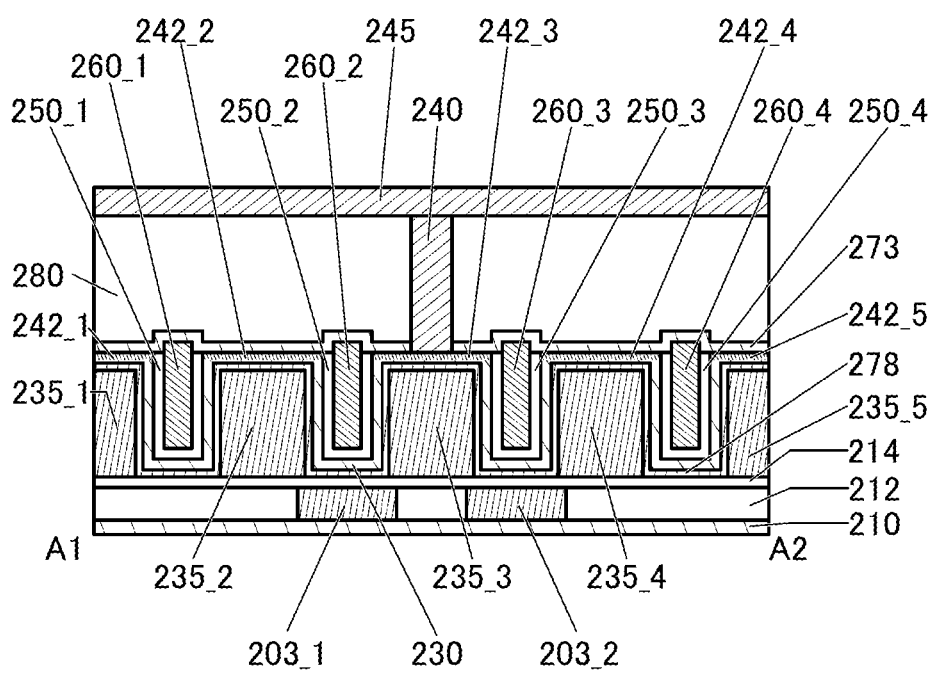

FIG. 1(A) and FIG. 2(A) are top views of the semiconductor device including the transistor 200a, the transistor 200b, the transistor 140a, the transistor 140b, the capacitor 100a, and the capacitor 100b. FIG. 1(B) and FIG. 2(B) are cross-sectional views of portions indicated by dashed-dotted line A1-A2 in FIG. 1(A) and FIG. 2(A), respectively. Furthermore, FIG. 2(C) is a cross-sectional view of a portion indicated by dashed-dotted line A3-A4 in FIG. 2(A). For simplification of the drawing, some components are not illustrated in the top views of FIG. 1(A) and FIG. 2(A). FIG. 2 is a drawing in which components in FIG. 1 are denoted by reference numerals.

The semiconductor device of one embodiment of the present invention includes the transistor 200a, the transistor 200b, the transistor 140a, the transistor 140b, the capacitor 100a, and the capacitor 100b as illustrated in FIG. 1 and FIG. 2. In addition, the semiconductor device includes an insulator 210 and an insulator 280 each functioning as an interlayer film, a conductor 240 functioning as a plug, and a conductor 245 electrically connected to the conductor 240 and functioning as a wiring.

Here, the transistor 200a and the transistor 200b are symmetric centering on the intersection point of dashed-dotted line A1-A2 and dashed-dotted line A5-A6 in the portion illustrated in FIG. 1(A).

Similarly, the transistor 140a and the transistor 140b are symmetric centering on the intersection point of dashed-dotted line A1-A2 and dashed-dotted line A5-A6 in the portion illustrated in FIG. 1(A).

Similarly, the capacitor 100a and the capacitor 100b are symmetric centering on the intersection point of dashed-dotted line A1-A2 and dashed-dotted line A5-A6 in the portion illustrated in FIG. 1(A).

With the above structure, the transistor 200a and the transistor 200b can be connected to the conductor 240 functioning as a common plug. In other words, a wiring electrically connected to one of a source and a drain of the transistor 200a can also be used as a wiring electrically connected to one of a source and a drain of the transistor 200b. Thus, the area occupied by the semiconductor device including the transistor 200a, the transistor 200b, the transistor 140a, the transistor 140b, the capacitor 100a, and the capacitor 100b can be reduced.

In the semiconductor device, an insulator 273 is preferably provided to cover the transistor 200a, the transistor 200b, the transistor 140a, the transistor 140b, the capacitor 100a, and the capacitor 100b. A metal oxide containing one kind or two or more kinds selected from hafnium, aluminum, gallium, yttrium, zirconium, tungsten, titanium, tantalum, nickel, germanium, magnesium, and the like can be used for the insulator 273. In particular, aluminum oxide has a high barrier property, so that even a thin aluminum oxide film having a thickness greater than or equal to 0.5 nm and less than or equal to 3.0 nm can inhibit diffusion of hydrogen and nitrogen.

When heat treatment is performed in a state where aluminum oxide is close to an oxide 230, the aluminum oxide may extract hydrogen in the oxide 230. Note that in the case where a region 242 (a region 242_1 to a region 242_5) is provided in the oxide 230 in contact with the aluminum oxide, the aluminum oxide may absorb hydrogen in the region 242, and the region 242 with reduced hydrogen may absorb hydrogen in a different region of the oxide 230. Thus, the hydrogen concentration in the oxide 230 can be lowered.

The insulator 280 is preferably provided over the insulator 273. The concentration of impurities such as water or hydrogen in the insulator 280 is preferably lowered.

The conductor 240 is formed to be in contact with an inner wall of an opening in the insulator 280 and the insulator 273. The region 242_3 is positioned on at least part of a bottom portion of the opening, and thus the conductor 240 is in contact with the region 242_3 (see FIG. 2(B)).

Note that the conductor 240 may be formed after aluminum oxide is formed on a side wall portion of the opening. By forming aluminum oxide on the side wall portion of the opening, the passage of oxygen from the outside can be inhibited and oxidation of the conductor 240 can be prevented. Furthermore, impurities such as water or hydrogen can be prevented from being diffused from the conductor 240 to the outside. The aluminum oxide can be formed by forming aluminum oxide in the opening by an ALD method or the like and then performing anisotropic etching.

The conductor 240 has a function as the one of the source and the drain of the transistor 200a and also has a function as the one of the source and the drain of the transistor 200b. With this structure, the distance between the transistor 200a and the transistor 200b adjacent to each other can be made small. Accordingly, the transistors can be arranged with high density, leading to high integration of the semiconductor device.

Note that FIG. 7 is a cross-sectional view of a portion indicated by dashed-dotted line A5-A6 in FIG. 2(A). That is, FIG. 7 is a cross-sectional view of a region in which the conductor 240 is in contact with the oxide 230 (the region 242_3) of the transistor 200a and the transistor 200b.

Figure 7A:
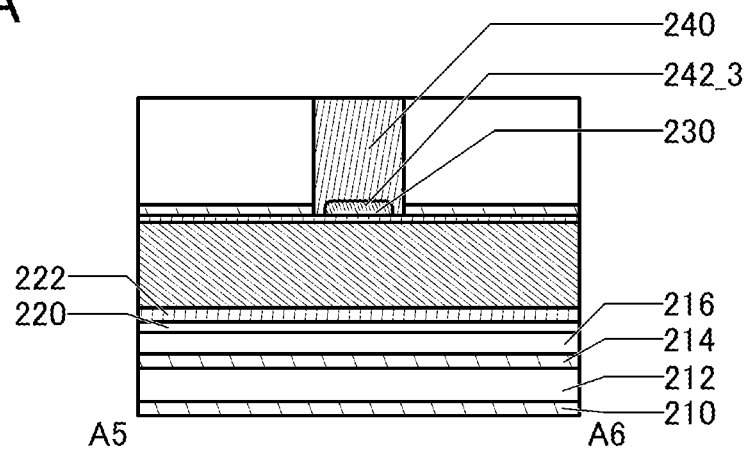
FIGS. 7A to 7C Cross-sectional views of a semiconductor device according to one embodiment of the present invention.

For example, as illustrated in FIG. 7(A), the conductor 240 may be in contact with a top surface of the oxide 230 (the region 242_3) and both side surfaces of the oxide 230 (the region 242_3) on the A5 side and the A6 side. In other words, the region where the conductor 240 is in contact with the oxide 230 (the region 242_3) has a cross-sectional shape like a saddle (this can be referred to as saddle-surface contact). With this structure, the area of the region where the conductor 240 and the oxide 230 (the region 242_3) are in contact with each other can be increased. Thus, the contact resistance between the conductor 240 and the oxide 230 (the region 242_3) can be further reduced.

Figure 7B:
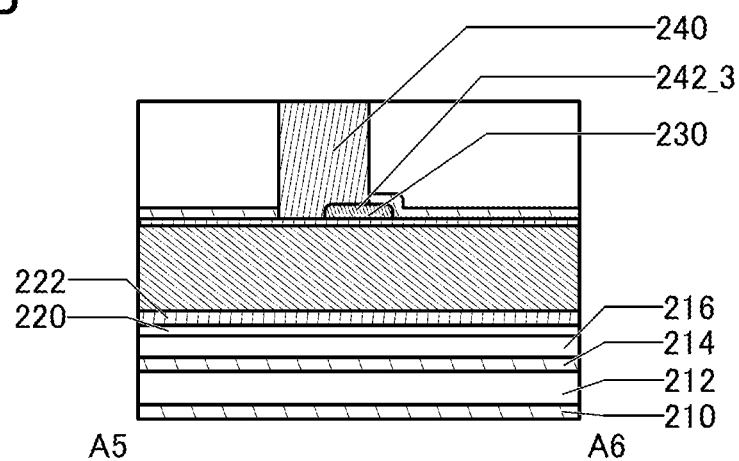
Figure 7C:
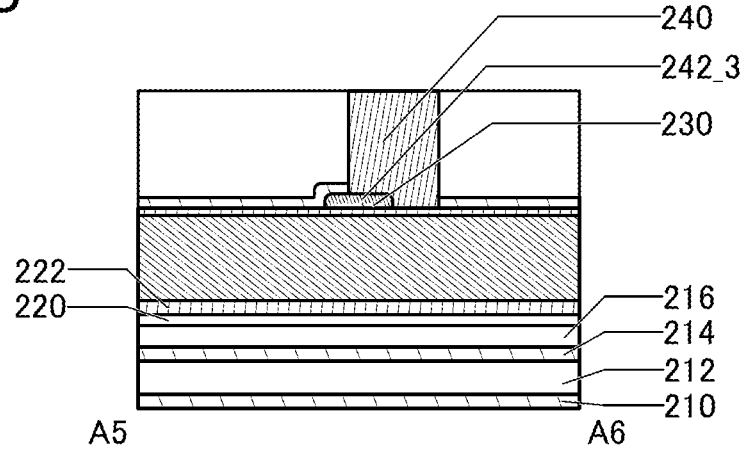

As illustrated in FIG. 7(B), the conductor 240 may be in contact with the top surface of the oxide 230 (the region 242_3) and the one side surface of the oxide 230 (the region 242_3). FIG. 7(B) illustrates an example of a region in which the conductor 240 is in contact with the side surface of the oxide 230 (the region 242_3) on the A5 side, for example. Note that as illustrated in FIG. 7(C), the conductor 240 may include a region in contact with the side surface of the oxide 230 (the region 242_3) on the A6 side. With this structure, the area of the region where the conductor 240 and the oxide 230 (the region 242_3) are in contact with each other can be increased. Thus, the contact resistance between the conductor 240 and the oxide 230 (the region 242_3) can be reduced.

The other of the source and the drain of the transistor 200a and the capacitor 100a are provided to overlap with each other. Similarly, the other of the source and the drain of the transistor 200b and the capacitor 100b are provided to overlap with each other.

In the semiconductor device of one embodiment of the present invention, the transistor 200a, the transistor 200b, the capacitor 100a, and the capacitor 100b can be provided in the same layer as described above. With this structure, the transistors and the capacitors can be arranged with high density; thus, the semiconductor device can be highly integrated.

The region 242_2 serves as the other of the source and the drain of the transistor 200a and one electrode of the capacitor 100a. Similarly, the region 242_4 serves as the other of the source and the drain of the transistor 200b and one electrode of the capacitor 100b. With this structure, a step of connecting the capacitor 100a and the transistor 200a to each other and a step of connecting the capacitor 100b and the transistor 200b to each other can be omitted. Accordingly, the number of steps and the manufacturing cost can be reduced.

In one embodiment of the present invention, the plurality of capacitors, the plurality of transistors, the plug for connecting the components have the above structure, whereby a semiconductor device that can be miniaturized or highly integrated can be provided.

[Transistor 200a and Transistor 200b]

As illustrated in FIG. 1 and FIG. 2, the transistor 200a includes an insulator 212 over the insulator 210 provided over a substrate (not illustrated); a conductor 203_1 provided to be embedded in the insulator 212; an insulator 214 over the conductor 203_1 and the insulator 212; a conductor 235_2 and a conductor 235_3 over the insulator 214; a dielectric 278 formed to cover the insulator 214, the conductor 235_2, and the conductor 235_3; the oxide 230 over the dielectric 278; an insulator 250_2 positioned between the conductor 235_2 and the conductor 235_3 and in contact with the oxide 230; and a conductor 260_2 in contact with the insulator 250_2.

As illustrated in FIG. 1 and FIG. 2, the transistor 200b includes the insulator 212 over the insulator 210 provided over the substrate (not illustrated); a conductor 203_2 provided to be embedded in the insulator 212; the insulator 214 over the conductor 203_2 and the insulator 212; the conductor 235_3 and a conductor 235_4 over the insulator 214; the dielectric 278 formed to cover the insulator 214, the conductor 235_3, and the conductor 235_4; the oxide 230 over the dielectric 278; an insulator 250_3 positioned between the conductor 235_3 and the conductor 235_4 and in contact with the oxide 230; and a conductor 260_3 in contact with the insulator 250_3.

Note that although the transistor 200a and the transistor 200b each have a structure in which the oxide 230 is a single layer, the present invention is not limited to this. For example, a stacked-layer structure of two layers, three layers, or four or more layers may be employed.

Although the conductor 260_2 and the conductor 260_3 of the transistor 200a and the transistor 200b each have a single-layer structure, the present invention is not limited to this. For example, the conductor 260_2 and the conductor 260_3 may each have a stacked-layer structure of two or more layers.

Here, as described above, the transistor 200a and the transistor 200b are symmetric centering on the intersection point of dashed-dotted line A1-A2 and dashed-dotted line A5-A6 in the portion illustrated in FIG. 1(A).

That is, the transistor 200b includes components corresponding to the components included in the transistor 200a. Thus, in drawings, the corresponding components in the transistor 200a and the transistor 200b are basically denoted by the same three-digit reference numerals. Unless otherwise specified, the description for the transistor 200a can be referred to for the transistor 200b below.

For example, the conductor 203_1, the insulator 250_2, and the conductor 260_2 of the transistor 200a correspond to the conductor 203_2, the insulator 250_3, and the conductor 260_3 of the transistor 200b, respectively.

Note that the oxide 230 is shared by the transistor 200a and the transistor 200b. Thus, the oxide 230 includes a region functioning as a channel formation region of the transistor 200a, a region functioning as the one of the source and the drain of the transistor 200a, a region functioning as a channel formation region of the transistor 200b, a region functioning as the one of the source and the drain of the transistor 200b, and regions functioning as the others of the sources and the drains of the transistor 200a and the transistor 200b.

With the above structure, the ones of the sources and the drains can be electrically connected to a common plug. In particular, when the oxide 230 is shared by the transistor 200a and the transistor 200b, the distance between the conductor 260_2 functioning as a first gate of the transistor 200a and the conductor 260_3 functioning as a first gate of the transistor 200b may be a minimum feature size. When the distance between the conductor 260_2 and the conductor 260_3 is set to be the minimum feature size, the area occupied by the two transistors can be reduced.

For example, it is preferable to use, as the oxide 230, an oxide semiconductor typified by a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). In particular, aluminum, gallium, yttrium, or tin is preferable as the element M. For the oxide 230, an In—Ga oxide or an In—Zn oxide may be used.

The transistor 200a and the transistor 200b each using an oxide semiconductor in a channel formation region have an extremely low leakage current in a non-conduction state; thus, a semiconductor device with low power consumption can be provided. An oxide semiconductor can be deposited by a sputtering method or the like, and thus can be used for the transistor 200a and the transistor 200b included in a highly integrated semiconductor device.

Figure 8A:
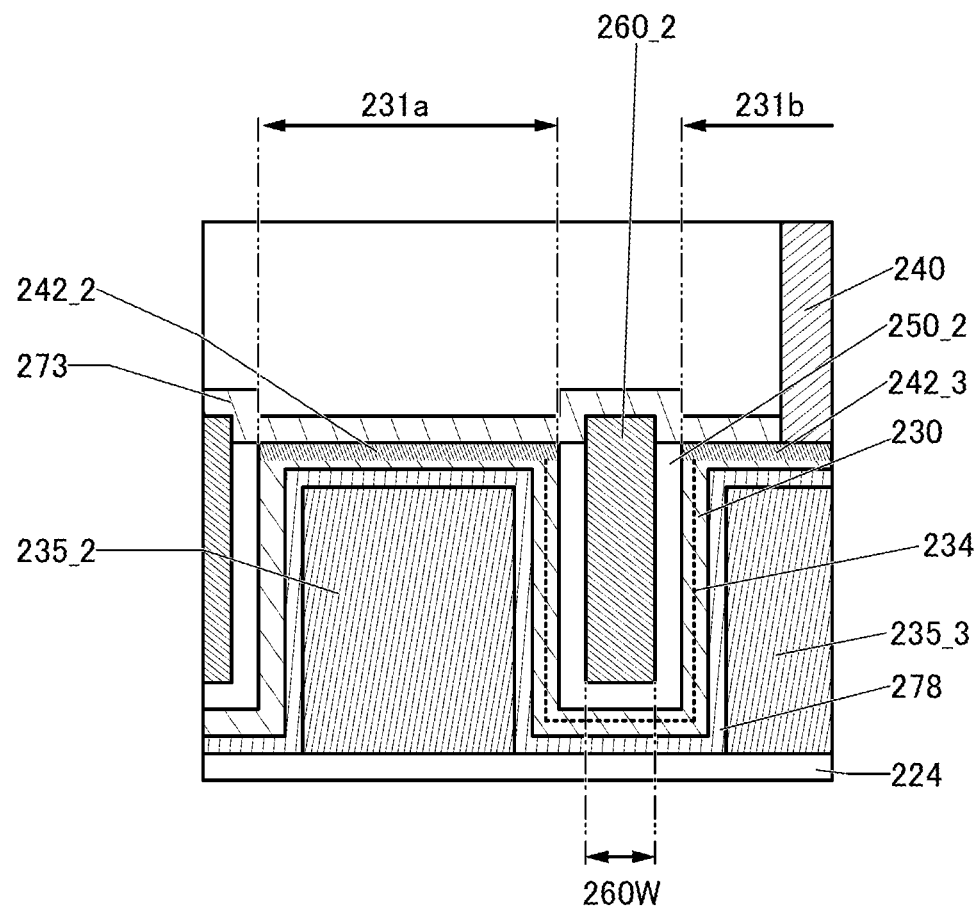
FIGS. 8A and 8B Cross sectional views of a semiconductor device according to one embodiment of the present invention.

Here, an enlarged view of a region of a vicinity of the channel of the transistor 200a in FIG. 2(B) is shown in FIG. 8(A).

As illustrated in FIG. 8(A), the oxide 230 includes a region 234 functioning as the channel formation region of the transistor 200a, and a region 231 (a region 231a and a region 231b) functioning as the source or the drain of the transistor 200a. In FIG. 8, the vicinity of the region 234 is denoted by a dashed line. Although FIG. 8 shows the position of the region 234 that is near the center of the oxide 230 for clarity of the drawing, the position of the region 234 is not limited to this and may be the vicinity of the interface between the oxide 230 and the insulator 250_2, the vicinity of the interface between the oxide 230 and the dielectric 278, or the whole of the oxide 230 in the range denoted by the dashed line.

The region 231 functioning as the source and the drain is a region having a low oxygen concentration, a high carrier density, and reduced resistance. The region 234 functioning as the channel formation region is a high-resistance region having a higher oxygen concentration and a lower carrier density than the region 231 functioning as the source region or the drain region.

Note that at least a surface and the vicinity of the surface of the region 231 of the oxide 230 (denoted by the region 242_2 and the region 242_3 in the diagram) needs to have a low resistance. That is, in the region 231 having a low resistance, the region 242_2 and the region 242_3 preferably have the lowest resistance.

Note that the concentration of at least one of metal elements such as aluminum, ruthenium, titanium, tantalum, tungsten, and chromium, a rare gas, and impurity elements such as hydrogen, and nitrogen in the region 231 is preferably higher than that in the region 234. The concentration of at least one of metal elements such as aluminum, ruthenium, titanium, tantalum, tungsten, and chromium, a rare gas, and impurity elements such as hydrogen, and nitrogen in the region 242_2 and the region 242_3 of the region 231 is preferably higher than that in the other region.

For example, in addition to the oxide 230, the region 231 preferably contains one or more of metal elements selected from aluminum, ruthenium, titanium, tantalum, tungsten, chromium, and the like. By addition of a metal element to the oxide 230, the resistance of the region 231 can be reduced. Note that the region 231 may include the region 242_2 and the region 242_3 in each of which the metal element of the oxide 230 is alloyed with the added metal element.

In order to form the region 242_2 and the region 242_3, for example, a metal film, an oxide film containing a metal element, or a nitride film containing a metal element may be formed in contact with the region 231 of the oxide 230. In that case, the metal element in the film may be added to the oxide semiconductor and a metal compound may be formed in the oxide semiconductor. The metal compound attracts hydrogen contained in the oxide 230 in some cases.

In the oxide 230, the boundaries between the regions are difficult to be clearly observed in some cases. The concentration of a metal element and impurity elements such as hydrogen and nitrogen, which is detected in each region, may be gradually changed (such a change is also referred to as gradation) not only between the regions but also in each region. That is, the region closer to the channel formation region preferably has a lower concentration of a metal element and an impurity element such as hydrogen and nitrogen.

Note that in the transistor 200a, as each region of the oxide 230, a low-resistance region is formed in a self-aligned manner by addition of an impurity or a metal element to the oxide 230 using the conductor 260_2 and the insulator 250_2 as a mask. In the transistor 200b, a low-resistance region is formed in a self-aligned manner by addition of an impurity or a metal element to the oxide 230 using the conductor 260_3 and the insulator 250_3 as a mask. Therefore, in the case where a plurality of semiconductor devices each including the transistor 200a and the transistor 200b are formed at the same time, variations in electrical characteristics between the semiconductor devices can be reduced.

As illustrated in FIG. 8(A), the channel length of the transistor 200a is substantially the same as the length of the region 234. The length of the region 234 is approximately equal to the sum of the length of a region where both side surfaces of the conductor 260_2 overlap with the oxide 230 with the insulator 250_2 therebetween and the length of a region where a bottom surface on a short side of the conductor 260_2 overlaps with the oxide 230 with the insulator 250_2 therebetween. That is, the channel length of the transistor 200a can be larger than a length 260W in a direction parallel to the short side of the conductor 260_2.

Even when the transistor 200a is miniaturized so that the length 260W is made smaller, the channel length of the transistor 200a can be made larger than the length 260W, so that the short-channel effect of the transistor can be suppressed. Note that the channel length of the transistor 200a is set to larger than or equal to 1.5 times and smaller than or equal to 10 times larger than the length 260W.

Note that the above-described structure and effect of the transistor 200a can be referred to for the structure and effect of the transistor 200b.

The structures of the transistor 200a and the transistor 200b of one embodiment of the present invention will be described in detail below. Note that also in the following description, the transistor 200a can be referred to for the structure of the transistor 200b.

The conductor 203_1 functioning as a second gate electrode of the transistor 200a is provided to overlap with the oxide 230 and the conductor 260_2.

Here, the conductor 260_2 functions as the first gate electrode of the transistor 200a in some cases. The conductor 203_1 functions as the second gate electrode of the transistor 200a in some cases.

Note that the potential applied to the conductor 203_1 may be a ground potential or a given potential that is different from the potential applied to the conductor 260_2. For example, by changing a potential applied to the conductor 203_1 not in synchronization with but independently of the potential applied to the conductor 260_2, the threshold voltage of the transistor 200a can be controlled. In particular, by applying a negative potential to the conductor 203_1, the threshold voltage of the transistor 200a can be higher than 0 V, and the off-state current can be reduced. Accordingly, a drain current when a voltage applied to the conductor 260_2 is 0 V can be reduced.

Meanwhile, the potential applied to the conductor 203_1 may be equal to the potential applied to the conductor 260_2. In the case where the potential applied to the conductor 203_1 is equal to the potential applied to the conductor 260_2, the conductor 203_1 may be provided largely such that, in the channel width direction, the length of the conductor 203_1 is larger than that of the region 234 in the oxide 230. It is particularly preferable that the conductor 203_1 extend to a region outside an end portion of the region 234 of the oxide 230 in the channel width direction. In other words, the conductor 203_1 and the conductor 260_2 preferably overlap with each other with an insulator therebetween, outside the side surface of the oxide 230 in the channel width direction.

With the above structure, in the case where potentials are applied to the conductor 260_2 and the conductor 203_1, an electric field generated from the conductor 260_2 and an electric field generated from the conductor 203_1 are connected, so that a closed circuit in which the channel formation region formed in the oxide 230 is covered can be formed.

That is, the channel formation region in the region 234 can be electrically surrounded by the electric field of the conductor 260_2 functioning as the first gate electrode and the electric field of the conductor 203_1 functioning as the second gate electrode. In this specification, a transistor structure in which a channel formation region is electrically surrounded by electric fields of a first gate electrode and a second gate electrode is referred to as a surrounded channel (S-channel) structure.

The insulator 210 can function as a barrier insulating film that prevent impurities such as water or hydrogen from entering the transistor from a lower layer. For the insulator 210, an insulating material having a function of inhibiting the passage of an impurity such as water or hydrogen is preferably used. It is preferable that silicon nitride, aluminum oxide, hafnium oxide, an oxide containing silicon and hafnium (hafnium silicate), an oxide containing aluminum and hafnium (hafnium aluminate), or the like be used for the insulator 210, for example. This can inhibit diffusion of impurities such as hydrogen or water to a layer positioned above the insulator 210. Note that it is preferable that the insulator 210 have a function of inhibiting the passage of at least one of impurities such as hydrogen atoms, hydrogen molecules, water molecules, nitrogen atoms, nitrogen molecules, nitrogen oxide molecules (e.g., $N_2O$, NO, and $NO_2$), and copper atoms. Furthermore, hereinafter, the same applies to the description of an insulating material that has a function of inhibiting the passage of impurities.

Furthermore, for the insulator 210, an insulating material having a function of inhibiting the passage of oxygen (e.g., oxygen atoms or oxygen molecules) is preferably used. This can inhibit downward diffusion of oxygen contained in the insulator 214 or the like.

The insulator 250_2 can function as a first gate insulating film of the transistor 200a, and the insulator 214 can function as a second gate insulating film of the transistor 200a. Note that although the insulator 214 of the transistor 200a has a single-layer structure, the present invention is not limited thereto. For example, the insulator 214 may have a stacked-layer structure of two or more layers.

For the oxide 230, a metal oxide functioning as an oxide semiconductor (hereinafter also referred to as an oxide semiconductor) is preferably used. A metal oxide whose energy gap is greater than or equal to 2 eV, preferably greater than or equal to 2.5 eV, is preferably used. With the use of a metal oxide having such a wide energy gap, the off-state current of the transistor can be reduced.

Since a transistor using an oxide semiconductor has an extremely low leakage current in a non-conduction state, a semiconductor device with low power consumption can be provided. An oxide semiconductor can be deposited by a sputtering method or the like, and thus can be used for a transistor included in a highly integrated semiconductor device.

An oxide semiconductor preferably contains at least indium or zinc. In particular, indium and zinc are preferably contained. Moreover, aluminum, gallium, yttrium, tin, or the like is preferably contained in addition to them. One kind or a plurality of kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, the element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that a plurality of the above elements may be used in combination as the element M in some cases.

Note that in this specification and the like, a metal oxide containing nitrogen is also collectively referred to as a metal oxide in some cases. A metal oxide containing nitrogen may be referred to as a metal oxynitride.

Here, besides the constituent element of the oxide semiconductor, a metal element such as aluminum, ruthenium, titanium, tantalum, chromium, or tungsten is added, whereby the oxide semiconductor becomes a metal compound to have reduced resistance in some cases. Note that aluminum, titanium, tantalum, tungsten, or the like is preferably used. To add the metal element to the oxide semiconductor, for example, a metal film containing the metal element, a nitride film containing the metal element, or an oxide film containing the metal element is provided over the oxide semiconductor. By providing the film, some oxygen at the interface between the film and the oxide semiconductor or in the oxide semiconductor positioned in the vicinity of the interface may be absorbed into the film or the like and an oxygen vacancy may be formed, so that the resistance at the interface of the oxide semiconductor or in the vicinity of the interface may be reduced.

The periphery of an oxygen vacancy formed in the vicinity of the interface has a distortion. When the above film is deposited by a sputtering method with a sputtering gas containing a rare gas, the rare gas might enter the oxide semiconductor during the deposition of the film. When the rare gas enters the oxide semiconductor, distortion or structural disorder is caused at the interface or in the vicinity of the interface and around the rare gas. The rare gas is, for example, He or Ar. Note that Ar is preferable to He because its atomic radius is larger than that of He. When Ar enters the oxide semiconductor, a distortion or a structural disorder is suitably caused. In a region with such a distortion or a structural disorder, metal atoms bonded to a small number of oxygen may increase. When the number of metal atoms bonded to a small number of oxygen increases, the resistance at the interface or in the vicinity of the interface and around the rare gas is reduced in some cases.

In the case where a crystalline oxide semiconductor is used as the oxide semiconductor, a region with the distortion or the structural disorder has broken crystallinity and seems like an amorphous oxide semiconductor in some cases.

After the metal film, the nitride film containing the metal element, or the oxide film containing the metal element is provided over the oxide semiconductor, heat treatment is preferably performed in an atmosphere containing nitrogen.

By the heat treatment in the atmosphere containing nitrogen, the metal element is diffused from the metal film into the oxide semiconductor; thus, the metal element can be added to the oxide semiconductor.

In the case where hydrogen in the oxide semiconductor diffuses into a low-resistance region of the oxide semiconductor and enters an oxygen vacancy in the low-resistance region, the hydrogen becomes relatively stable. It is known that hydrogen in the oxygen vacancy in the oxide semiconductor is released from the oxygen vacancy by heat treatment at 250° C. or higher, diffuses into a low-resistance region of the oxide semiconductor, enters an oxygen vacancy in the low-resistance region, and becomes relatively stable. Thus, by the heat treatment, the resistance of the low-resistance region of the oxide semiconductor tends to be further reduced, and the oxide semiconductor whose resistance is not reduced tends to be highly purified (reduction of impurities such as water or hydrogen) to have increased resistance.

The oxide semiconductor has an increased carrier density when an impurity element such as hydrogen or nitrogen exists therein. Hydrogen in the oxide semiconductor reacts with oxygen bonded to a metal atom, to be water, and thus, forms an oxygen vacancy in some cases. Entry of hydrogen into the oxygen vacancy increases carrier density. Furthermore, in some cases, part of hydrogen is bonded to oxygen which is bonded to a metal atom, whereby an electron serving as a carrier is generated. That is, the resistance of an oxide semiconductor containing nitrogen or hydrogen is reduced.

Thus, selective addition of a metal element and an impurity element such as hydrogen and nitrogen to the oxide semiconductor allows a high-resistance region and a low-resistance region to be provided in the oxide semiconductor. In other words, when the resistance of the oxide 230 is selectively reduced, a region functioning as a semiconductor having a low carrier density and a low-resistance region functioning as a source or a drain can be provided in the oxide 230.

Here, in the transistor 200a, parasitic capacitance is formed between the conductor 260_2 and the conductor 235_2 and between the conductor 260_2 and the conductor 235_3 in some cases. Similarly, in the transistor 200b, parasitic capacitance is formed between the conductor 260_3 and the conductor 235_3 and between the conductor 260_3 and the conductor 235_4 in some cases.

Figure 4A:
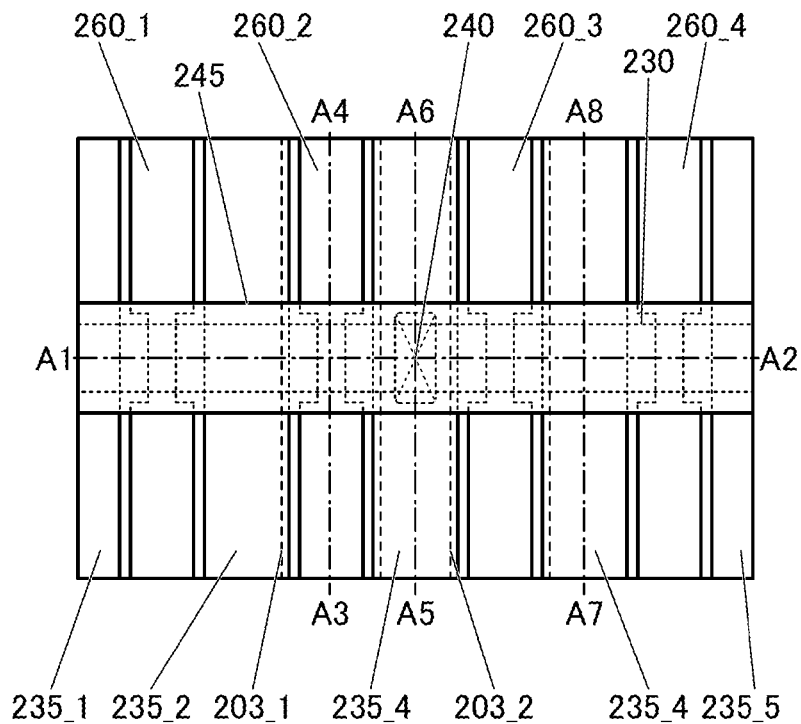
FIGS. 4A to 4C A top view and cross-sectional views of a semiconductor device according to one embodiment of the present invention.
Figure 4C:
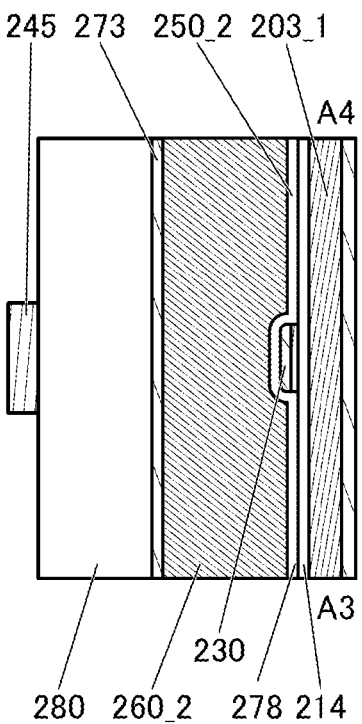
Figure 4B:
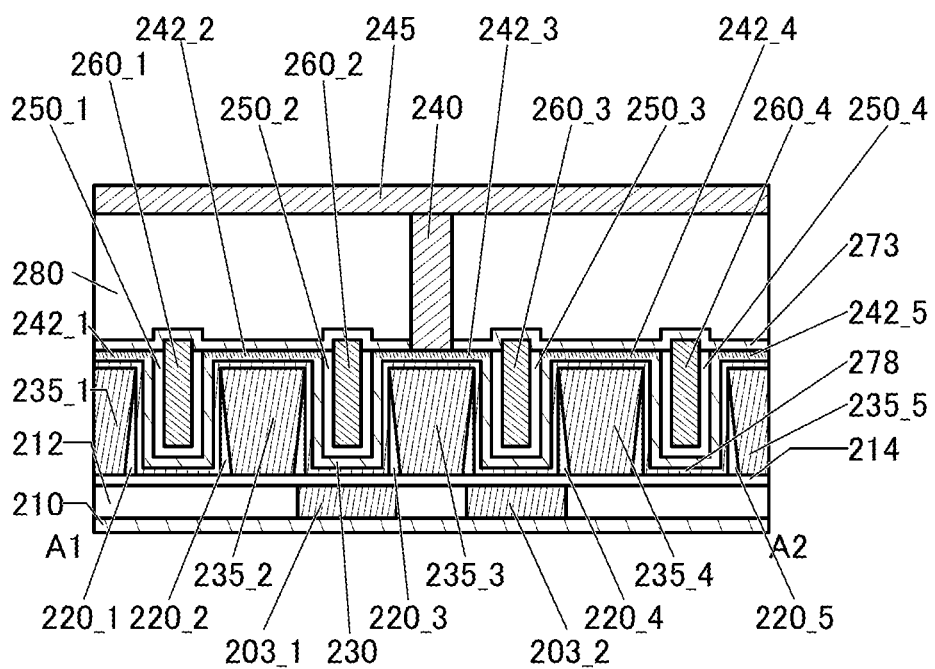

In this case, as illustrated in FIG. 4(B), an insulator 220_2 is provided on a side surface of the conductor 235_2 and an insulator 220_3 is provided on a side surface of the conductor 235_3, whereby the parasitic capacitance of the transistor 200a can be reduced. Also in the transistor 200b, an insulator 220_4 is provided on a side surface of the conductor 235_4, whereby the parasitic capacitance of the transistor 200b can be reduced. When the parasitic capacitance is reduced, high-speed operation of the transistor 200a and the transistor 200b can be achieved.

Here, as illustrated in FIG. 2, the insulator 273 may be provided to cover the transistor 200a and the transistor 200b (see FIG. 2).

For example, a metal oxide containing one kind or two or more kinds selected from hafnium, aluminum, gallium, yttrium, zirconium, tungsten, titanium, tantalum, nickel, germanium, magnesium, and the like can be used for the insulator 273. In particular, aluminum oxide has a high barrier property, so that even a thin aluminum oxide film having a thickness greater than or equal to 0.5 nm and less than or equal to 3.0 nm can inhibit diffusion of hydrogen and nitrogen.

When heat treatment is performed in a state where aluminum oxide is close to the oxide 230, the aluminum oxide may extract hydrogen in the oxide 230. Note that in the case where the region 242 is provided in the oxide 230 in contact with the aluminum oxide, hydrogen in the region 242 is absorbed by the aluminum oxide and the region 242 with reduced hydrogen may absorb hydrogen in the other region of the oxide 230. Thus, the hydrogen concentration in the oxide 230 can be lowered. Furthermore, when a region where the insulator 273 is in contact with the insulator 250_2 and the insulator 250_3 is included, oxygen can be supplied to the insulator 250_2 and the insulator 250_3 in some cases.

[Transistor 140a and Transistor 140b]

As illustrated in FIG. 1 and FIG. 2, the transistor 140a and the transistor 140b are different from the transistor 200a and the transistor 200b in including neither the conductor 203_1 functioning as the second gate electrode of the transistor 200a nor the conductor 203_2 functioning as the second gate electrode of the transistor 200b. The other structures are similar to the structures of the transistor 200a and the transistor 200b.

As illustrated in FIG. 1 and FIG. 2, the transistor 140a and the transistor 140b are provided to be adjacent to and sandwich the both ends of the transistor 200a and the transistor 200b in the A1-A2 direction. That is, the transistor 140a is provided to be adjacent to the A1 direction of the transistor 200a and the transistor 140b is provided to be adjacent to the A2 direction of the transistor 200b.

For example, in the case where in a semiconductor device including a plurality of memory cells each provided with the transistor 200a, the transistor 200b, the capacitor 100a, and the capacitor 100b, the memory cells are continuously provided in the A1-A2 direction and the A3-A4 direction in FIG. 1 and FIG. 2, the adjacent memory cells share the oxide 230 in the A1-A2 direction, and thus electrical connection is established between the transistors in the adjacent memory cells.

When the transistor 140a and the transistor 140b are included, the adjacent memory cells can be electrically isolated from each other. In other words, the transistor 140a has a function of electrically isolating the adjacent memory cell in the A1 direction, and the transistor 140b has a function of electrically isolating the adjacent memory cell in the A2 direction. For such functions, the transistor 140a and the transistor 140b are always kept in an off state. To make the transistor 140a and the transistor 140b always kept in an off state, a potential at which the transistor 140a is brought into an off state and a potential at which the transistor 140b is brought into an off state are applied to a conductor 260_1 having a function of a first gate electrode of the transistor 140a and a conductor 260_4 having a function of a first gate electrode of the transistor 140b, respectively.

Figure 3A:
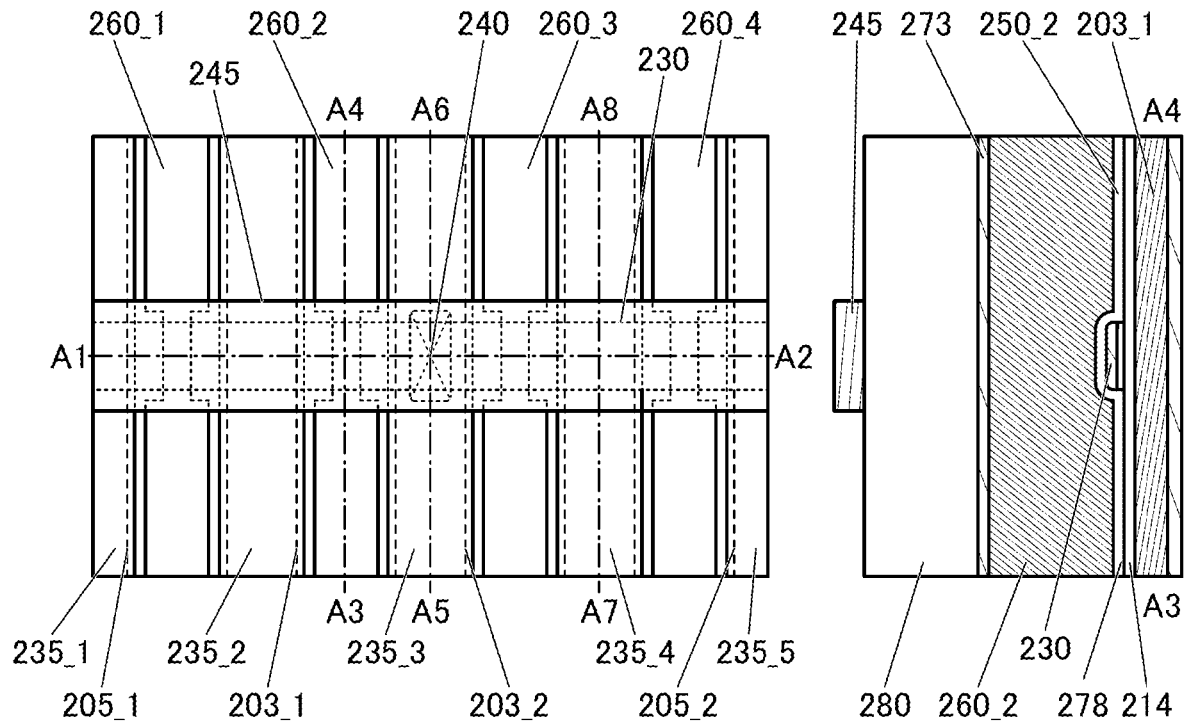
FIGS. 3A to 3C A top view and cross sectional views of a semiconductor device according to one embodiment of the present invention.
Figure 3C:
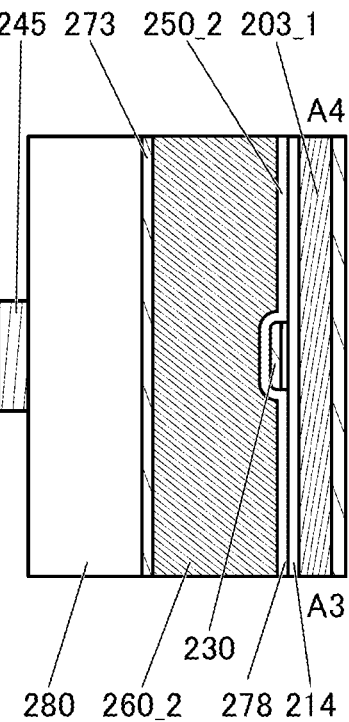
Figure 3B:
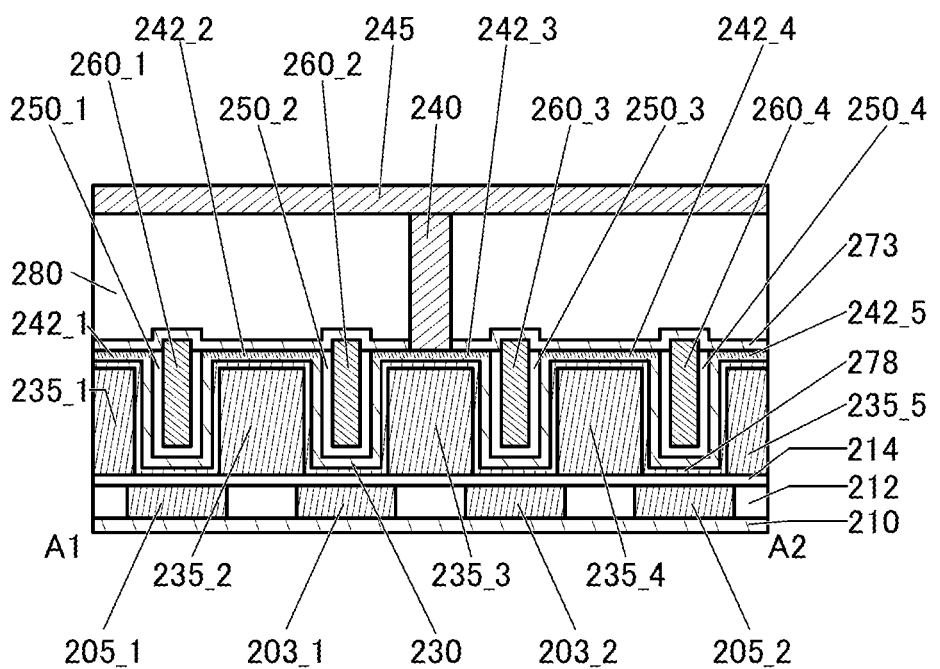

As illustrated in FIG. 3, a conductor 205_1 functioning as a second gate electrode of the transistor 140a and a conductor 205_2 functioning as a second gate electrode of the transistor 140b may be provided. With such a structure, for example, when a negative potential is applied to each of the conductor 205_1 and the conductor 205_2, a potential at which the transistor 140a is brought into an off state and which is applied to the conductor 260_1 and a potential at which the transistor 140b is brought into an off state and which is applied to the conductor 260_4 can be suppressed low. In addition, the off-state current can be reduced.

Alternatively, the conductor 205_1 and the conductor 260_1 may be connected to each other and supplied with the same potential and the conductor 205_2 and the conductor 260_4 may be connected to each other and supplied with the same potential.

[Capacitor 100a and Capacitor 100b]

Figure 8B:
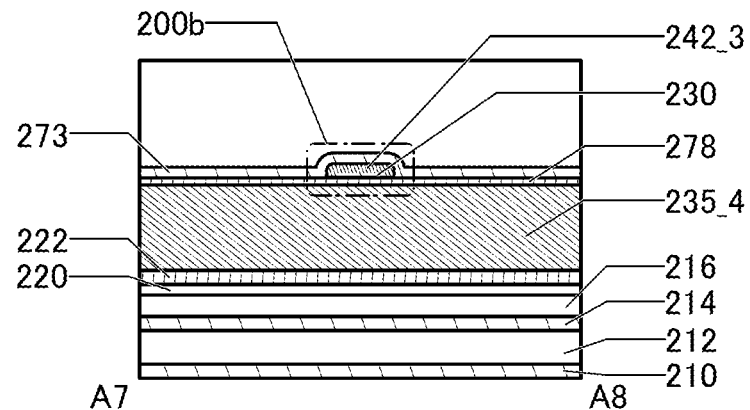
Figure 9A:
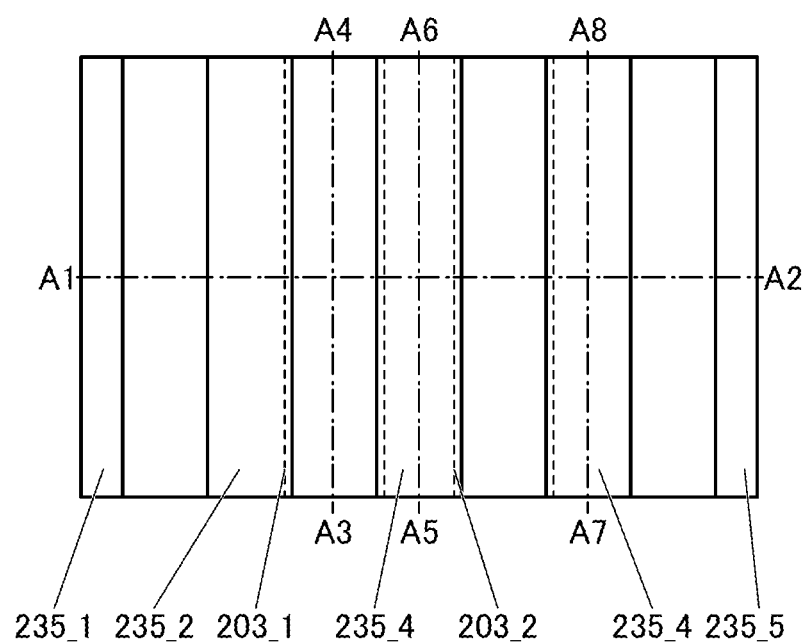
FIGS. 9A to 9C A top view and cross-sectional views illustrating a method for manufacturing a semiconductor device according to one embodiment of the present invention.
Figure 9C:
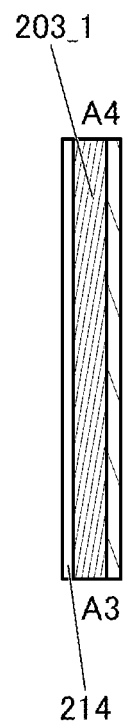
Figure 9B:
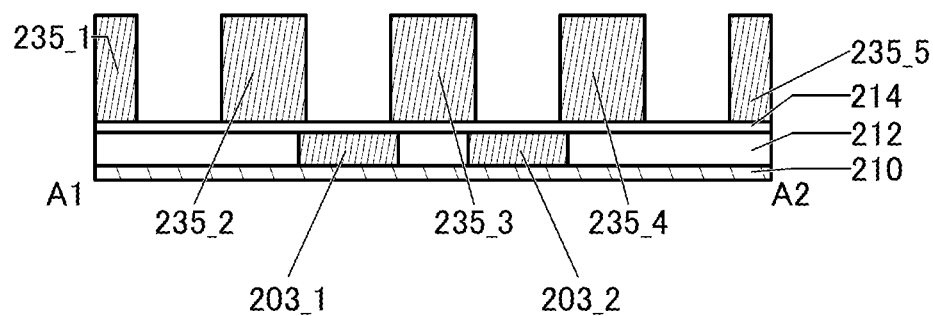

As illustrated in FIG. 1 and FIG. 2, the capacitor 100a is provided in a region overlapping with the transistor 200a. In a similar manner, the capacitor 100b is provided in a region overlapping with the transistor 200b. FIG. 8(B) is a cross-sectional view of a portion indicated by dashed-dotted line A7-A8 in FIG. 1 and FIG. 2.

Note that as in the description of the transistor 200a, the capacitor 100b includes components corresponding to the components included in the capacitor 100a. Thus, in drawings, the corresponding components in the capacitor 100a and the capacitor 100b are basically denoted by the same three-digit reference numerals. Thus, unless otherwise specified, the description for the capacitor 100a can be referred to for the capacitor 100b below.

The capacitor 100a includes the conductor 235_2, the dielectric 278 provided to cover the conductor 235_2, and the oxide 230 over the dielectric 278. The capacitor 100b includes the conductor 235_4, the dielectric 278 provided to cover the conductor 235_4, and the oxide 230 over the dielectric 278.

The region 242_2 included in the oxide 230 also serves as both the one electrode of the capacitor 100a and the other of the source and the drain of the transistor 200a. The conductor 235_2 has a function of the other electrode of the capacitor 100a. The conductor 235_2 and the region 242_2 overlap with each other with the dielectric 278 therebetween. Similarly, the region 242_4 included in the oxide 230 also serves as the one electrode of the capacitor 100b and the other of the source and the drain of the transistor 200b. The conductor 235_4 has a function of the other electrode of the capacitor 100b. The conductor 235_4 and the region 242_4 overlap with each other with the dielectric 278 therebetween.

As illustrated in FIG. 1(B), FIG. 2(B), and FIG. 8(B), the dielectric 278 can be made thin because the capacitor 100a and the capacitor 100b can be provided over a substantially flat surface, leading to an improvement in the coverage with the dielectric 278, so that the capacitance values of the capacitor 100a and the capacitor 100b can be increased, which is preferable.

An insulator having a high dielectric constant is preferably used for the dielectric 278. For example, an insulator containing an oxide of one or both of aluminum and hafnium can be used. Aluminum oxide, hafnium oxide, an oxide containing aluminum and hafnium (hafnium aluminate), or the like is preferably used for the insulator containing an oxide of one or both of aluminum and hafnium.

The dielectric 278 may have a stacked-layer structure; for example, a stacked-layer structure including two or more layers selected from silicon oxide, silicon oxynitride, silicon nitride oxide, silicon nitride, aluminum oxide, hafnium oxide, an oxide containing aluminum and hafnium (hafnium aluminate), and the like may be employed. For example, it is preferable that hafnium oxide, aluminum oxide, and hafnium oxide be deposited in this order by an ALD method so that a stacked-layer structure is obtained. The thickness of the dielectric 278 is greater than or equal to 0.1 nm and less than or equal to 20 nm, preferably greater than or equal to 0.3 nm and less than or equal to 10 nm, further preferably greater than or equal to 1 nm and less than or equal to 5 nm.

<Substrate>

As a substrate for formation of the transistor, for example, an insulator substrate, a semiconductor substrate, or a conductor substrate may be used. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Furthermore, a semiconductor substrate in which an insulator region is included in the aforementioned semiconductor substrate, for example, an SDI (Silicon On Insulator) substrate or the like is used. Examples of the conductor substrate include a graphite substrate, a metal substrate, an alloy substrate, and a conductive resin substrate. Alternatively, a substrate including a metal nitride, a substrate including a metal oxide, or the like is used. Furthermore, an insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. Examples of the element provided over the substrate include a capacitor, a resistor, a switching element, a light-emitting element, and a memory element.

A flexible substrate may be used as the substrate. Note that as a method of providing a transistor over a flexible substrate, there is a method in which the transistor is fabricated over a non-flexible substrate and then the transistor is separated and transferred to a substrate which is a flexible substrate. In that case, a separation layer is preferably provided between the non-flexible substrate and the transistor. As the substrate, a sheet, a film, a foil, or the like containing a fiber may be used. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced. That is, a durable semiconductor device can be provided.

For the substrate which is a flexible substrate, metal, an alloy, a resin, glass, or fiber thereof can be used, for example. The substrate which is a flexible substrate preferably has a lower coefficient of linear expansion because deformation due to an environment is inhibited. For the substrate which is a flexible substrate, a material whose coefficient of linear expansion is lower than or equal to $1\times10^{-3}$/K, lower than or equal to $5\times10^{-5}$/K, or lower than or equal to $1\times10^{-5}$/K can be used, for example. Examples of the resin include polyester, polyolefin, polyamide (nylon, aramid, or the like), polyimide, polycarbonate, and acrylic. In particular, aramid is preferable for the substrate which is a flexible substrate because of its low coefficient of linear expansion.

<Insulator>

Examples of an insulator include an oxide, a nitride, an oxynitride, a nitride oxide, a metal oxide, a metal oxynitride, and a metal nitride oxide, each of which has an insulating property.

When a transistor is surrounded by an insulator having a function of inhibiting the passage of oxygen and impurities such as hydrogen, the transistor can have stable electrical characteristics. For example, an insulator having a function of inhibiting the passage of impurities such as hydrogen, and oxygen is used for the insulator 210 and the insulator 273.

As the insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used.

For the insulator 210 and the insulator 273, for example, a metal oxide such as aluminum oxide, magnesium oxide, gallium oxide, germanium oxide, yttrium oxide, zirconium oxide, lanthanum oxide, neodymium oxide, hafnium oxide, an oxide containing silicon and hafnium, an oxide containing aluminum and hafnium, or tantalum oxide; silicon nitride oxide; or silicon nitride may be used. Note that the insulator 210 and the insulator 273 preferably contain aluminum oxide, hafnium oxide, or the like, for example.

The insulator 214 and the insulator 250 (the insulator 250_1, the insulator 250_2, the insulator 250_3, and the insulator 250_4) preferably contain an insulator having a high relative permittivity. For example, the insulator 214 and the insulator 250 preferably contain gallium oxide, hafnium oxide, zirconium oxide, an oxide containing aluminum and hafnium, oxynitride containing aluminum and hafnium, an oxide containing silicon and hafnium, oxynitride containing silicon and hafnium, a nitride containing silicon and hafnium, or the like.

Alternatively, the insulator 214 and the insulator 250 preferably have a stacked-layer structure of silicon oxide or silicon oxynitride, and an insulator having a high relative permittivity. Because silicon oxide and silicon oxynitride are thermally stable, a combination of silicon oxide or silicon oxynitride with an insulator having a high relative permittivity allows the stacked-layer structure to be thermally stable and have a high relative permittivity. For example, when aluminum oxide, gallium oxide, or hafnium oxide in the insulator 250 is in contact with the oxide 230, entry of silicon included in silicon oxide or silicon oxynitride into the oxide 230 can be suppressed. Furthermore, for example, when silicon oxide or silicon oxynitride is in contact with the oxide 230 in the insulator 250, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 212, the insulator 220 (an insulator 220_1, the insulator 220_2, the insulator 220_3, the insulator 220_4, and an insulator 220_5), and the insulator 280 preferably contain an insulator having a low relative permittivity. For example, the insulator 212, the insulator 220, and the insulator 280 preferably contain silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. Alternatively, the insulator 212, the insulator 220, and the insulator 280 preferably have a stacked-layer structure of silicon oxide, silicon oxynitride, silicon nitride oxide, silicon oxide to which fluorine is added, silicon oxide to which carbon is added, silicon oxide to which carbon and nitrogen are added, or porous silicon oxide, and a resin. Because silicon oxide and silicon oxynitride are thermally stable, a combination of silicon oxide or silicon oxynitride with a resin allows the stacked-layer structure to be thermally stable and have a low relative permittivity. Examples of the resin include polyester, polyolefin, polyamide (e.g., nylon or aramid), polyimide, polycarbonate, and acrylic.

<Conductor>

For the conductor 203 (the conductor 203_1 and the conductor 203_2), the conductor 205 (the conductor 205_1 and the conductor 2052), the conductor 235 (the conductor 235_1, the conductor 235_2, the conductor 235_3, the conductor 235_4, and the conductor 235_5), the conductor 260 (the conductor 260_1, the conductor 260_2, the conductor 260_3, and the conductor 260_4), the conductor 240, and the conductor 245, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

In particular, for the conductor 260, a metal element included in a metal oxide that can be used for the oxide 230 and a conductive material containing oxygen may be used. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the oxide 230 can be captured in some cases. Alternatively, hydrogen entering from an external insulator or the like can be trapped in some cases.

Furthermore, a stack including a plurality of conductive layers formed with the above materials may be used. For example, a stacked-layer structure combining a material containing the aforementioned metal element and a conductive material containing oxygen may be employed. Furthermore, a stacked-layer structure combining a material containing the aforementioned metal element and a conductive material containing nitrogen may be employed. Furthermore, a stacked-layer structure combining a material containing the aforementioned metal element, a conductive material containing oxygen, and a conductive material containing nitrogen may be employed.

Note that in the case where an oxide is used for the channel formation region of the transistor, a stacked-layer structure combining a material containing the above-described metal element and a conductive material containing oxygen is preferably used for the gate electrode. In that case, the conductive material containing oxygen is preferably provided on the channel formation region side. When the conductive material containing oxygen is provided on the channel formation region side, oxygen released from the conductive material is easily supplied to the channel formation region.

<Metal Oxide>

For the oxide 230, a metal oxide functioning as an oxide semiconductor (hereinafter also referred to as an oxide semiconductor) is preferably used. A metal oxide that can be used as the semiconductor layer and the oxide 230 of the present invention is described below.

An oxide semiconductor preferably contains at least indium or zinc. In particular, indium and zinc are preferably contained. In addition, aluminum, gallium, yttrium, tin, or the like is preferably contained. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, or the like may be contained.

Here, the case where the oxide semiconductor is an In-M-Zn oxide that contains indium, an element M, and zinc is considered. Note that the element M is aluminum, gallium, yttrium, tin, or the like. Other elements that is usable for the element M include boron, silicon, titanium, iron, nickel, germanium, zirconium, molybdenum, lanthanum, cerium, neodymium, hafnium, tantalum, tungsten, and magnesium. Note that a plurality of the above elements may be used in combination as the element M in some cases.

[Composition of Metal Oxide]

The composition of a CAC (Cloud-Aligned Composite)-OS that can be used in the transistor disclosed in one embodiment of the present invention will be described below.

Note that in this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level.

Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

[Structure of Metal Oxide]

Oxide semiconductors can be classified into single crystal oxide semiconductors and the others, non-single-crystal oxide semiconductors. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal lattice arrangement, a heptagonal lattice arrangement, and the like are included in the distortion in some cases. Note that a clear crystal grain boundary (also referred to as a grain boundary) cannot be observed even in the vicinity of distortion in the CAAC-OS. That is, formation of a crystal grain boundary is inhibited by the distortion of a lattice arrangement. This is probably because the CAAC-OS can tolerate distortion owing to a low density of oxygen atom arrangement in an a-b plane direction, a change in interatomic bond distance by replacement of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Furthermore, entry of impurities, formation of defects, or the like might decrease the crystallinity of the oxide semiconductor; thus, it can also be said that the CAAC-OS is an oxide semiconductor having small amounts of impurities and defects (e.g., oxygen vacancies). Thus, an oxide semiconductor including the CAAC-OS is physically stable. Therefore, the oxide semiconductor including the CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor having a structure between those of the nc-OS and an amorphous oxide semiconductor. The a-like OS contains a void or a low-density region. That is, the a-like OS has lower crystallinity than the nc-OS and the CAAC-OS.

An oxide semiconductor can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the oxide semiconductor is used for a transistor is described.

Note that when the oxide semiconductor is used for a transistor, the transistor with high field-effect mobility can be achieved. In addition, the transistor having high reliability can be achieved.

An oxide semiconductor with a low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide semiconductor film has a low density of defect states and accordingly has a low density of trap states in some cases.

Charge trapped by the trap states in the oxide semiconductor takes a long time to be released and may behave like a fixed charge. Thus, the transistor whose channel formation region is formed in the oxide semiconductor having a high density of trap states has unstable electrical characteristics in some cases.

To stabilize electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As an impurity, hydrogen, nitrogen, an alkali metal, an alkaline earth metal, iron, nickel, silicon, and the like can be given.

[Impurities]

Here, the influence of impurities in the oxide semiconductor is described.

When silicon or carbon that is one of Group 14 elements is contained in the oxide semiconductor, defect states are formed in the oxide semiconductor. Thus, the concentration of silicon or carbon in the oxide semiconductor and the concentration of silicon or carbon at an interface with the oxide semiconductor and in the vicinity of the interface (the concentration obtained by secondary ion mass spectrometry (SIMS)) are set to be lower than or equal to $2\times10^{18}$ atoms/$cm^3$, and preferably lower than or equal to $2\times10^{17}$ atoms/$cm^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to have normally-on characteristics. Therefore, it is preferable to reduce the concentration of alkali metal or alkaline earth metal of the oxide semiconductor. Specifically, the concentration of alkali metal or alkaline earth metal in the oxide semiconductor measured by SIMS is set lower than or equal to $1\times10^{18}$ atoms/$cm^3$, and preferably lower than or equal to $2\times10^{16}$ atoms/$cm^3$.

When the oxide semiconductor contains nitrogen, the oxide semiconductor easily becomes n-type by generation of electrons functioning as carriers and an increase of carrier density. Thus, a transistor whose semiconductor includes an oxide semiconductor that contains nitrogen is likely to have normally-on characteristics. For this reason, nitrogen in the oxide semiconductor is preferably reduced as much as possible; the nitrogen concentration measured by SIMS is set, for example, lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, and still further preferably lower than or equal to $5\times10^{17}$ atoms/$cm^3$.

Furthermore, hydrogen contained in an oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, part of hydrogen is bonded to oxygen which is bonded to a metal atom, whereby an electron serving as a carrier is generated. Accordingly, a transistor using an oxide semiconductor containing hydrogen is likely to have normally-on characteristics. Thus, it is preferable that hydrogen in the oxide semiconductor be reduced as much as possible. Specifically, the hydrogen concentration in the oxide semiconductor measured by SIMS is set lower than $1\times10^{20}$ atoms/$cm^3$, preferably lower than $1\times10^{19}$ atoms/$cm^3$, further preferably lower than $5\times10^{18}$ atoms/$cm^3$, and still further preferably lower than $1\times10^{18}$ atoms/$cm^3$.

When an oxide semiconductor with sufficiently reduced impurities is used for a channel formation region of a transistor, stable electrical characteristics can be given.

<Method for Manufacturing Semiconductor Device>

Next, a manufacturing method of the semiconductor device of the present invention that includes the transistor 200a, the transistor 200b, the capacitor 100a, and the capacitor 100b is described with reference to FIG. 9 to FIG. 20. In FIG. 9 to FIG. 20, (A) of each drawing is a top view. Moreover, (B) of each drawing is a cross-sectional view of a portion indicated by dashed-dotted line A1-A2 in (A) of each drawing. Furthermore, (C) of each drawing is a cross-sectional view of a portion indicated by dashed-dotted line A3-A4 in (A) of each drawing.

First, a substrate (not illustrated) is prepared, and the insulator 210 is deposited over the substrate. The insulator 210 can be deposited by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, such plasma damage is not caused in the case of using a thermal CVD method that does not use plasma, and thus the yield of a semiconductor device can be increased. In addition, a thermal CVD method does not cause plasma damage during deposition, so that a film with few defects can be obtained.

An ALD method is also a deposition method which enables less damage to an object. An ALD method also does not cause plasma damage during deposition, so that a film with few defects can be obtained.

Unlike in a deposition method in which particles ejected from a target or the like are deposited, a CVD method and an ALD method are deposition methods in which a film is formed by reaction at a surface of an object. Thus, a CVD method and an ALD method are deposition methods that are less likely to be influenced by the shape of an object and thus have favorable step coverage. In particular, an ALD method has excellent step coverage and excellent thickness uniformity, and thus is suitable for the case of covering a surface of an opening having a high aspect ratio, for example On the other hand, an ALD method has a relatively low deposition rate, and thus is preferably used in combination with another deposition method with a high deposition rate such as a CVD method, in some cases.

A CVD method and an ALD method enable control of the composition of a film to be obtained with a flow rate ratio of source gases. For example, by a CVD method and an ALD method, a film with a desired composition can be deposited depending on the flow rate ratio of source gases. Moreover, by a CVD method and an ALD method, by changing the flow rate ratio of source gases during the deposition, a film whose composition is continuously changed can be deposited. In the case of depositing a film while changing the flow rate ratio of source gases, as compared with the case of depositing a film with the use of a plurality of deposition chambers, the time taken for the film deposition can be shortened because the time taken for transfer and pressure adjustment is omitted. Thus, productivity of semiconductor devices can be improved in some cases.

For example, as the insulator 210, aluminum oxide is deposited by a sputtering method. The insulator 210 may have a multilayer structure. For example, a structure may be employed in which aluminum oxide is deposited by a sputtering method and another aluminum oxide is deposited over the aluminum oxide by an ALD method. Alternatively, a structure may be employed in which aluminum oxide is deposited by an ALD method and another aluminum oxide is deposited over the aluminum oxide by a sputtering method.

Next, a conductive film to be the conductor 203_1 and the conductor 203_2 is deposited over the insulator 210. The conductive film to be the conductor 203_1 and the conductor 203_2 can be deposited by a sputtering method, a CVD method, an MBE method, a PLD method, an ALD method, or the like. The conductive film to be the conductor 203_1 and the conductor 203_2 can be a multilayer film. For example, tungsten is deposited as the conductive film to be the conductor 203_1 and the conductor 203_2.

Next, the conductive film to be the conductor 203_1 and the conductor 203_2 is processed by a lithography method to form the conductor 203_1 and the conductor 203_2.

In the lithography method, first, a resist is exposed to light through a mask. Next, a region exposed to light is removed or left using a developing solution, so that a resist mask is formed. Then, etching treatment through the resist mask is performed, so that the conductor, the semiconductor, the insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. Furthermore, an electron beam or an ion beam may be used instead of the above-described light. Note that a mask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over the conductive film to be the conductor 203_1 and the conductor 203_2, a resist mask is formed thereover, and then the material of the hard mask is etched. The etching of the conductive film to be the conductor 203_1 and the conductor 203_2 may be performed after the resist mask is removed or with the resist mask left. In the latter case, the resist mask disappears during the etching in some cases. The hard mask may be removed by etching after the etching of the conductive film to be the conductor 203_1 and the conductor 203_2. The hard mask does not need to be removed in the case where the hard mask material does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency powers with the same frequency are applied to the parallel plate type electrodes. Alternatively, a structure may be employed in which high-frequency powers with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 212 is deposited over the insulator 210, the conductor 203_1, and the conductor 203_2. The insulating film to be the insulator 212 can be deposited by a sputtering method, a CVD method, an MBE method, a PLD method, an ALD method, or the like. For example, as the insulating film to be the insulator 212, silicon oxide is deposited by a CVD method.

Here, the thickness of the insulating film to be the insulator 212 is preferably greater than or equal to the thickness of the conductor 203_1 and the thickness of the conductor 203_2. For example, when each of the thickness of the conductor 203_1 and the thickness of the conductor 203_2 is 1, the thickness of the insulating film to be the insulator 212 is greater than or equal to 1 and less than or equal to 3.

Next, CMP (chemical Mechanical Polishing) treatment is performed on the insulating film to be the insulator 212, so that part of the insulating film to be the insulator 212 is removed and a surface of the conductor 203_1 and a surface of the conductor 203_2 are exposed. Thus, the conductor 203_1, the conductor 203_2, and the insulator 212 whose top surfaces are flat can be formed (see FIG. 9).

A method for forming the conductor 203_1 and the conductor 203_2 that is different from the above is described below.

Then, the insulator 212 is deposited over the insulator 210. The insulator 212 can be deposited by a sputtering method, a CVD method, an MBE method, a PLD method, an ALD method, or the like.

Then, openings are formed in the insulator 212 to reach the insulator 210. Examples of the openings include grooves and slits. Regions where the openings are formed may be referred to as opening portions. The openings can be formed by wet etching; however, dry etching is preferably used for microfabrication. As the insulator 210, it is preferable to select an insulator that functions as an etching stopper film used in forming the groove by etching the insulator 212. For example, in the case where a silicon oxide film is used for the insulator 212 in which the groove is to be formed, a silicon nitride film, an aluminum oxide film, or a hafnium oxide film is preferably used for the insulator 210.

After formation of the openings, a conductive film to be the conductor 203_1 and the conductor 203_2 is deposited. The conductive film desirably contains a conductor that has a function of inhibiting the passage of oxygen. For example, tantalum nitride, tungsten nitride, or titanium nitride can be used. Alternatively, a layered film formed using the conductor and tantalum, tungsten, titanium, molybdenum, aluminum, copper, or a molybdenum-tungsten alloy can be used. The conductive film to be the conductor 203_1 and the conductor 203_2 can be deposited by a sputtering method, a CVD method, an MBE method, a PLD method, an ALD method, or the like.

In the case where the conductive film to be the conductor 203_1 and the conductor 203_2 has a multilayer structure, for example, a stacked film of tantalum nitride and titanium nitride over the tantalum nitride is deposited by a sputtering method. With the use of such metal nitride for a lower layer of the conductive film to be the conductor 203_1 and the conductor 203_2, a metal that is easily diffused, such as copper, can be prevented from being diffused to the outside from the conductor 203_1 and the conductor 203_2 even when the metal is used for a conductive film of an upper layer of the conductive film to be the conductor 203_1 and the conductor 203_2 that is described below.

Next, the upper layer of the conductive film to be the conductor 203_1 and the conductor 203_2 is deposited. The conductive film can be deposited by a plating method, a sputtering method, a CVD method, an MBE method, a PLD method, an ALD method, or the like. For example, as the conductive film that is the upper layer of the conductive film to be the conductor 203_1 and the conductor 203_2, a low-resistant conductive material such as copper is deposited.

Next, by CMP treatment, the upper layer of the conductive film to be the conductor 203_1 and the conductor 203_2 and the lower layer of the conductive film to be the conductor 203_1 and the conductor 203_2 are partly removed to expose the insulator 212. As a result, the conductive film to be the conductor 203_1 and the conductor 203_2 remains only in the opening portions. Thus, the conductor 203_1 and the conductor 203_2 whose top surfaces are flat can be formed. Note that the insulator 212 is partly removed by the CMP treatment in some cases. The above is the description of the different formation method of the conductor 203_1 and the conductor 203_2.

Next, the insulator 214 is deposited over the conductor 203_1 and the conductor 203_2. The insulator 214 can be deposited by a sputtering method, a CVD method, an MBE method, a PLD method, an ALD method, or the like (see FIG. 9).

Next, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere, an inert gas atmosphere, or an atmosphere containing an oxidizing gas at higher than or equal to 10 ppm, higher than or equal to 1%, or higher than or equal to 10%. The heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen. By the heat treatment, impurities such as hydrogen and water in the insulator 214 can be removed, for example. Alternatively, in the heat treatment, plasma treatment containing oxygen may be performed under a reduced pressure. The plasma treatment containing oxygen is preferably performed using an apparatus including a power source for generating high-density plasma using microwaves, for example. Alternatively, a power source for applying an RF (Radio Frequency) to a substrate side may be included. Note that the heat treatment is not necessarily performed in some cases.

Next, a conductive film to be the conductor 235 (the conductor 235_1, the conductor 235_2, the conductor 235_3, the conductor 235_4, and the conductor 235_5) is deposited. The conductive film to be the conductor 235 can be deposited by a sputtering method, a CVD method, an MBE method, a PLD method, an ALD method, or the like.

Next, the conductive film to be the conductor 235 is processed by a lithography method to form the conductor 235 (the conductor 235_1, the conductor 235_2, the conductor 235_3, the conductor 235_4, and the conductor 235_5). Here, the conductor 235 is provided so that a region between the conductor 235_2 and the conductor 235_3 overlaps with the conductor 203_1 and a region between the conductor 253_3 and the conductor 235_4 overlaps with the conductor 203_2 (see FIG. 9).

Figure 10A:
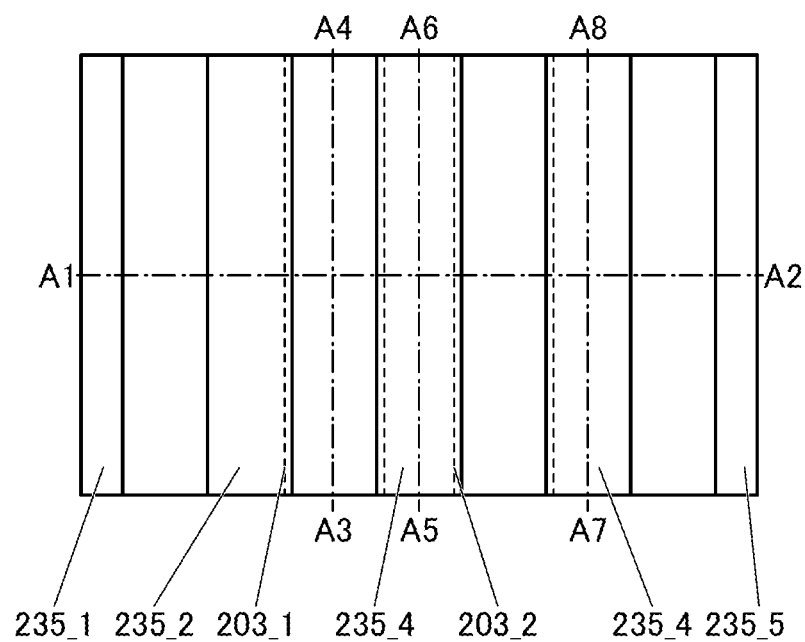
FIGS. 10A to 10C A top view and cross-sectional views illustrating a method for manufacturing a semiconductor device according to one embodiment of the present invention.
Figure 10C:
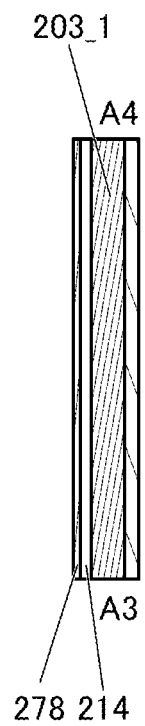
Figure 10B:
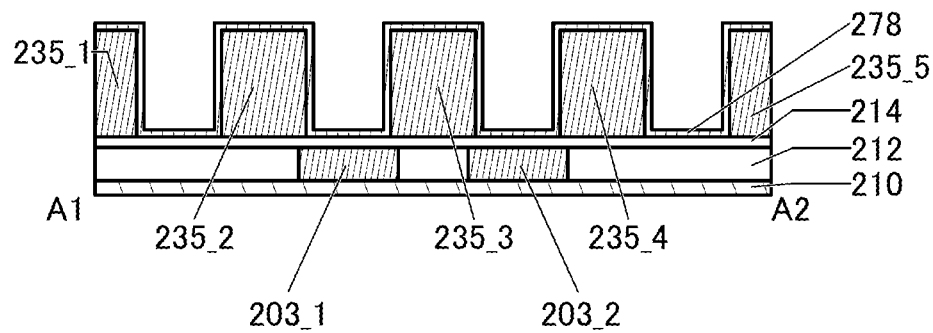

Next, the dielectric 278 is deposited so as to cover the insulator 214 and the conductor 235 (see FIG. 10). The insulator 278 can be deposited by a sputtering method, a CVD method, an MBE method, a PLD method, an ALD method, or the like.

Figure 11A:
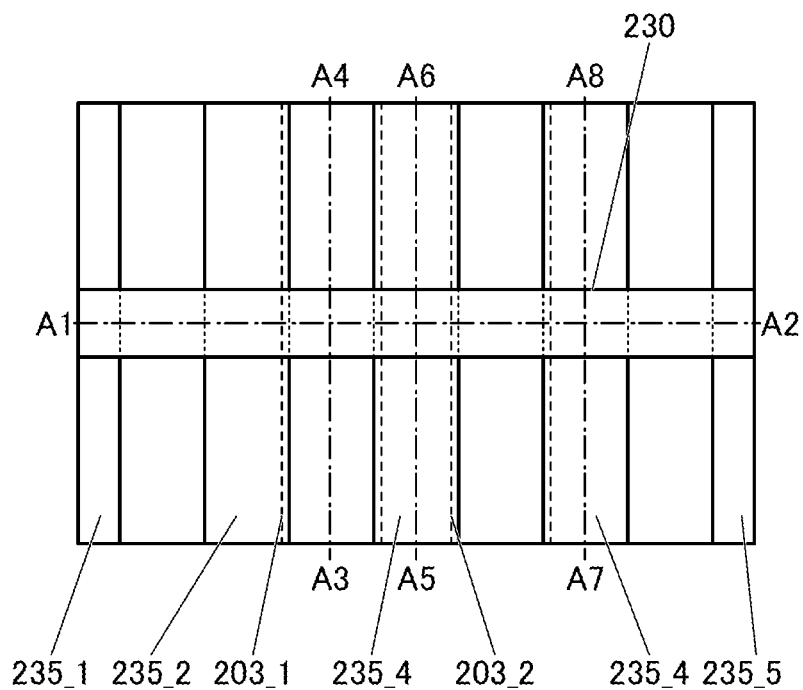
FIGS. 11A to 11C A top view and cross-sectional views illustrating a method for manufacturing a semiconductor device according to one embodiment of the present invention.
Figure 11C:
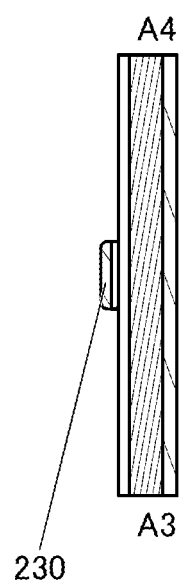
Figure 11B:
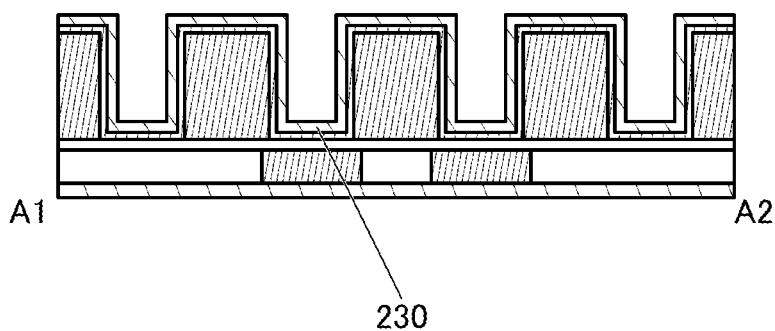

Next, an oxide film to be the oxide 230 is deposited over the dielectric 278 (see FIG. 11). The oxide film to be the oxide 230 can be deposited by a sputtering method, a CVD method, an MBE method, a PLD method, an ALD method, or the like.

For example, in the case where the oxide film to be the oxide 230 is deposited by a sputtering method, oxygen or a mixed gas of oxygen and a rare gas is used as a sputtering gas. By increasing the proportion of oxygen contained in the sputtering gas, excess oxygen in the deposited oxide film can be increased. In the case where the oxide film to be the oxide 230 is deposited by a sputtering method, the above In-M-Zn oxide target can be used.

In particular, part of oxygen contained in the sputtering gas passes through the dielectric 278 and is supplied to the insulator 214 during the deposition of the oxide film to be the oxide 230 in some cases.

Note that the proportion of oxygen contained in the sputtering gas for the oxide film to be the oxide 230 is higher than or equal to 70%, preferably higher than or equal to 80%, and further preferably 100%.

In the case where the oxide film to be the oxide 230 is deposited by a sputtering method, for example, a target with In:Ga:Zn=4:2:4.1 [atomic ratio], a target with In:Ga:Zn=1:1:1 [atomic ratio], or a target with In:Ga:Zn=1:1:0.5 [atomic ratio] is used for the deposition.

Although a structure in which the oxide film to be the oxide 230 is a single layer is described in this embodiment, the present invention is not limited to this. For example, a stacked-layer structure of two, three, four or more layers may be employed. In the case where the stacked-layer structure is deposited by a sputtering method, targets with different atomic ratios of In to Ga and Zn may be used to deposit the stacked-layer structure. Alternatively, the stacked-layer structure may be deposited while the proportion of oxygen contained in a sputtering gas is changed. Further alternatively, the stacked structure may be deposited while the atomic ratio of In to Ga and Zn and the proportion of oxygen contained in a sputtering gas are changed.

Next, heat treatment may be performed. For the heat treatment, the conditions similar to those for the above heat treatment can be used. Through the heat treatment, impurities such as hydrogen and water in the oxide film to be the oxide 230 can be removed, for example. For example, treatment is performed at 400° C. in a nitrogen atmosphere for one hour, and successively another treatment is performed at 400° C. in an oxygen atmosphere for one hour.

Next, the oxide film to be the oxide 230 is processed to form the oxide 230. At this time, the dielectric 278 in a region that does not overlap with the oxide 230 is etched and the surface of the insulator 214 is exposed in some cases (see FIG. 11).

Here, as illustrated in FIG. 11(A), the long side of the oxide 230 is formed so as to extend in the direction perpendicular to the direction parallel to the long side of the conductor 235. In addition, the oxide 230 is formed to at least partly overlap with the conductor 203.

Note that the oxide films may be processed by a lithography method. The processing can be performed by a dry etching method or a wet etching method. The processing by a dry etching method is suitable for microfabrication.

Instead of the resist mask, a hard mask formed of an insulator or a conductor may be used as an etching mask. In the case where a hard mask is used, a hard mask with a desired shape can be formed in the following manner: an insulating film or a conductive film that is the material of the hard mask is formed over the oxide film to be the oxide 230, a resist mask is formed thereover, and then the material of the hard mask is etched. The etching of the oxide film to be the oxide 230 may be performed after the resist mask is removed or with the resist mask left. In the latter case, the resist mask disappears during the etching in some cases. The hard mask may be removed by etching after the etching of the oxide film to be the oxide 230.

In some cases, treatment such as dry etching performed in the above process causes the attachment or diffusion of impurities due to an etching gas or the like to a surface or an inside of the oxide 230 or the like. The impurity is fluorine or chlorine, for example.

In order to remove the impurities, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed.

Next, heat treatment may be performed. For the conditions of the heat treatment, the conditions for the above-described heat treatment can be used.

Figure 12A:
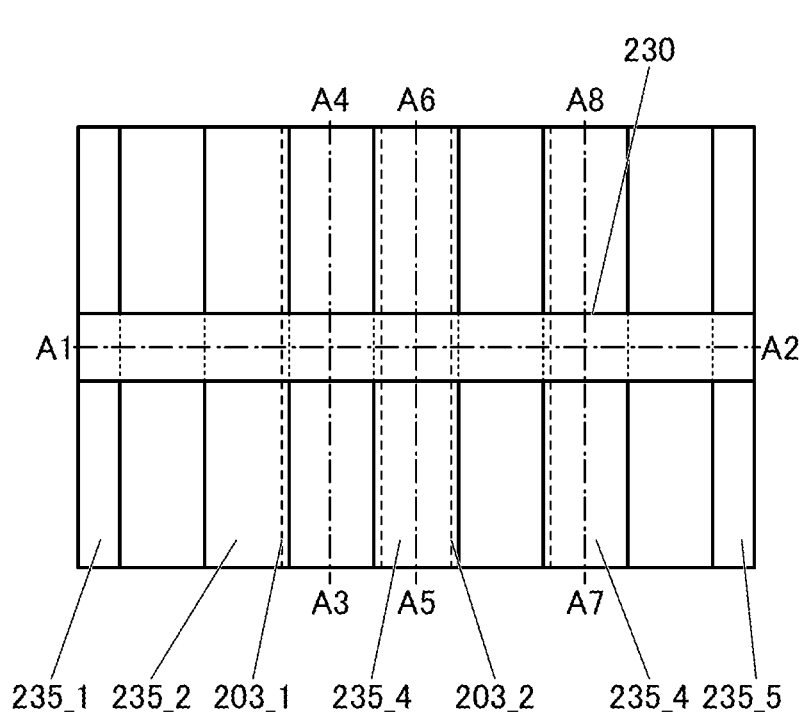
FIGS. 12A to 12C A top view and cross-sectional views illustrating a method for manufacturing a semiconductor device according to one embodiment of the present invention.
Figure 12C:
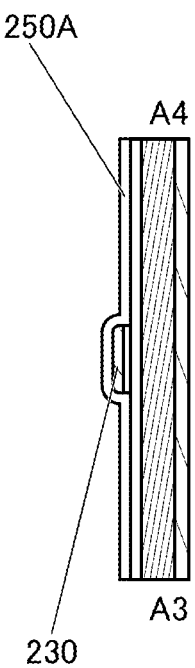
Figure 12B:
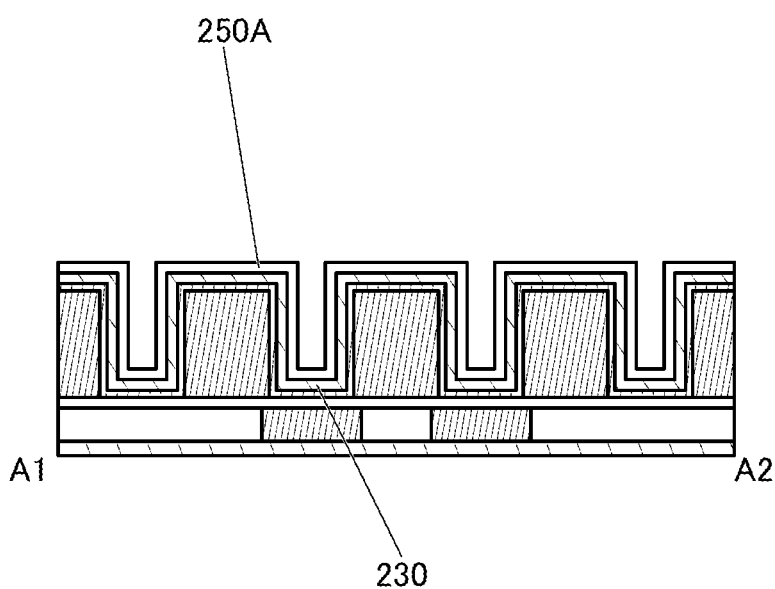

Then, an insulating film 250A is deposited over the insulator 214, the conductor 235, and the oxide 230 (see FIG. 12). The insulating film 250A can be deposited by a sputtering method, a CVD method, an MBE method, a PLD method, an ALD method, or the like. Here, the insulating film 250A may have a stacked-layer structure. For example, in the case where the insulating film 250A has a two-layer structure, a second layer of the insulating film 250A is deposited by a sputtering method in an atmosphere containing oxygen, whereby oxygen can be added to a first layer of the insulating film 250A.

Here, heat treatment may be performed. For the heat treatment, the conditions for the above-described heat treatment can be used. The heat treatment can reduce the moisture concentration and the hydrogen concentration in the insulating film 250A.

Figure 13A:
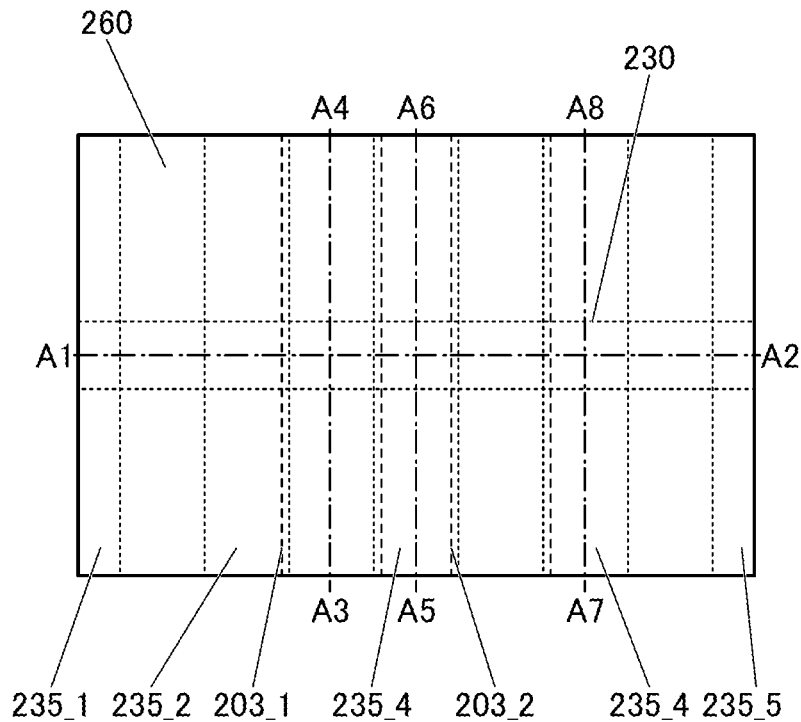
FIGS. 13A to 13C A top view and cross-sectional views illustrating a method for manufacturing a semiconductor device according to one embodiment of the present invention.
Figure 13C:
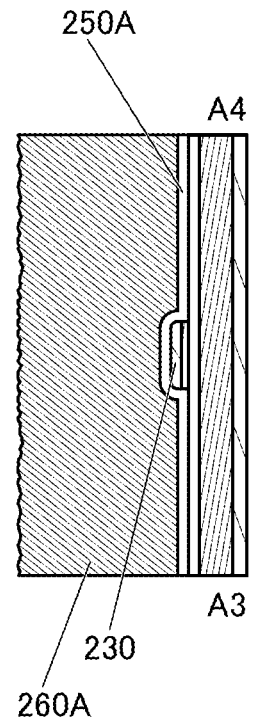
Figure 13B:
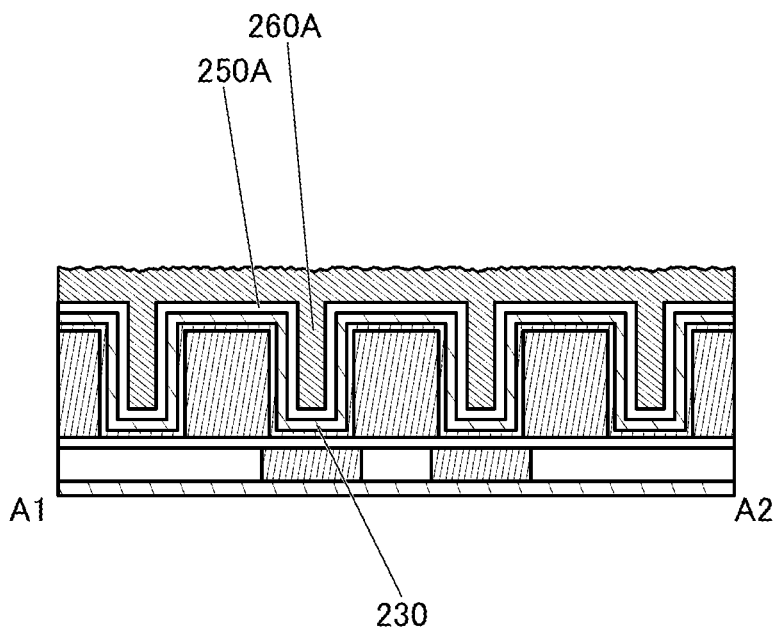

Next, a conductive film 260A is deposited over the insulating film 250A (see FIG. 13). The conductive film 260A can be deposited by a sputtering method, a CVD method, an MBE method, a PLD method, an ALD method, or the like. The conductive film 260A may have a stacked structure of two or more layers. For example, titanium nitride is deposited by a CVD method or an ALD method, and then, tungsten is deposited by a CVD method.

Figure 14A:
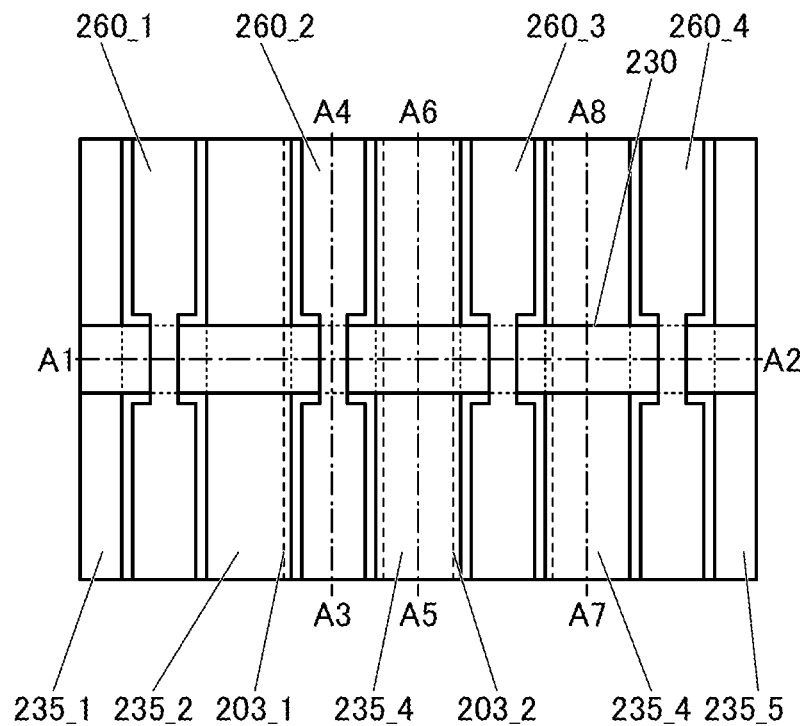
FIGS. 14A to 14C A top view and cross-sectional views illustrating a method for manufacturing a semiconductor device according to one embodiment of the present invention.
Figure 14C:
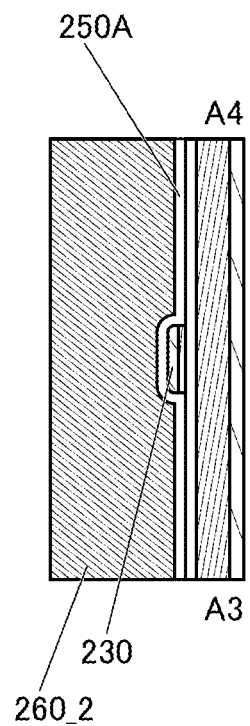
Figure 14B:
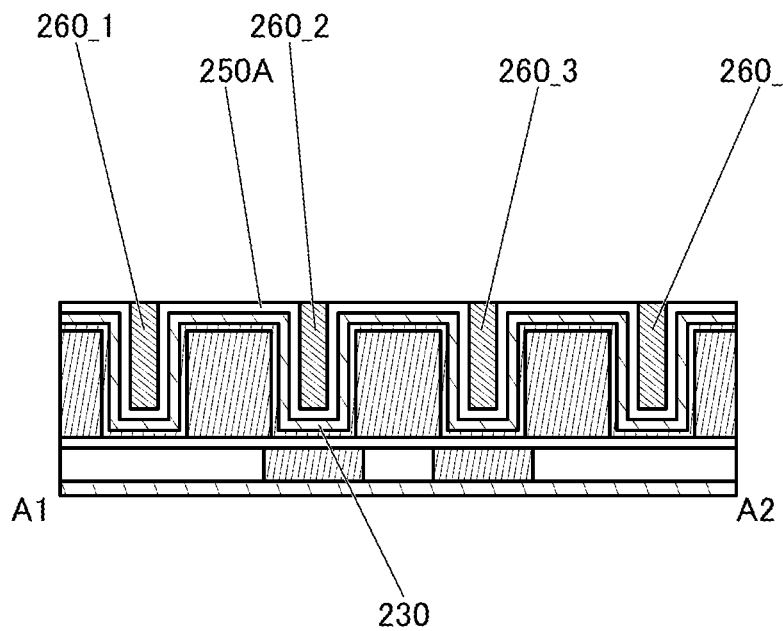
Figure 15A:
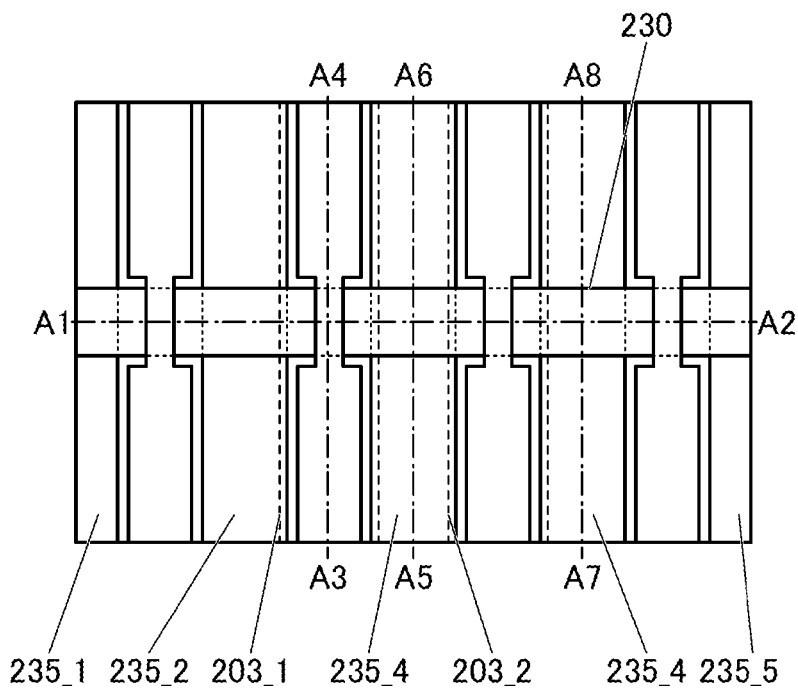
FIGS. 15A to 15C A top view and cross-sectional views illustrating a method for manufacturing a semiconductor device according to one embodiment of the present invention.
Figure 15C:
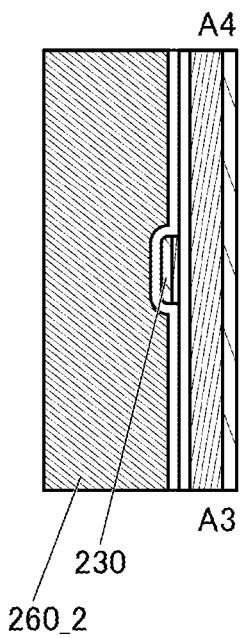
Figure 15B:
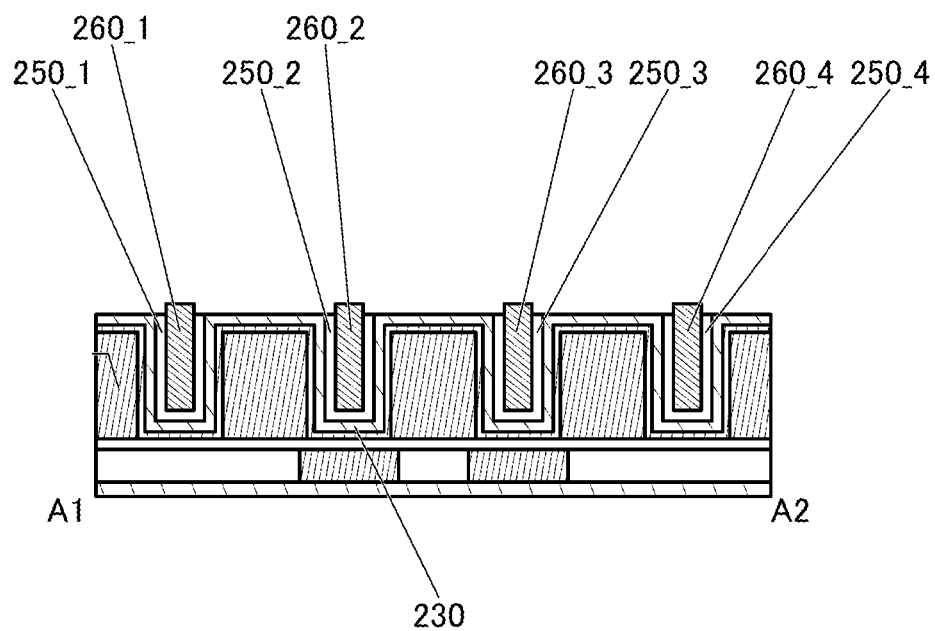

Next, by performing CMP treatment, part of the conductive film 260A is removed, and part of the insulating film 250A is exposed, whereby the conductor 260 (the conductor 260_1, the conductor 260_2, the conductor 260_3, and the conductor 260_4) is formed (see FIG. 14).

Next, an exposed portion of the insulating film 250A, i.e., the insulating film 250A in a region overlapping with a top surface of the conductor 235 is etched, and thus the insulator 250 (the insulator 250_1, the insulator 250_2, the insulator 250_3, and the insulator 250_4) is formed. Thus, the oxide 230 in a region overlapping with the top surface of the conductor 235 is exposed (see FIG. 15).

Figure 16A:
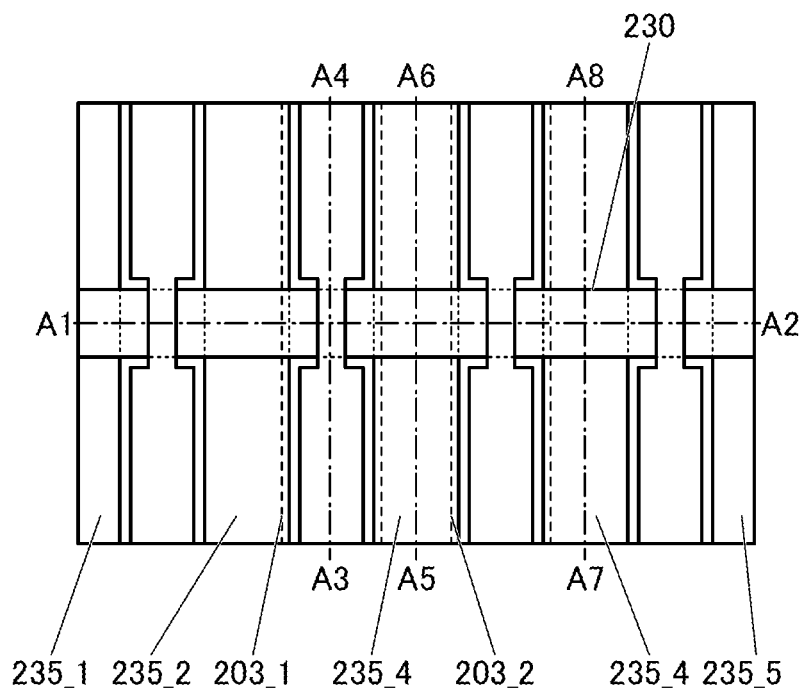
FIGS. 16A to 16C A top view and cross-sectional views illustrating a method for manufacturing a semiconductor device according to one embodiment of the present invention.
Figure 16C:
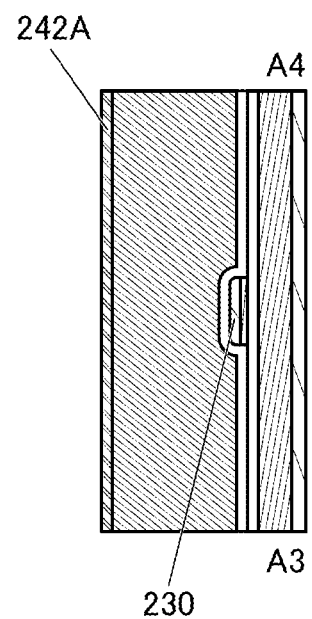
Figure 16B:
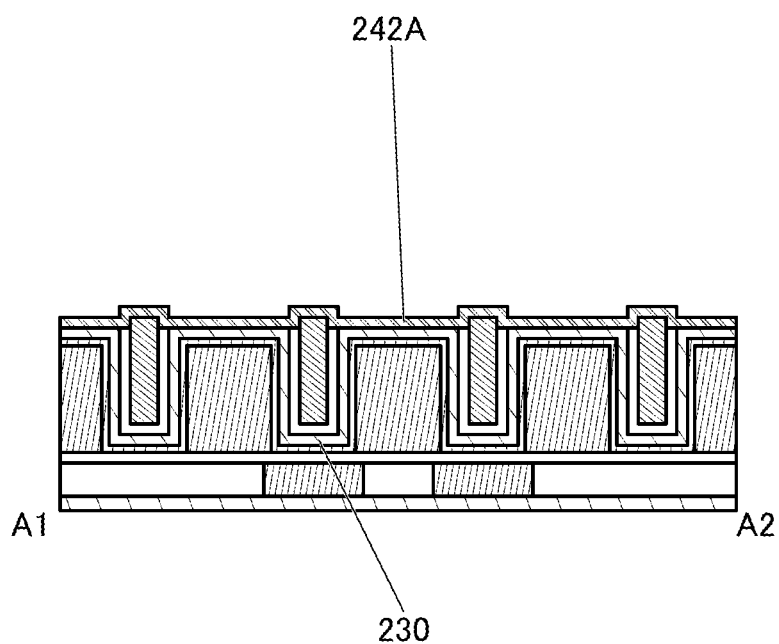
Figure 17A:
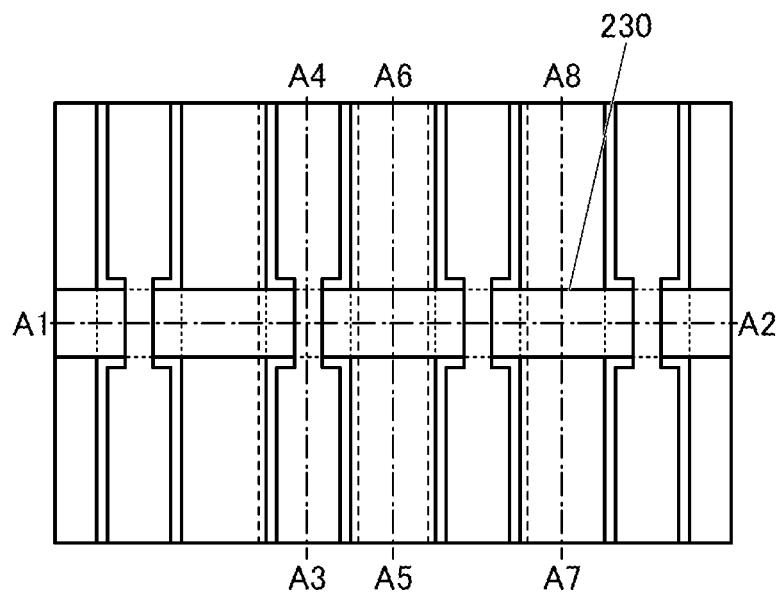
FIGS. 17A to 17C A top view and cross-sectional views illustrating a method for manufacturing a semiconductor device according to one embodiment of the present invention.
Figure 17C:
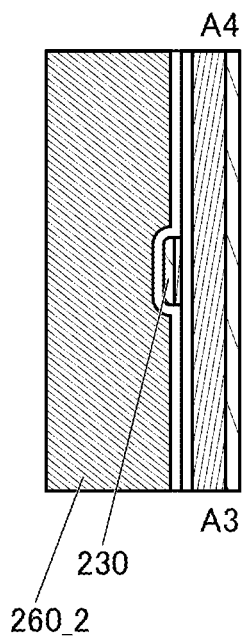
Figure 17B:
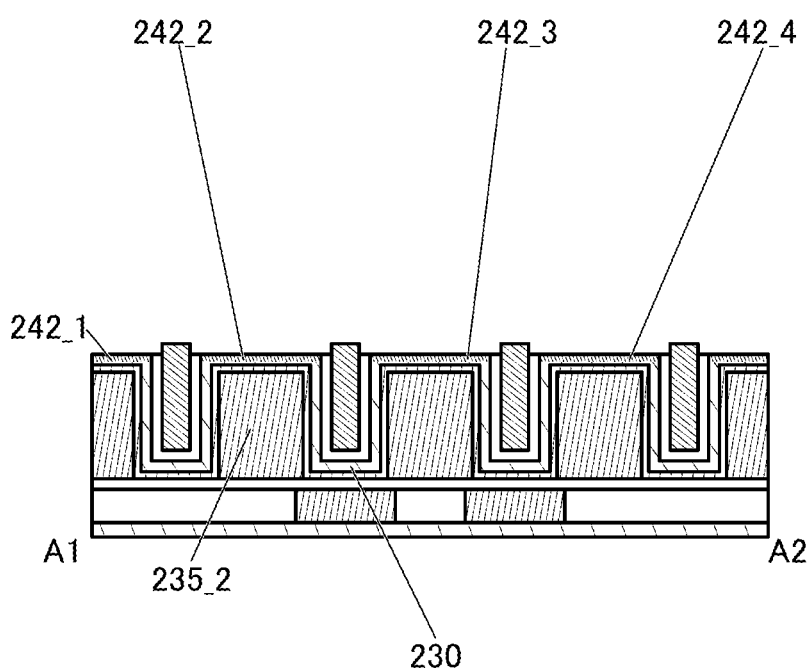
Figure 18A:
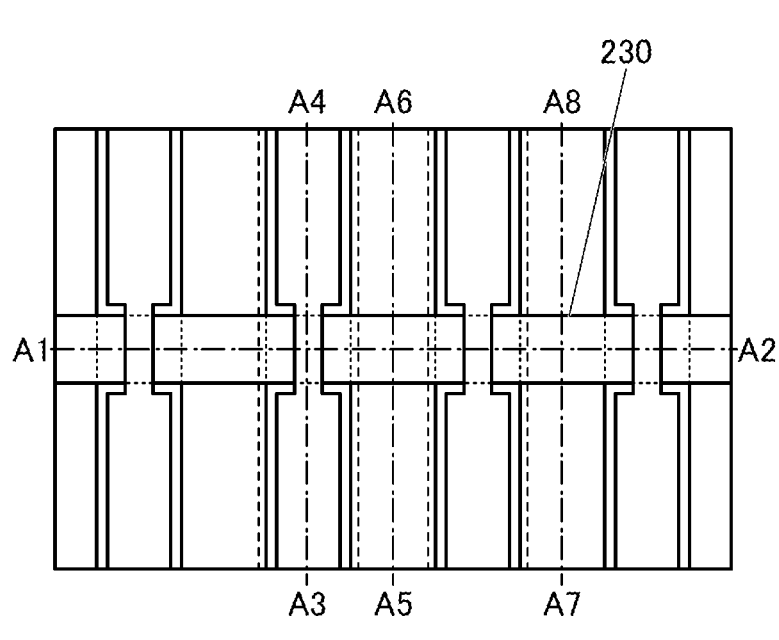
FIGS. 18A to 18C A top view and cross-sectional views illustrating a method for manufacturing a semiconductor device according to one embodiment of the present invention.
Figure 18C:
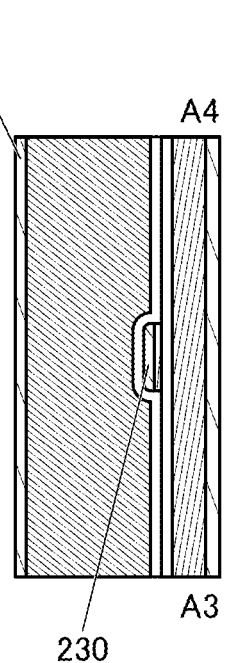
Figure 18B:
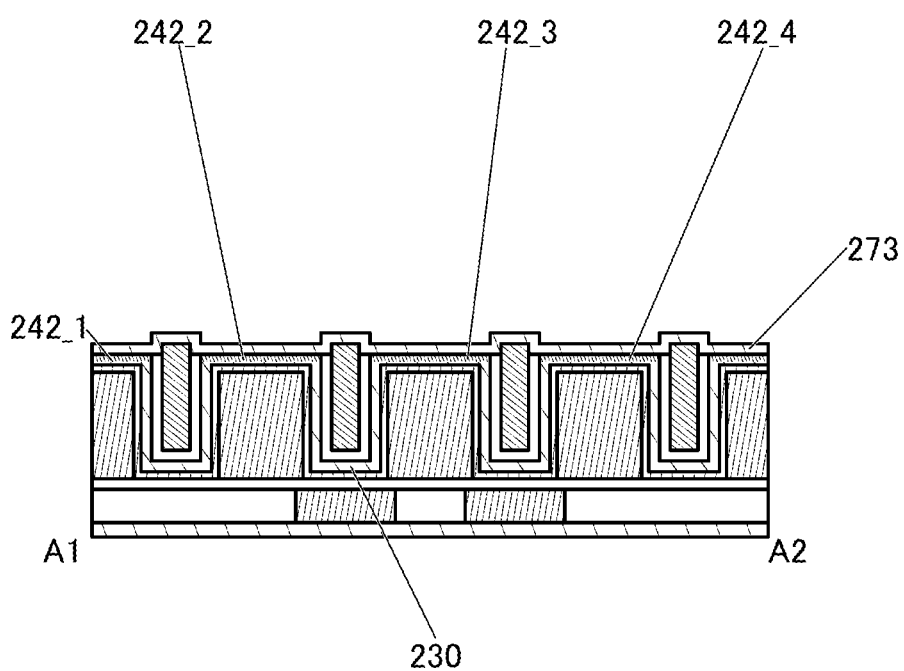
Figure 19A:
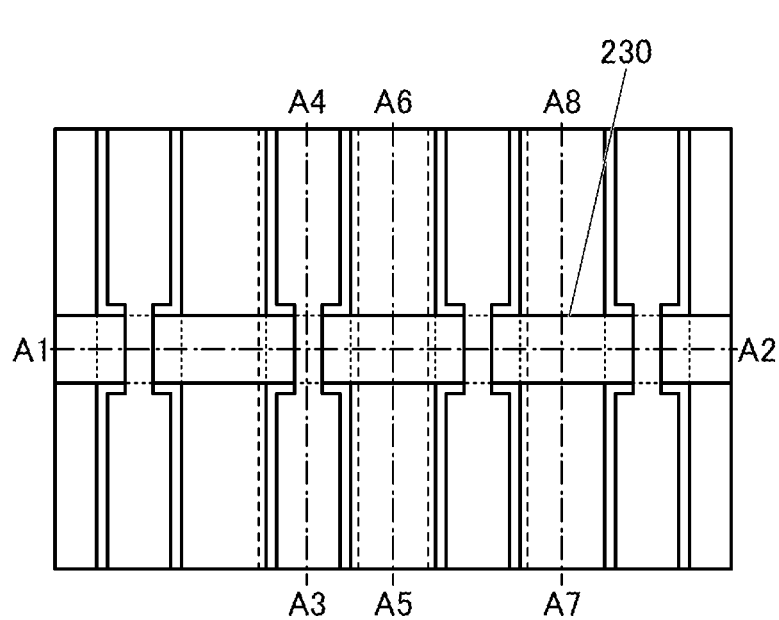
FIGS. 19A to 19C A top view and cross-sectional views illustrating a method for manufacturing a semiconductor device according to one embodiment of the present invention.
Figure 19C:
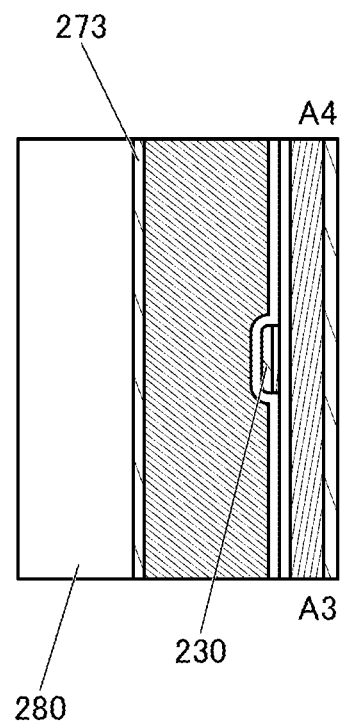
Figure 19B:
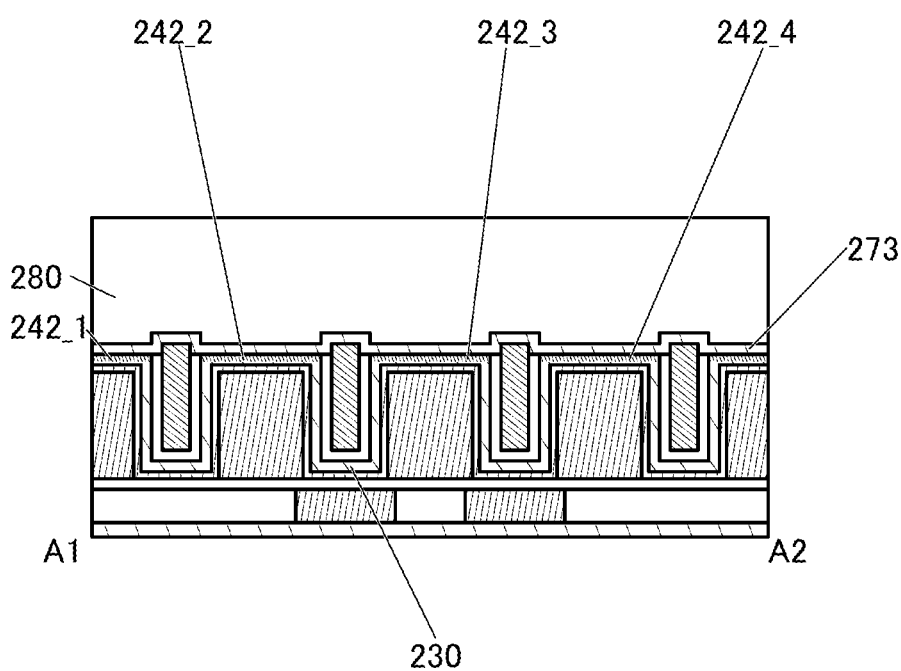
Figure 20A:
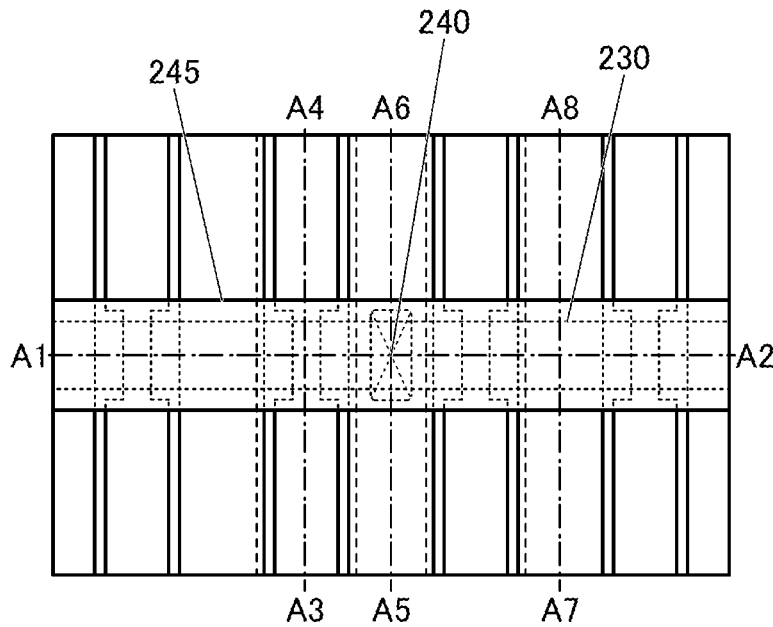
FIGS. 20A to 20C A top view and cross-sectional views illustrating a method for manufacturing a semiconductor device according to one embodiment of the present invention.
Figure 20C:
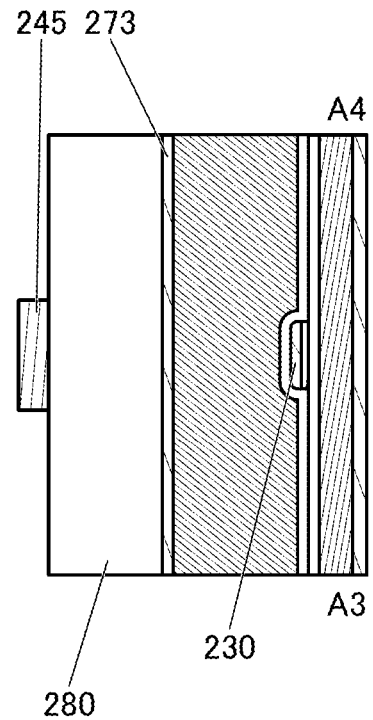
Figure 20B:
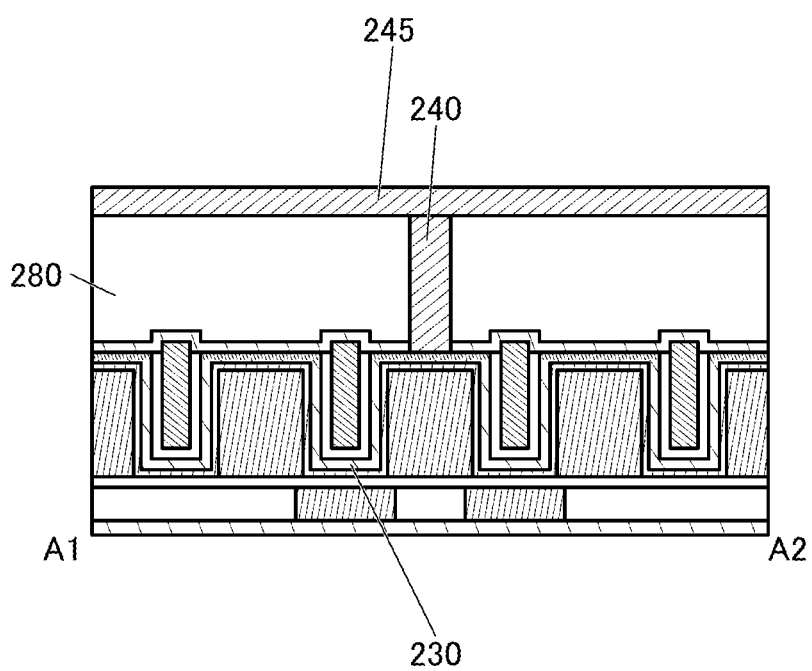

Then, a film 242A is deposited over the oxide 230, the insulator 250, and the conductor 260 (see FIG. 16).

As the film 242A, a metal film, a nitride film containing a metal element, or an oxide film containing a metal element is used. For example, the film 242A is a film containing a metal element such as aluminum, ruthenium, titanium, tantalum, tungsten, or chromium. Note that the film 242A can be deposited by a sputtering method, a CVD method, an MBE method, a PLD method, an ALD method, or the like.

Subsequently, heat treatment is performed. By heat treatment in an atmosphere containing nitrogen, a metal element that is a component of the film 242A is diffused from the film 242A into the oxide 230, or a metal element that is a component of the oxide 230 is diffused into the film 242A. As a result, the region 242 with reduced resistance (a region 242_1, a region 242_2, a region 242_3, and a region 242_4) can be formed on the surface of the oxide 230. After that, the film 242A may be removed (see FIG. 17).

The heat treatment can be performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere. The heat treatment may be performed under a reduced pressure.

Alternatively, the heat treatment may be performed in a nitrogen or inert gas atmosphere, and then another heat treatment may be performed in an atmosphere containing an oxidizing gas at higher than or equal to 10 ppm, higher than or equal to 1%, or higher than or equal to 10%. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C.

Here, when a metal compound is formed with a metal element of the film 242A and a metal element of the oxide 230, the region 242 with reduced resistance is formed. Note that the region 242 is a layer containing a metal compound containing a component of the film 242A and a component of the oxide 230. For example, the region 242 may include a layer in which a metal element of the oxide 230 is alloyed with a metal element of the film 242A. Being alloyed, the metal element becomes relatively stable, so that a highly reliable semiconductor device can be provided.

In the case where hydrogen in the oxide 230 diffuses into the region 231 and enters an oxygen vacancy in the region 231, the hydrogen becomes relatively stable. Hydrogen in an oxygen vacancy in the region 234 is released from the oxygen vacancy by heat treatment at 250° C. or higher, diffuses into the region 231, enters an oxygen vacancy in the region 231, and becomes relatively stable. Thus, by the heat treatment, the resistance of the region 231 is further reduced, and the region 234 is highly purified (reduction of impurities such as water or hydrogen) and the resistance is further increased.

In the above step of forming the region 242 or the heat treatment, oxygen in the region 231 of the oxide 230 is absorbed by the region 242, whereby oxygen vacancies might be generated in the region 231. Entry of hydrogen in the oxide 230 into the oxygen vacancy increases the carrier density of the region 231. Thus, the region 231 of the oxide 230 becomes a low-resistance n-type region.

With the above structure, the regions of the oxide 230 can be formed in a self-aligned manner. Thus, minute or highly integrated semiconductor devices can be manufactured with high yield.

Thus, by appropriately selecting the areas of the regions, a transistor having electrical characteristics that meet the demand for the circuit design can be easily provided.

Here, the region 231 may be formed by an ion doping method by which an ionized source gas is added without mass separation, or the like, instead of or in addition to the method for forming the region 231 using the above-described film 242A. Here, the ions can reach the oxide 230 in the vicinity of a region of the oxide 230 overlapping with the top surface of the conductor 235; however, the ions cannot reach the other region of the oxide 230. Accordingly, the region 231 can be formed in a self-aligned manner.

In the case where mass separation is performed by an ion doping method or the like, ion species to be added and its concentration can be controlled properly. On the other hand, in the case of not performing mass separation, ions at a high concentration can be added in a short time.

Alternatively, an ion doping method in which atomic or molecular clusters are generated and ionized may be used. Note that a dopant may be referred to as an ion, a donor, an acceptor, an impurity, an element, or the like.

As the dopant, an element that forms an oxygen vacancy, an element that is bonded to an oxygen vacancy, or the like is used. Typical examples of such an element include hydrogen, boron, carbon, nitrogen, fluorine, phosphorus, sulfur, chlorine, titanium, and a rare gas. Typical examples of the rare gas element are helium, neon, argon, krypton, and xenon.

Next, the insulator 273 is deposited. The insulator 273 can be deposited by a sputtering method, a CVD method, an MBE method, a PLD method, an ALD method, or the like. For example, aluminum oxide is deposited as the insulator 273 by a sputtering method (see FIG. 18).

Next, the insulator 280 is deposited. The insulator 280 can be deposited by a sputtering method, a CVD method, an MBE method, a PLD method, an ALD method, or the like. Alternatively, the insulator 280 can be deposited by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is used for the insulator 280.

The insulator 280 is preferably formed to have a flat top surface. For example, the insulator 280 may have a flat top surface right after the deposition. Alternatively, for example, the insulator 280 may have a flat top surface by removing the insulator or the like from the top surface after the deposition so that the top surface becomes parallel to a reference surface such as a rear surface of the substrate. Such treatment is referred to as planarization treatment. As the planarization treatment, for example, CMP treatment, dry etching treatment, or the like can be performed. In this embodiment, CMP treatment is used for the planarization treatment (see FIG. 19).

Note that the insulator 280 has a single-layer structure in the drawings, but may have a stacked-layer structure of two or more layers. For example, to reduce the warpage of the substrate, a layer having compressive stress and a layer having tensile stress may be stacked to cancel the internal stress.

Next, an opening reaching the region 242_3 included in the region 231 of the oxide 230 is formed in the insulator

280. Since the opening has a high aspect ratio, for example, anisotropic etching with a hard mask is preferably performed in this step. Note that dry etching is preferably used as the anisotropic etching for forming the opening with a high aspect ratio.

Here, the region 242_3 included in the region 231 may be subjected to ion implantation by an ion implantation method, an ion doping method by which an ionized source gas is added without mass separation, a plasma immersion ion implantation method, or the like. Ions cannot reach regions except the opening because of the insulator 280. In other words, ions can be implanted into the opening in a self-aligned manner. Due to this ion implantation, the carrier density of the region 242_3 included in the region 231 in the opening can be increased, and thus the contact resistance between the conductor 240 and the region 242_3 included in the region 231 can be reduced in some cases.

Next, a conductive film to be the conductor 240 is deposited. The conductive film to be the conductor 240 desirably has a stacked-layer structure which includes a conductor having a function of inhibiting the passage of impurities such as water or hydrogen. For example, a stacked-layer structure of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Next, CMP treatment is performed to remove the conductive film to be the conductor 240 that is over the insulator 280. As a result, the conductive film remains only in the opening, so that the conductor 240 having flat top surface can be formed.

Furthermore, the conductor 240 may be formed after aluminum oxide is formed on a side wall portion of the opening. By forming aluminum oxide on the side wall portion of the opening, the passage of oxygen from the outside can be inhibited and oxidation of the conductor 240 can be prevented. Furthermore, impurities such as water or hydrogen can be prevented from being diffused from the conductor 240 to the outside. The aluminum oxide can be formed by depositing aluminum oxide in the opening by an ALD method or the like and then performing anisotropic etching.

Next, a conductive film to be the conductor 245 is deposited. The conductive film to be the conductor 245 can be deposited by a sputtering method, a CVD method, an MBE method, a PLD method, an ALD method, or the like. Next, the conductive film to be the conductor 245 is processed by a lithography method to form the conductor 245. The conductor 245 is formed to extend in a direction parallel to the A1-A2 direction (see FIG. 20).

Through the above steps, the semiconductor device including the transistor 200a, the transistor 200b, the transistor 140a, the transistor 140b, the capacitor 100a, and the capacitor 100b illustrated in FIG. 1 can be manufactured.

Modification Example of Semiconductor Device

Figure 5A:
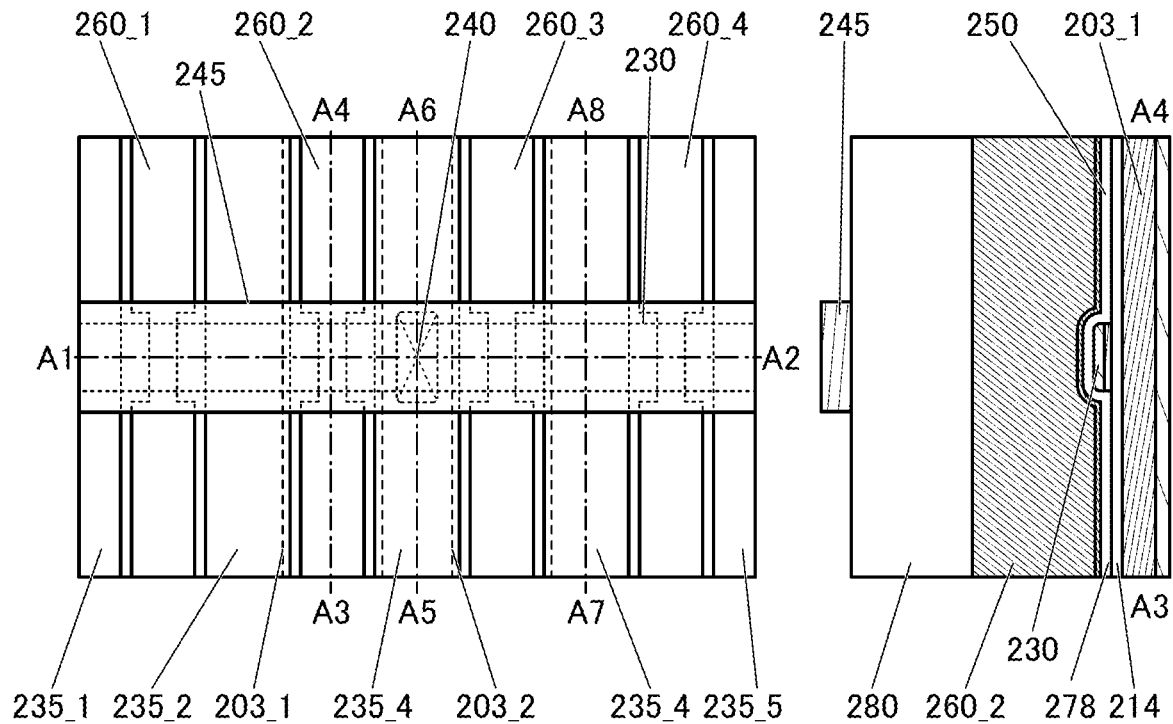
FIGS. 5A to 5C A top view and cross-sectional views of a semiconductor device according to one embodiment of the present invention.
Figure 5C:
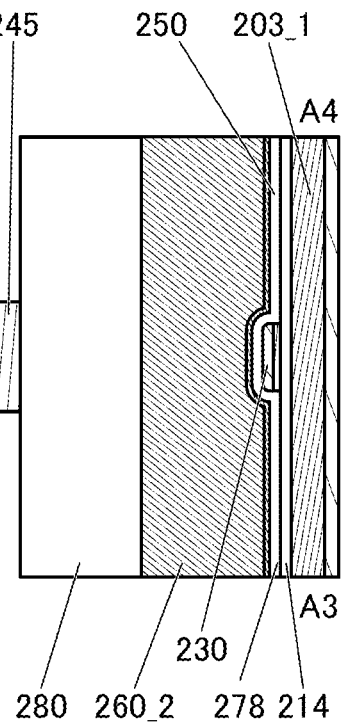
Figure 5B:
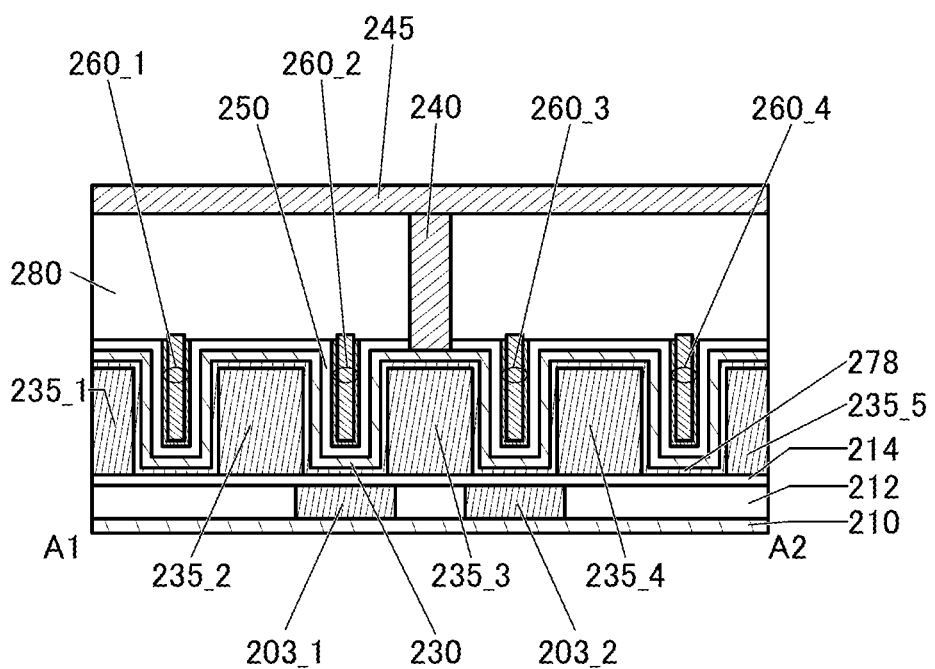

FIG. 5 illustrates an example of the semiconductor device including the transistor 200a, the transistor 200b, the transistor 140a, the transistor 140b, the capacitor 100a, and the capacitor 100b. FIG. 5(A) is a top view of the semiconductor device. For simplification of the drawing, some films are omitted in FIG. 5(A). FIG. 5(B) is the cross-sectional view taken along dashed-dotted line A1-A2 in FIG. 5(A). FIG. 5(C) is the cross-sectional view taken along dashed-dotted line A3-A4 in FIG. 5(A).

The semiconductor device illustrated in FIG. 5 is different from the semiconductor device illustrated in FIG. 1 and FIG. 2 in that the region 242 (the region 242_1, the region 242_2, the region 242_3, the region 242_4, and the region 242_5) is not included; the insulator 250 is not separated into the insulator 250_1, the insulator 250_2, the insulator 250_3, and the insulator 250_4; and the conductor 260 has a two-layer structure.

The semiconductor device illustrated in FIG. 1 and FIG. 2 can be referred to for the other structures and the effect.

FIG. 6 illustrates an example of the semiconductor device including the transistor 200a, the transistor 200b, the transistor 140a, the transistor 140b, the capacitor 100a, and the capacitor 100b. FIG. 6(A) is a top view of the semiconductor device. For simplification of the drawing, some films are omitted in FIG. 6(A). FIG. 6(B) is a cross-sectional view taken along dashed-dotted line A1-A2 in FIG. 6(A). FIG. 6(C) is a cross-sectional view taken along dashed-dotted line A3-A4 in FIG. 6(A).

The structure of the semiconductor device illustrated in FIG. 6 is different from the structure of the semiconductor device illustrated in FIG. 5 in including the insulator 220 (the insulator 220_1, the insulator 220_2, the insulator 220_3, the insulator 220_4, and the insulator 220_5) in contact with a side surface of the conductor 235 (the conductor 235_1, the conductor 235_2, the conductor 235_3, the conductor 235_4, and the conductor 235_5).

The insulator 220_2 is provided on the side surface of the conductor 235_2, and the insulator 220_3 is provided on the side surface of the conductor 235_3, whereby the parasitic capacitance of the transistor 200a can be reduced. Also in the transistor 200b, the insulator 220_3 is provided on the side surface of the conductor 235_3, and the insulator 220_4 is provided on the side surface of the conductor 235_4, whereby the parasitic capacitance of the transistor 200b can be reduced. When the parasitic capacitance is reduced, high-speed operation of the transistor 200a and the transistor 200b can be achieved. The semiconductor device illustrated in FIG. 5 can be referred to for the other structures and the effect. Note that the semiconductor devices illustrated in FIG. 5 and FIG. 6 may have a structure including the conductor 205_1 having a function of the second gate electrode of the transistor 140a and the conductor 205_2 having a function of the second gate electrode of the transistor 140b as illustrated in FIG. 3.

Application Example of Semiconductor Device

Figure 21:
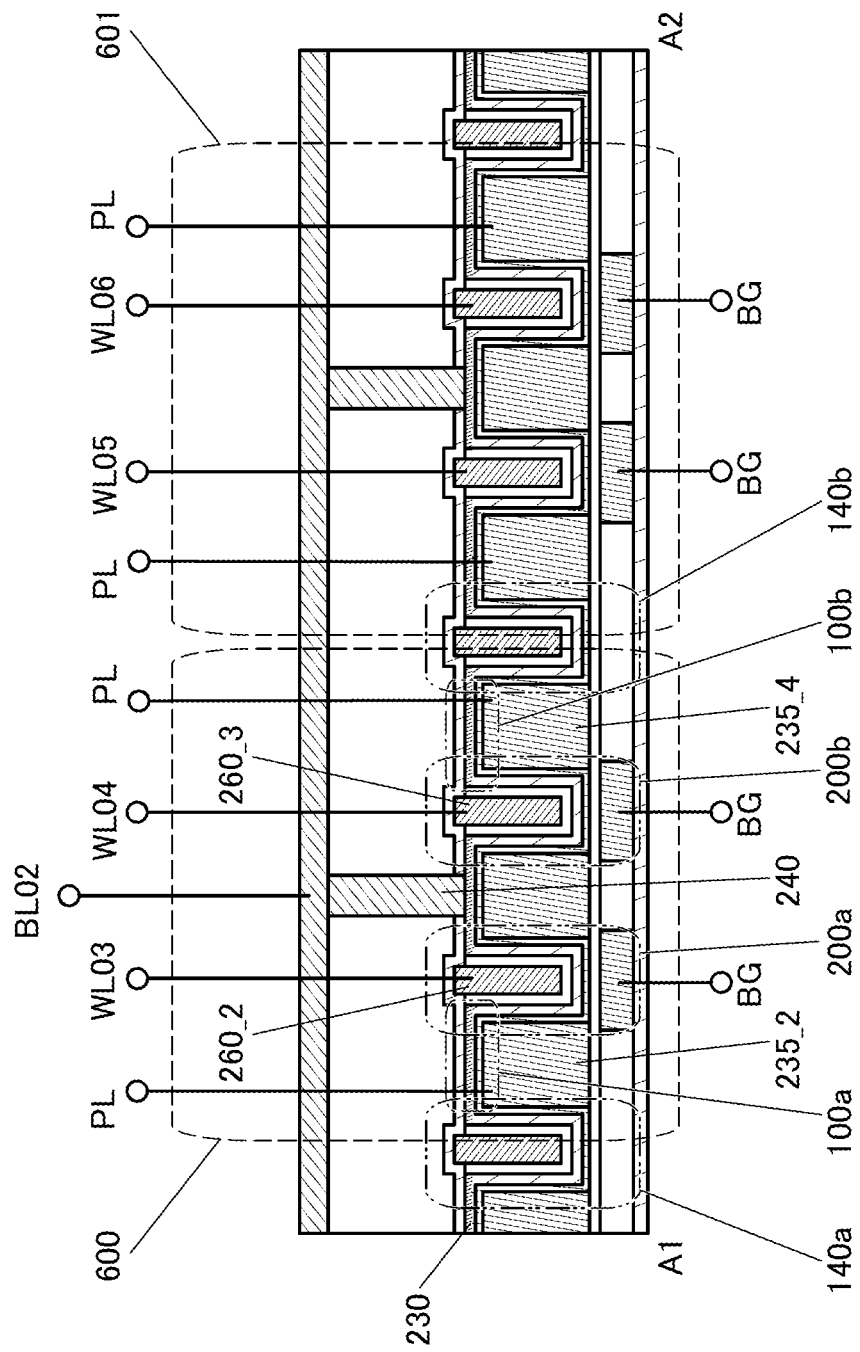
FIG. 21 A cross-sectional view of a semiconductor device according to one embodiment of the present invention.

In the above description, the semiconductor device including the transistor 200a, the transistor 200b, the transistor 140a, the transistor 140b, the capacitor 100a, and the capacitor 100b is given as a structure example; however, the semiconductor device described in this embodiment is not limited thereto. For example, as illustrated in FIG. 21, a structure in which a cell 600 and a cell 601 having a structure similar to that of the cell 600 are connected through the transistor 140b may be employed. Note that in this specification, the semiconductor device including the transistor 200a, the transistor 200b, the capacitor 100a, and the capacitor 100b is referred to as a cell. Note that the above descriptions for the transistor 200a, the transistor 200b, the transistor 140a, the transistor 140b, the capacitor 100a, and the capacitor 100b can be referred to for the structures of the transistor 200*a*, the transistor 200*b*, the transistor 140*a*, the transistor 140*b*, the capacitor 100*a*, and the capacitor 100*b*.

FIG. 21 is a cross-sectional view of the cell 600 including the transistor 200*a*, the transistor 200*b*, the capacitor 100*a*, and the capacitor 100*b* and the cell 601 having a structure similar to that of the cell 600 that are connected through the transistor 140*b*.

As illustrated in FIG. 21, the transistor 140*b* is positioned between the cell 600 and the cell 601. When the transistor 140*b* is always kept in an off state, the cell 600 and the cell 601 can be electrically isolated from each other. For the function and effect of the transistor 140*b*, the above description for the transistor 140*a* and the transistor 140*b* can be referred to.

When the transistor 200*a*, the transistor 200*b*, the capacitor 100*a*, and the capacitor 100*b* are formed to have the structures described in this embodiment as described above, the area of the cell can be reduced and the semiconductor device can be miniaturized or highly integrated.

[Structure of Cell Array]

Figure 22:
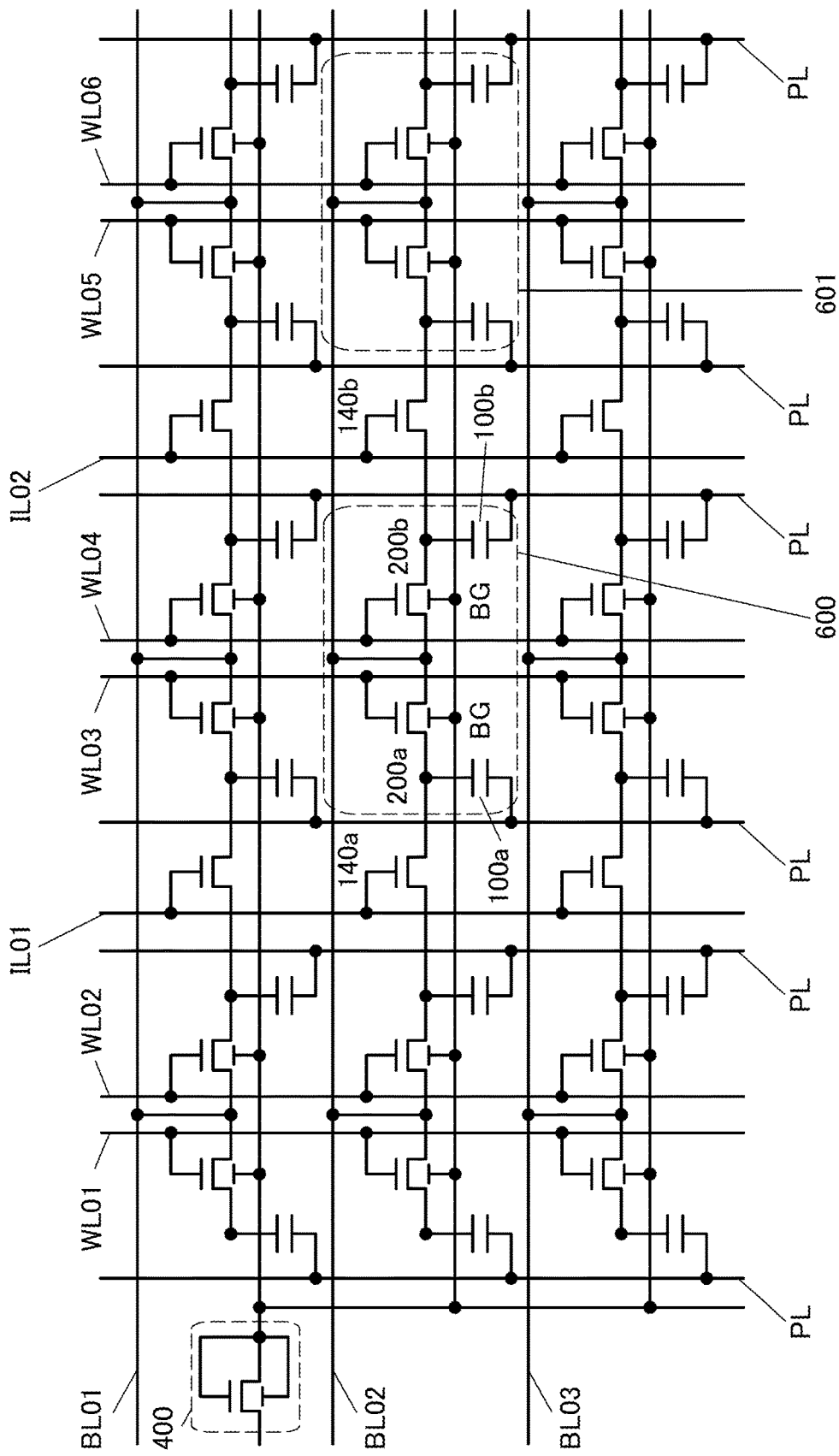
FIG. 22 A circuit diagram of a semiconductor device according to one embodiment of the present invention.

Here, FIG. 22 illustrates an example of a cell array of this embodiment. For example, when the structure of the semiconductor device illustrated in FIG. 1 is regarded as one cell and the cells are arranged in rows and columns or in a matrix, a cell array can be formed.

FIG. 22 is a circuit diagram showing an embodiment in which the cells each having the structure illustrated in FIG. 1 are arranged in a matrix. In the cell array illustrated in FIG. 22, wirings BL extend in a row direction and wirings WL extend in a column direction.

As illustrated in FIG. 22, ones of the sources and the drains of the transistor 200*a* and the transistor 200*b* which are included in the cell are electrically connected to the common wiring BL (BL01, BL02, and BL03). Furthermore, the wiring BL is also electrically connected to ones of the sources and the drains of the transistors 200*a* and the transistors 200*b* included in the cells 600 arranged in the row direction. Meanwhile, the first gate of the transistor 200*a* and the first gate of the transistor 200*b* which are included in the cell 600 are electrically connected to different wirings WL (WL01 to WL06). Furthermore, these wirings WL are electrically connected to the first gates of the transistors 200*a* and the first gates of the transistors 200*b* which are included in the cells 600 arranged in the column direction. The transistor 140*a* and the transistor 140*b* are positioned between the cells 600 which are positioned adjacent in the row direction. The first gate of the transistor 140*a* and the first gate of the transistor 140*b* are electrically connected to different wirings IL (IL01 and IL02). Furthermore, these wirings IL are electrically connected to the first gates of the transistors 140*a* and the first gates of the transistors 140*b* arranged in the column direction. When a potential at which the transistor 140*a* and the transistor 140*b* are always kept in an off state is applied to the wirings IL, the adjacent cells can be electrically isolated from each other.

For example, the conductor 240 is electrically connected to the BL02, the conductor 260_2 is electrically connected to the WL03, and the conductor 260_3 is electrically connected to the WL04 as illustrated in the cell 600 which is connected to the BL02, the WL03, and the WL04 in FIG. 21.

In addition, the transistor 200*a* and the transistor 200*b* which are included in the cell 600 may each be provided with a second gate BG. The threshold voltage of the transistor can be controlled by a potential applied to the BG. The BG is connected to a transistor 400 and the potential applied to the BG can be controlled by the transistor 400. Furthermore, the conductor 235_2 of the capacitor 100*a* and the conductor 235_4 of the capacitor 100*b* which are included in the cell 600 are electrically connected to different wirings PL.

Figure 23:
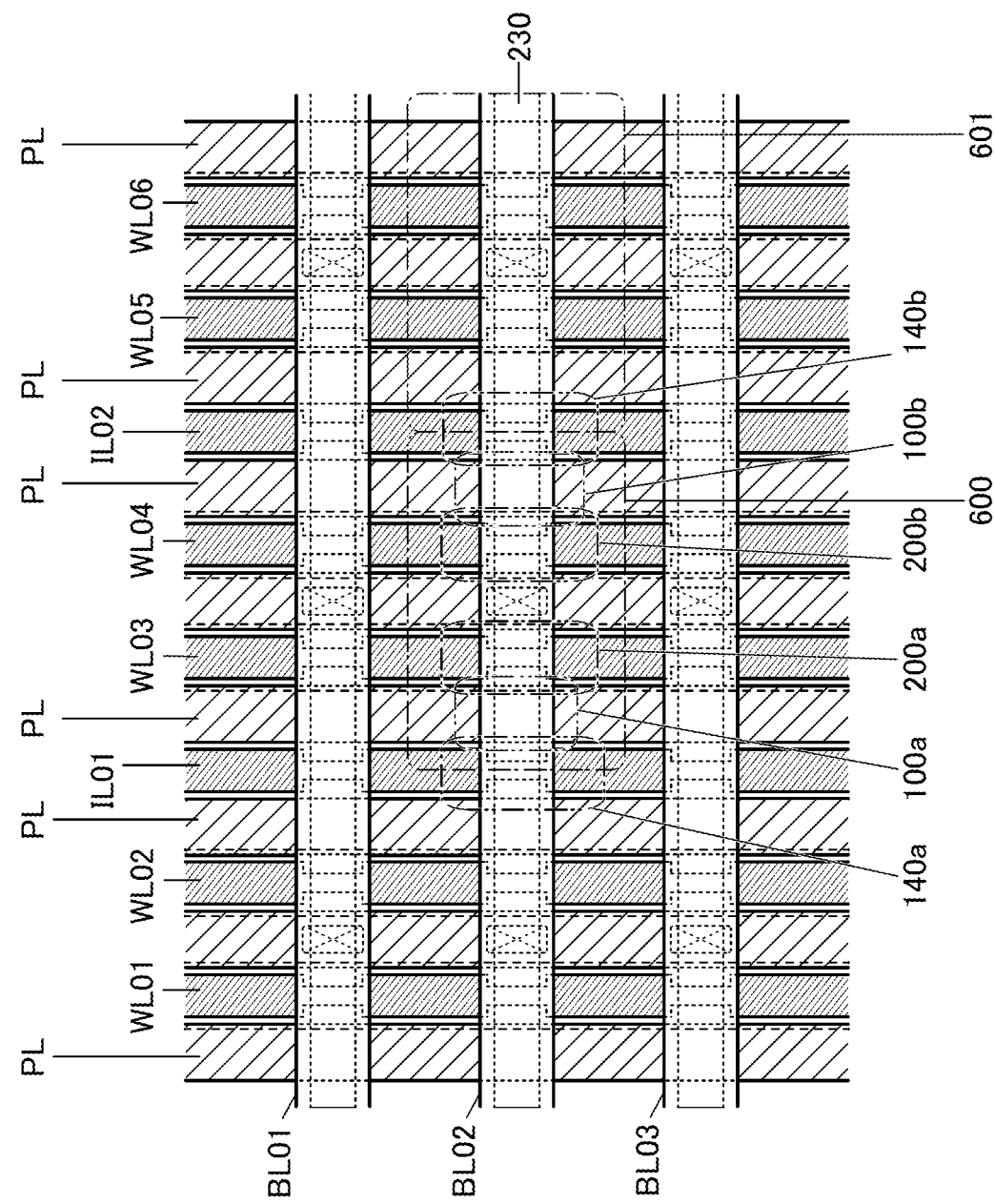
FIG. 23 A top view of a semiconductor device according to one embodiment of the present invention.

FIG. 23 is a schematic view illustrating a layout of the wirings and the components of the circuit diagram in FIG. 22. As shown in FIG. 23, the oxides 230 and the wirings WL are arranged in a matrix; thus, the semiconductor device of the circuit diagram shown in FIG. 22 can be formed. Here, the wirings BL are preferably provided in a layer different from the wirings WL and the oxides 230. Specifically, the capacitor 100*a* and the capacitor 100*b* are provided below the wirings BL, in which case the long side direction of the oxide 230 and the wiring BL can be substantially parallel to each other in the layout. Accordingly, the layout of the cell can be simplified, the design flexibility is increased, and the process cost can be reduced.

Furthermore, stacked cell arrays may be used instead of the single-layer cell array. By stacking a plurality of cell arrays, the cells can be integrated without an increase in the area occupied by the cell arrays. That is, a 3D cell array can be formed.

As described above, according to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device with low off-state current can be provided. According to one embodiment of the present invention, a transistor with high on-state current can be provided. According to one embodiment of the present invention, a highly reliable semiconductor device can be provided. According to one embodiment of the present invention, a semiconductor device with reduced power consumption can be provided. According to one embodiment of the present invention, a semiconductor device with high productivity can be provided.

The structures, methods, and the like described above in this embodiment can be used in an appropriate combination with the structures, methods, and the like described in the other embodiments.

Embodiment 2

In this embodiment, one embodiment of a semiconductor device will be described with reference to FIG. 24.

[Memory Device 1]

Figure 24:
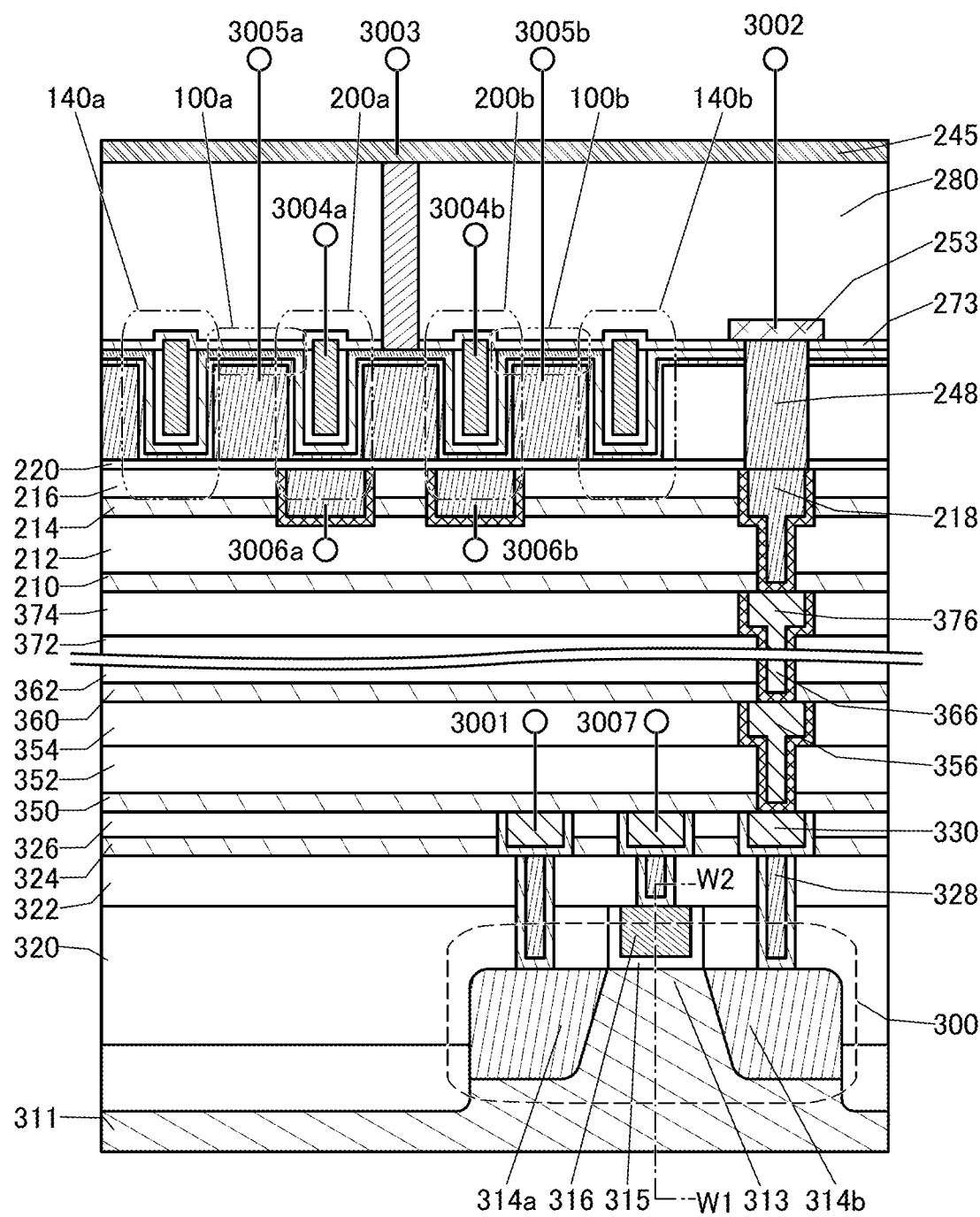
FIG. 24 A cross sectional view illustrating a structure of a memory device according to one embodiment of the present invention.
Figure 25:
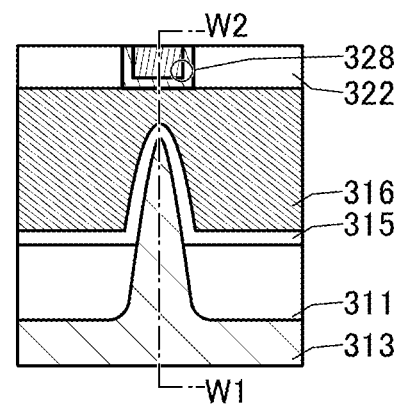
FIG. 25 A cross sectional view illustrating a structure of a memory device according to one embodiment of the present invention.

A memory device illustrated in FIG. 24 includes the transistor 200*a*, the transistor 200*b*, the capacitor 100*a*, the capacitor 100*b*, the transistor 140*a*, the transistor 140*b*, and a transistor 300. FIG. 24 is a cross-sectional view of the transistor 300 in the channel length direction. FIG. 25 is a cross-sectional view of a portion indicated by dashed-dotted line W1-W2 in FIG. 24. Thus, FIG. 25 is a cross-sectional view of the vicinity of the transistor 300 in the channel width direction of the transistor 300.

The transistor 200*a* and the transistor 200*b* are transistors in which a channel is formed in a semiconductor layer including an oxide semiconductor. Since the off-state current of the transistor 200*a* and the transistor 200*b* are small, by using the transistors in a memory device, stored data can be retained for a long time. In other words, such a memory device does not require refresh operation or has an extremely low frequency of the refresh operation, which leads to a sufficient reduction in power consumption of the memory device.

In the memory device illustrated in FIG. 24, a wiring 3001 is electrically connected to one of a source and a drain of the transistor 300, a wiring 3002 is electrically connected to the other of the source and the drain of the transistor 300, and a wiring 3007 is electrically connected to a gate of the transistor 300. Furthermore, a wiring 3003 is electrically connected to the one of the source and the drain of the transistor 200a and the one of the source and the drain of the transistor 200b. A wiring 3004a is electrically connected to the first gate of the transistor 200a, a wiring 3004b is electrically connected to the first gate of the transistor 200b, a wiring 3006a is electrically connected to the second gate of the transistor 200a, and a wiring 3006b is electrically connected to the second gate of the transistor 200b. Furthermore, a wiring 3005a is electrically connected to one electrode of the capacitor 100a and a wiring 3005b is electrically connected to one electrode of the capacitor 100b.

The semiconductor device illustrated in FIG. 24 can be used for a memory device provided with an oxide transistor, such as a DOSRAM described later. Since the potential of the other of the source and the drain (also referred to the other electrode of the capacitor 100a and the capacitor 100b) can be retained owing to the low off-state current of the transistor 200a and the transistor 200b, data can be written, retained, and read.

<Structure of Memory Device 1>

The semiconductor device of one embodiment of the present invention includes the transistor 200a, the transistor 200b, the capacitor 100a, the capacitor 100b, the transistor 140a, the transistor 140b, and the transistor 300 as illustrated in FIG. 24. The transistor 200a, the transistor 200b, the transistor 140a, the transistor 140b, the capacitor 100a, and the capacitor 100b are provided above the transistor 300, and the transistor 200a, the transistor 200b, the transistor 140a, the transistor 140b, the capacitor 100a, and the capacitor 100b are provided in the same layer. Note that the above embodiment can be referred to for the structures of the transistor 200a, the transistor 200b, the transistor 140a, the transistor 140b, the capacitor 100a, and the capacitor 100b.

The transistor 300 is provided over a substrate 311 and includes a conductor 316, an insulator 315, a semiconductor region 313 that is part of the substrate 311, and a low-resistance region 314a and a low-resistance region 314b functioning as a source and a drain.

As illustrated in FIG. 25, the top surface and the side surface are in the channel width direction of the semiconductor region 313 of the transistor 300 are covered with the conductor 316 with the insulator 315 provided therebetween. The effective channel width is increased in the FIN-type transistor 300, whereby the on-state characteristics of the transistor 300 can be improved. In addition, since contribution of the electric field of the gate electrode can be increased, the off-state characteristics of the transistor 300 can be improved.

The transistor 300 is of either a p-channel type or an n-channel type.

A region of the semiconductor region 313 where a channel is formed, a region in the vicinity thereof, the low-resistance region 314a and the low-resistance region 314b functioning as the source or the drain, and the like preferably include a semiconductor such as a silicon-based semiconductor, and preferably include single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is adjusted by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron; or a conductive material such as a metal material, an alloy material, or a metal oxide material can be used.

Note that since the work function of a conductor depends on a material of the conductor, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use a stacked layer of metal materials such as tungsten and aluminum as the conductor, and it is particularly preferable to use tungsten in terms of heat resistance.

Note that the transistor 300 illustrated in FIG. 24 is only an example and is not limited to the structure illustrated therein; an appropriate transistor may be used in accordance with a circuit structure or a driving method.

An insulator 320, an insulator 322, an insulator 324, and an insulator 326 are provided to be stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride may be used, for example.

The insulator 322 may have a function of a planarization film for planarizing a level difference caused by the transistor 300 or the like provided thereunder. For example, the top surface of the insulator 322 may be planarized by planarization treatment using a chemical mechanical polishing (CMP) method or the like to improve planarity.

The insulator 324 is preferably formed using a film with a barrier property that prevents hydrogen and impurities from diffusing from the substrate 311, the transistor 300, or the like into regions where the transistor 200a and the transistor 200b are provided.

As an example of the film having a barrier property against hydrogen, silicon nitride formed by a CVD method can be used. Here, diffusion of hydrogen into a semiconductor element including an oxide semiconductor, such as the transistor 200a and the transistor 200b, degrades the characteristics of the semiconductor element in some cases. Therefore, it is preferable to provide a film that inhibits diffusion of hydrogen between the transistor 300 and the transistor 200a and the transistor 200b. The film that inhibits diffusion of hydrogen is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is, for example, smaller than or equal to $10 \times 10^{15}$ atoms/cm$^2$, preferably smaller than or equal to $5\times10^{15}$ atoms/cm$^2$ in TDS analysis in a film-surface temperature range of 50° C. to 500° C., for example.

Note that the insulator 326 preferably has a lower dielectric constant than the insulator 324. For example, the dielectric constant of the insulator 326 is preferably lower than 4, further preferably lower than 3. Furthermore, for example, the dielectric constant of the insulator 326 is preferably 0.7 times or less, further preferably 0.6 times or less the dielectric constant of the insulator 324. When a material with a low dielectric constant is used for an interlayer film, the parasitic capacitance generated between wirings can be reduced.

Moreover, a conductor 328, a conductor 330, and the like that are electrically connected to the transistor 300 are embedded in the insulator 320, the insulator 322, the insulator 324, and the insulator 326. Note that the conductor 328 and the conductor 330 function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material for each of plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, an insulator 350 and an insulator 352 are sequentially stacked in FIG. 24. Furthermore, a conductor 356 is formed in the insulator 350 and the insulator 352. The conductor 356 functions as a plug or a wiring. Note that the conductor 356 can be provided using a material similar to those for the conductor 328 and the conductor 330.

Note that for example, as the insulator 350, an insulator having a barrier property against hydrogen is preferably used, as with the insulator 324. Furthermore, the conductor 356 preferably contains a conductor having a barrier property against hydrogen. In particular, the conductor having a barrier property against hydrogen is formed in an opening of the insulator 350 having a barrier property against hydrogen. In such a structure, the transistor 300 can be separated from the transistor 200a, the transistor 200b, the transistor 140a, and the transistor 140b by a barrier layer, so that the diffusion of hydrogen from the transistor 300 into the transistor 200a, the transistor 200b, the transistor 140a, and the transistor 140b can be inhibited.

Note that as the conductor having a barrier property against hydrogen, tantalum nitride is preferably used, for example. Furthermore, by stacking tantalum nitride and tungsten, which has high conductivity, the diffusion of hydrogen from the transistor 300 can be inhibited while the conductivity as a wiring is kept. In that case, the tantalum nitride layer having a barrier property against hydrogen preferably has a structure in which the tantalum nitride layer is in contact with the insulator 350 having a barrier property against hydrogen.

In the above, a wiring layer including the conductor 356 is described; however, the memory device of this embodiment is not limited thereto. Three or less wiring layers which are similar to the wiring layer including the conductor 356 may be provided, or five or more wiring layers which are similar to the wiring layer including the conductor 356 may be provided.

Furthermore, a wiring layer may be provided over the insulator 354 and the conductor 356. For example, a wiring layer including an insulator 360, an insulator 362, and a conductor 366 and a wiring layer including an insulator 372, an insulator 374, and a conductor 376 are stacked in this order in FIG. 24. Furthermore, a plurality of wiring layers may be provided between the wiring layer including the insulator 360, the insulator 362, and the conductor 366 and the wiring layer including the insulator 372, the insulator 374, and the conductor 376. Note that the conductor 366 and the conductor 376 function as plugs or wirings. Furthermore, the insulator 360 to the insulator 374 can be formed using a material similar to that for the above-described insulator.

The insulator 210 and the insulator 212 are stacked sequentially over the insulator 374. It is preferable to use a substance having a barrier property against oxygen or hydrogen for one of the insulator 210 and the insulator 212.

For the insulator 210, it is preferable to use, for example, a film having a barrier property that prevents diffusion of hydrogen or impurities from the substrate 311, a region where the transistor 300 is formed, or the like to a region where the transistor 200a, the transistor 200b, the transistor 140a, and the transistor 140b are formed. Therefore, a material similar to that for the insulator 324 can be used.

Furthermore, as an example of the film having a barrier property against hydrogen, silicon nitride formed by a CVD method can be used. Here, diffusion of hydrogen into a semiconductor element including an oxide semiconductor, such as the transistor 200a and the transistor 200b, degrades the characteristics of the semiconductor element in some cases. Therefore, it is preferable to provide a film that inhibits diffusion of hydrogen between the transistor 300 and the transistor 200a, the transistor 200b, the transistor 140a, and the transistor 140b. The film that inhibits diffusion of hydrogen is specifically a film from which a small amount of hydrogen is released.

For the film having a barrier property against hydrogen used for the insulator 210, for example, a metal oxide such as aluminum oxide, hafnium oxide, or tantalum oxide is preferably used.

In particular, aluminum oxide has an excellent blocking effect that inhibits the passage of both oxygen and impurities such as hydrogen and moisture which are factors of a change in electrical characteristics of the transistor. Accordingly, aluminum oxide can prevent entry of impurities such as hydrogen and moisture into the transistor 200a, the transistor 200b, the transistor 140a, and the transistor 140b in a manufacturing process of the transistor and after the manufacturing process. In addition, release of oxygen from the oxide included in the transistor 200a, the transistor 200b, the transistor 140a, and the transistor 140b can be inhibited. Therefore, aluminum oxide is suitably used as a protective film for the transistor 200a, the transistor 200b, the transistor 140a, and the transistor 140b.

A material similar to that for the insulator 320 can be used for the insulator 212, for example. Furthermore, when a material with a relatively low permittivity is used for an interlayer film, the parasitic capacitance generated between wirings can be reduced. A silicon oxide film or a silicon oxynitride film can be used for the insulator 212, for example.

A conductor 218, a conductor included in the transistor 200a and the transistor 200b, and the like are embedded in the insulator 210, the insulator 212, the insulator 214, and the insulator 216. Note that the conductor 218 has a function of a plug or a wiring that is electrically connected to the transistor 200a and the transistor 200b or the transistor 300. The conductor 218 can be provided using a material similar to those for the conductor 328 and the conductor 330.

In particular, the conductor 218 in a region in contact with the insulator 210 and the insulator 214 is preferably a conductor having a barrier property against oxygen, hydrogen, and water. With this structure, the transistor 300 can be separated from the transistor 200a, the transistor 200b, the transistor 140a, and the transistor 140b by a layer having a barrier property against oxygen, hydrogen, and water; thus, the diffusion of hydrogen from the transistor 300 into the transistor 200a, the transistor 200b, the transistor 140a, and the transistor 140b can be inhibited.

The transistor 200a, the transistor 200b, the transistor 140a, the transistor 140b, the capacitor 100a, and the capacitor 100b are provided over the insulator 212. Note that the structures of the transistor 200a, the transistor 200b, the transistor 140a, the transistor 140b, the capacitor 100a, and the capacitor 100b described in the above embodiment can be used as the structures of the transistor 200a, the transistor 200b, the transistor 140a, the transistor 140b, the capacitor 100a, and the capacitor 100b. Note that the transistor 200a, the transistor 200b, the transistor 140a, the transistor 140b, the capacitor 100a, and the capacitor 100b in FIG. 24 are just examples and the structures are not limited thereto; an appropriate transistor may be used in accordance with a circuit structure or a driving method.

Furthermore, a conductor 248 is provided in contact with the conductor 218, so that a conductor 253 which is connected to the transistor 300 can be extracted above the transistor 200a and the transistor 200b. The wiring 3002 is extracted above the transistor 200a and the transistor 200b in FIG. 24 without being limited thereto; a structure may be employed in which the wiring 3001, the wiring 3007, and the like are extracted above the transistor 200a and the transistor 200b.

The above is the description of the structure example. With the use of this structure, variation in electrical characteristics can be reduced and reliability can be improved in a semiconductor device using a transistor including an oxide semiconductor. A transistor including an oxide semiconductor and having a high on-state current can be provided. A transistor including an oxide semiconductor and having a low off-state current can be provided. A semiconductor device with reduced power consumption can be provided.

<Memory Device 2>

A semiconductor device illustrated in FIG. 26 is a memory device including a transistor 400, the transistor 200a, the transistor 200b, the transistor 140a, the transistor 140b, the capacitor 100a, and the capacitor 100b. One embodiment of the memory device will be described below with reference to FIG. 26.

Figure 26A:
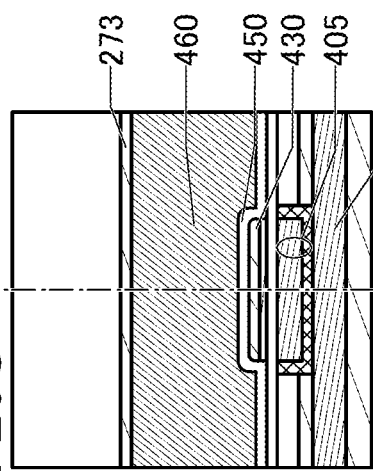
FIGS. 26A to 26C A circuit diagram and cross-sectional views illustrating a structure of a memory device according to one embodiment of the present invention.
Figure 26C:
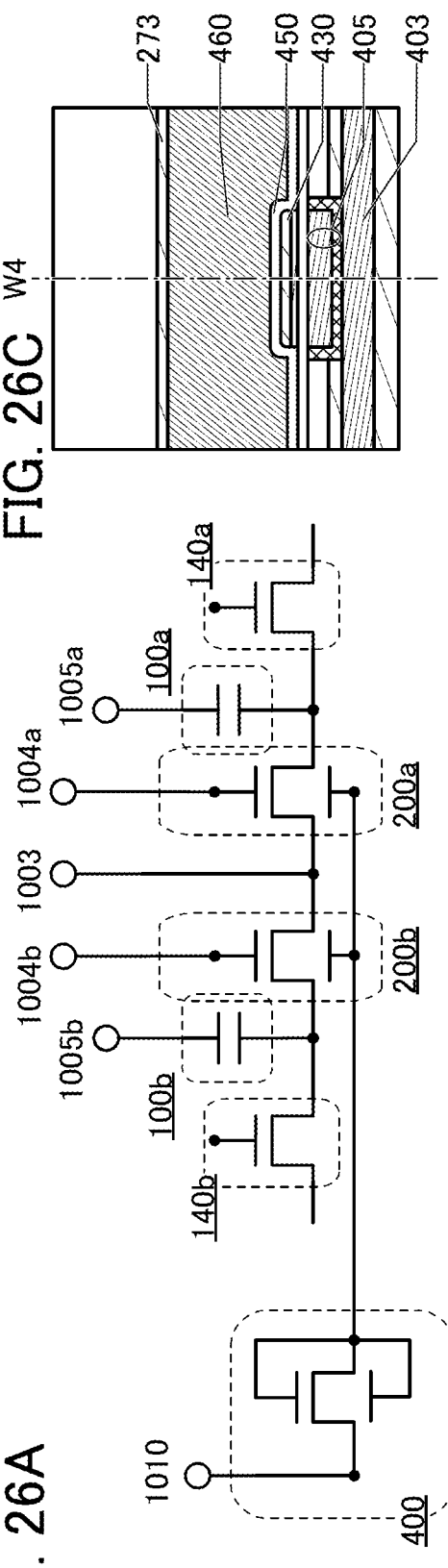
Figure 26B:
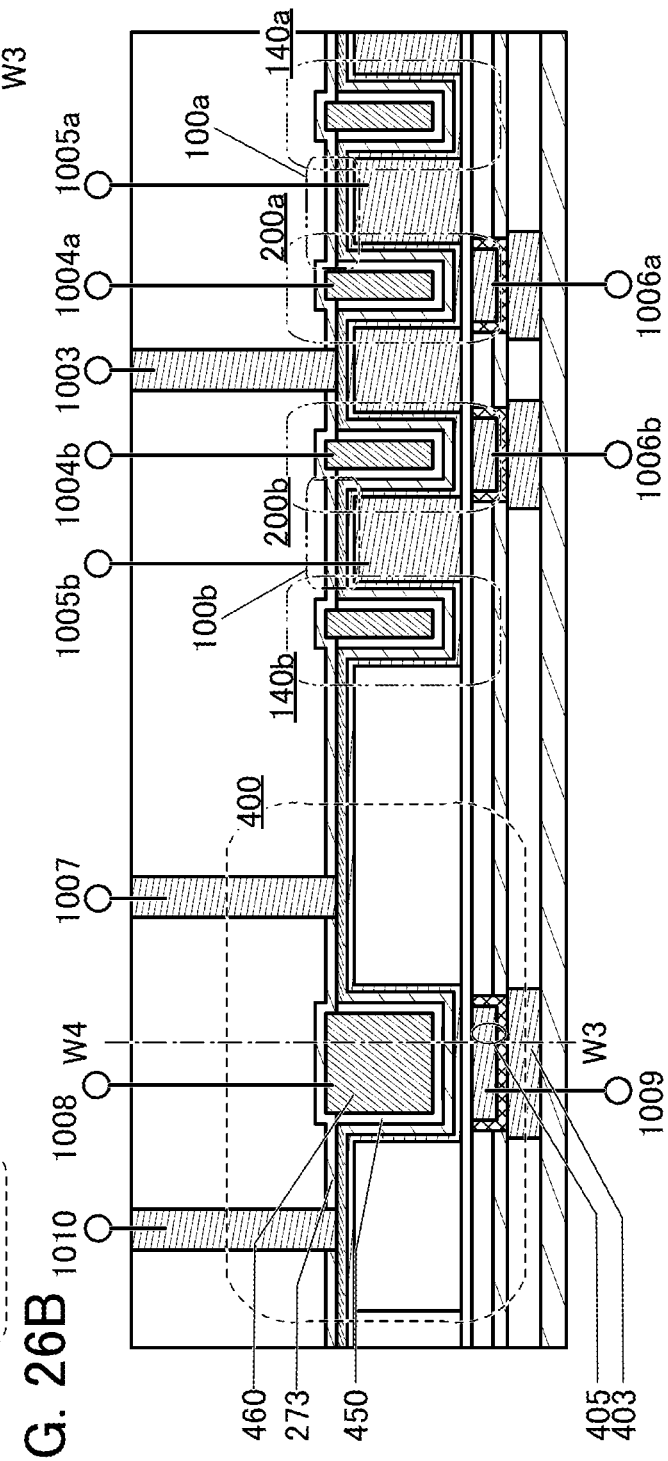

FIG. 26(A) is a circuit diagram illustrating an example of the connection relation of the transistor 400, the transistor 200a, the transistor 200b, the capacitor 100a, and the capacitor 100b in the semiconductor device described in this embodiment. Furthermore, a cross-sectional view of the semiconductor device including a wiring 1003 to a wiring 1010 that correspond to those in FIG. 26(A) is shown in FIG. 26(B). Furthermore, FIG. 26(C) is a cross-sectional view of a portion indicated by dashed-dotted line W3-W4 in FIG. 26(B). FIG. 26(C) is a cross-sectional view in the channel width direction of a channel formation region of the transistor 400.

As illustrated in FIG. 26, a gate of the transistor 200a is electrically connected to a wiring 1004a and one of a source and a drain of the transistor 200a is electrically connected to the wiring 1003. Furthermore, the other of the source and the drain of the transistor 200a also functions as one electrode of the capacitor 100a. The other electrode of the capacitor 100a is electrically connected to a wiring 1005a. In the transistor 200b, the gate is electrically connected to a wiring 1004b and one of a source and a drain is electrically connected to the wiring 1003. Furthermore, the other of the source and drain of the transistor 200b also functions as one electrode of the capacitor 100b. The other electrode of the capacitor 100b is electrically connected to a wiring 1005b. A drain of the transistor 400 is electrically connected to the wiring 1010. The second gate of the transistor 200a, the second gate of the transistor 200b, a source of the transistor 400, a first gate of the transistor 400, and a second gate of the transistor 400 are electrically connected through the wiring 1006a, the wiring 1006b, the wiring 1007, the wiring 1008, and the wiring 1009, respectively.

The on state and the off state of the transistor 200a can be controlled by application of a potential to the wiring 1004a. When the transistor 200a is brought into an on state and a potential is applied to the wiring 1003, charges can be supplied to the capacitor 100a through the transistor 200a. At this time, by bringing the transistor 200a into an off state, the charges supplied to the capacitor 100a can be retained. By application of a given potential to the wiring 1005a, the potential of a connection portion between the transistor 200a and the capacitor 100a can be controlled by capacitive coupling. For example, when a ground potential is applied to the wiring 1005a, the charges are retained easily.

Similarly, the on state and the off state of the transistor 200b can be controlled by application of a potential to the wiring 1004b. When the transistor 200b is brought into an on state and a potential is applied to the wiring 1003, charges can be supplied to the capacitor 100b through the transistor 200b. At this time, by bringing the transistor 200b into an off state, the charges supplied to the capacitor 100b can be retained. By application of a given potential to the wiring 1005b, the potential of a connection portion between the transistor 200b and the capacitor 100b can be controlled by capacitive coupling. For example, when a ground potential is applied to the wiring 1005b, the charges are retained easily. Furthermore, by application of a negative potential to the wiring 1010, the negative potential is applied to the second gates of the transistor 200a and the transistor 200b through the transistor 400, whereby the threshold voltages of the transistor 200a and the transistor 200b can be higher than 0 V, the off-state current can be reduced, and the drain current when the first gate voltage is 0 V can be extremely low.

With a structure in which the first gate and the second gate of the transistor 400 are diode-connected to the source thereof, and the source of the transistor 400 is connected to the second gates of the transistor 200a and the transistor 200b, the second gate voltage of each of the transistor 200a and the transistor 200b can be controlled by the wiring 1010. When negative potentials of the second gates of the transistor 200a and the transistor 200b are retained, a first gate-source voltage and a second gate-source voltage of the transistor 400 are 0 V. In the transistor 400, a drain current when the first gate voltage is 0 V is extremely low and the threshold voltage is higher than the threshold voltages of the transistor 200a and the transistor 200b; thus, with such a structure, the negative potentials of the second gates of the transistor 200a and the transistor 200b can be retained for a long time even without power supply to the transistor 400.

Furthermore, the negative potentials of the second gates of the transistor 200a and the transistor 200b are retained, so that the drain current when the voltage of the first gate of the transistor 200a and the first gate of the transistor 200b is 0 V can be extremely low even without power supply to the transistor 200a and the transistor 200b. In other words, the charges can be retained in the capacitor 100a and the capacitor 100b for a long time even without power supply to the transistor 200a, the transistor 200b, and the transistor 400. For example, with the use of such a semiconductor device as a memory element, memory can be retained for a long time without power supply. Therefore, a memory device with a low refresh frequency or a memory device that does not need refresh operation can be provided.

Note that the connection relation of the transistor 200a, the transistor 200b, the transistor 400, the capacitor 100a, and the capacitor 100b is not limited to that illustrated in FIGS. 26(A) and 26(B). The connection relation can be modified as appropriate in accordance with a necessary circuit structure.

<Structure of Memory Device 2>

FIG. 26(B) is a cross-sectional view of the memory device including the capacitor 100a, the capacitor 100b, the transistor 200a, the transistor 200b, the transistor 140a, the transistor 140b, and the transistor 400. Note that in the memory device illustrated in FIG. 26, components having the same functions as the components in the semiconductor device and the memory device described in the above embodiment and <Structure of memory device 1> are denoted by the same reference numerals.

The memory device of one embodiment of the present invention includes the transistor 400, the transistor 200a, the transistor 200b, the transistor 140a, the transistor 140b, the capacitor 100a, and the capacitor 100b as illustrated in FIG. 26. The transistor 400, the transistor 200a, the transistor 200b, the transistor 140a, the transistor 140b, the capacitor 100a, and the capacitor 100b are provided in the same layer.

Note that the capacitors and the transistors included in the semiconductor device described in the above embodiments and with reference to FIG. 1 may be used as the transistor 200a, the transistor 200b, the transistor 140a, the transistor 140b, the capacitor 100a, and the capacitor 100b. Note that the capacitor 100a, the capacitor 100b, the transistor 200a, the transistor 200b, the transistor 140a, the transistor 140b, and the transistor 400 illustrated in FIG. 26 are only examples and the structures are not limited thereto; an appropriate transistor may be used in accordance with a circuit structure or a driving method.

The transistor 400 and the transistor 200 are formed in the same layer and thus can be manufactured in parallel. The transistor 400 includes a conductor 460 functioning as a first gate electrode, a conductor 405 functioning as a second gate electrode, an insulator 450 in contact with a side surface of the conductor 460, and the oxide 230 functioning as a source or a drain. Furthermore, the conductor 405 functioning as the second gate electrode is electrically connected to a conductor 403 functioning as a wiring.

In the transistor 400, the conductor 405 is in the same layer as the conductor 203_1 and the conductor 203_2. The insulator 450 is in the same layer as the insulator 250_1, the insulator 250_2, the insulator 250_3, and the insulator 250_4. The conductor 460 is in the same layer as the conductor 260_1, the conductor 260_2, the conductor 260_3, and the conductor 260_4.

In the oxide 230 functioning as an active layer of the transistor 400, oxygen vacancies are reduced and impurities such as hydrogen and water are also reduced. Accordingly, the threshold voltage of the transistor 400 can be higher than 0 V, an off-state current can be reduced, and the drain current when the second gate voltage and the first gate voltage are 0 V can be extremely low.

With the use of this structure, variation in electrical characteristics can be reduced and reliability can be improved in a semiconductor device using a transistor including an oxide semiconductor. Power consumption of a semiconductor device using a transistor including an oxide semiconductor can be reduced. A semiconductor device using a transistor including an oxide semiconductor can be miniaturized or highly integrated. A miniaturized or highly integrated semiconductor device can be provided with high productivity.

The structures, methods, and the like described above in this embodiment can be used in an appropriate combination with the structures, methods, and the like described in the other embodiments.

Embodiment 3

In this embodiment, a DOSRAM (registered trademark) will be described as an example of a memory device including a transistor in which an oxide is used for a semiconductor (hereinafter referred to as an OS transistor) and a capacitor, which is one embodiment of the present invention, with reference to FIG. 27 and FIG. 28. A DOSRAM is an abbreviation of "Dynamic Oxide Semiconductor RAM," which is a RAM including a IT (transistor) 1C (capacitor) memory cell. Note that hereinafter, a memory device including an OS transistor, such as a DOSRAM, is referred to as an OS memory in some cases.

A memory device in which OS transistors are used in memory cells (hereinafter referred to as an OS memory) is applied to the DOSRAM. The OS memory is a memory including at least a capacitor and an OS transistor that controls charge and discharge of the capacitor. The OS memory has excellent retention characteristics because the OS transistor has an extremely low off-state current and thus can function as a nonvolatile memory.

<<DOSRAM 1400>>

Figure 27:
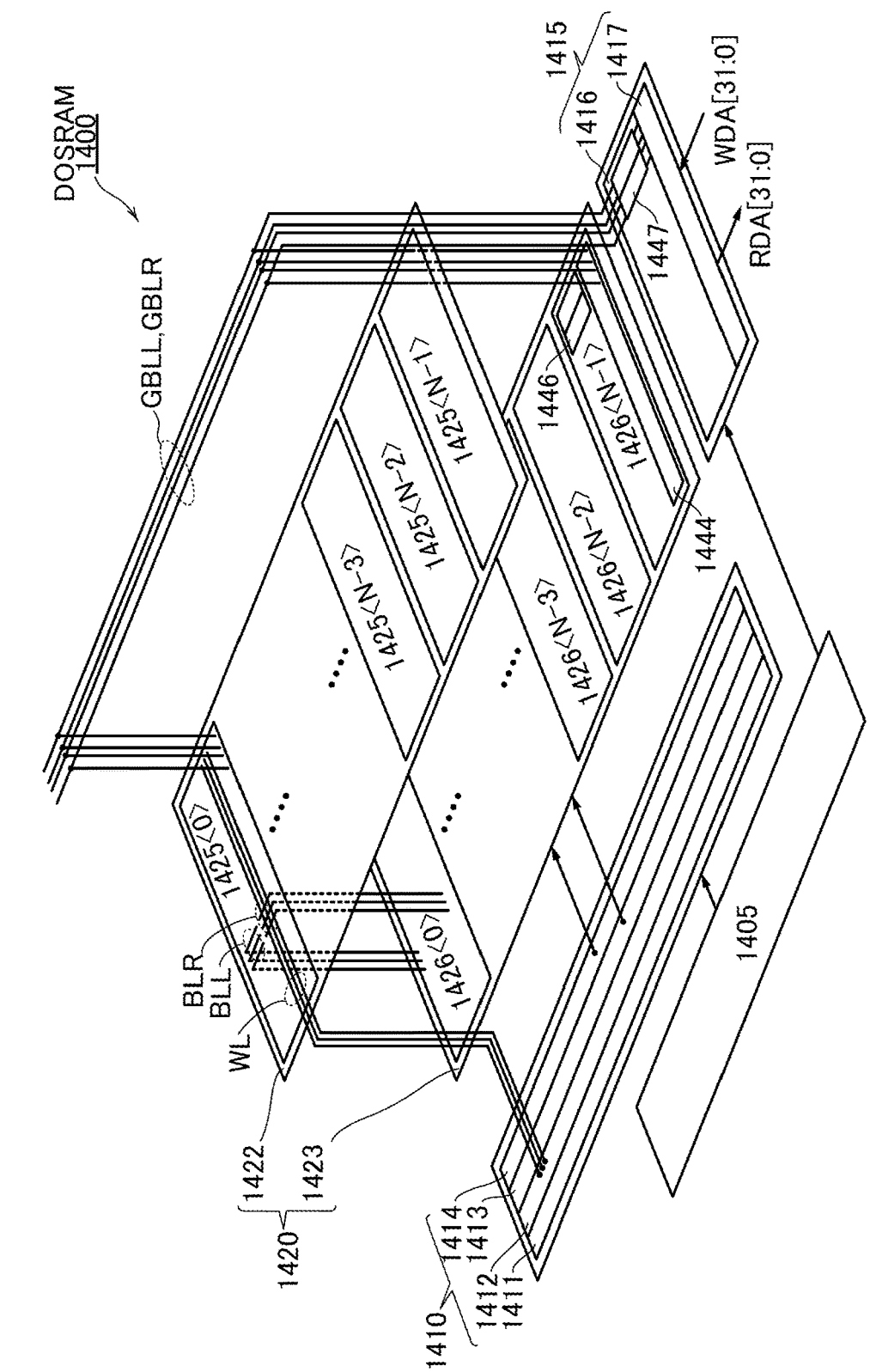
FIG. 27 A block diagram illustrating a structure example of a memory device according to one embodiment of the present invention.

FIG. 27 illustrates a structure example of the DOSRAM. As illustrated in FIG. 27, a DOSRAM 1400 includes a controller 1405, a row circuit 1410, a column circuit 1415, and a memory cell and sense amplifier array 1420 (hereinafter referred to as an "MC-SA array 1420").

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts, as the bit-line structure, a hierarchical bit line structure hierarchized with local bit lines and global bit lines.

Figure 28A:
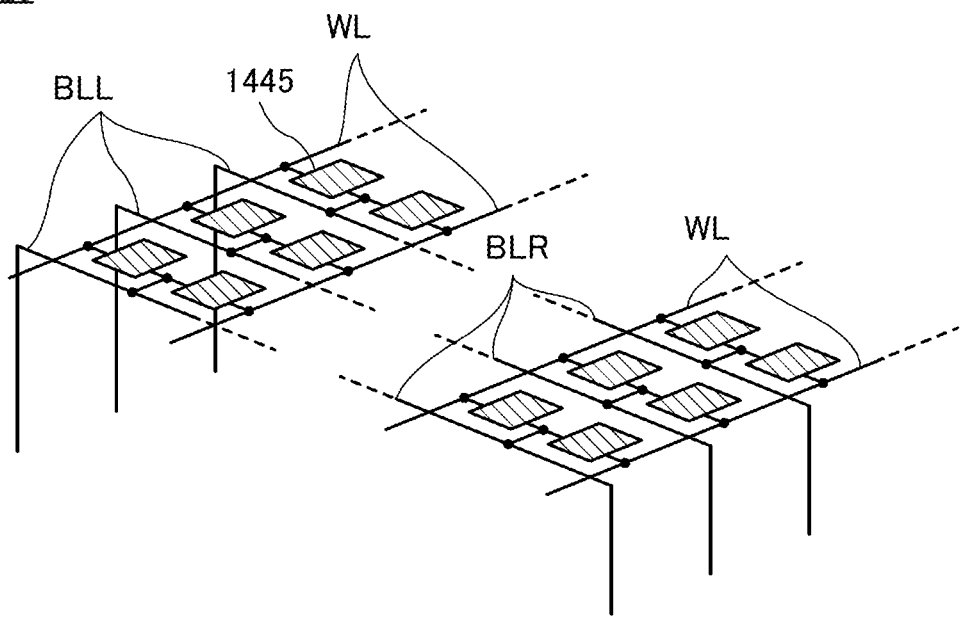
FIGS. 28A and 28B A block diagram and a circuit diagram illustrating a structure example of a memory device according to one embodiment of the present invention.

The memory cell array 1422 includes N local memory cell arrays 1425<0> to 1425<N−1>, where N is an integer greater than or equal to 2. FIG. 28(A) illustrates a structure example of the local memory cell array 1425. The local memory cell array 1425 includes a plurality of memory cells 1445, a plurality of word lines WL, and a plurality of bit lines BLL and BLR. In the example in FIG. 28(A), the local memory cell array 1425 has an open bit-line architecture but may have a folded bit-line architecture.

Figure 28B:
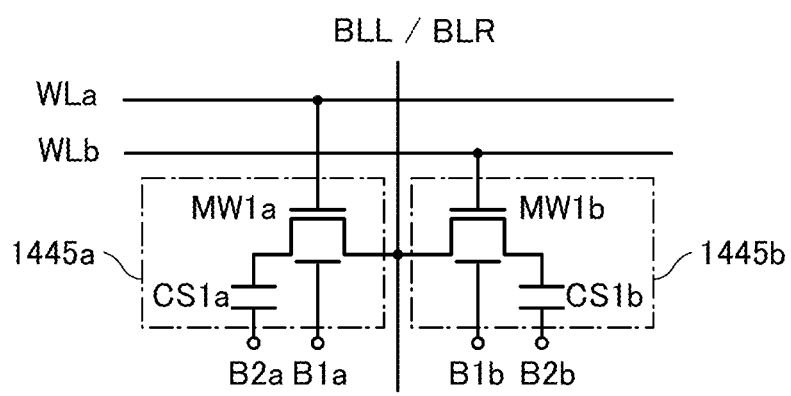

FIG. 28(B) illustrates a circuit structure example of a pair of memory cells 1445a and 1445b connected to the same bit line BLL (BLR). The memory cell 1445a includes a transistor MW1a, a capacitor CS1a, and terminals B1a and B2a, and is connected to a word line WLa and the bit line BLL (BLR). The memory cell 1445b includes a transistor MW1b, a capacitor CS1b, and terminals B1b and B2b, and is connected to a word line WLb and the bit line BLL (BLR). Note that hereinafter, in the case where either the memory cell 1445a or the memory cell 1445b is not particularly limited, reference numerals without the letter "a" or "b" are used for the memory cell 1445 and its components, in some cases.

The transistor MW1a has a function of controlling the charging and discharging of the capacitor CS1a, and the transistor MW1b has a function of controlling the charging and discharging of the capacitor CS1b. A gate of the transistor MW1a is electrically connected to the word line WLa, a first terminal of the transistor MW1a is electrically connected to the bit line BLL (BLR), and a second terminal of the transistor MW1a is electrically connected to a first terminal of the capacitor CS1a. A gate of the transistor MW1b is electrically connected to the word line WLb, a first terminal of the transistor MW1b is electrically connected to the bit line BLL (BLR), and a second terminal of the transistor MW1b is electrically connected to a first terminal of the capacitor CS1b. In this way, the bit line BLL (BLR) is shared by the first terminal of the transistor MW1a and the first terminal of the transistor MW1b.

The transistor MW1 has a function of controlling the charging and discharging of the capacitor CS1. A second terminal of the capacitor CS1 is electrically connected to a terminal B2. A constant voltage (e.g., a low power supply voltage) is input to the terminal B2.

In the case where the semiconductor device described in any of the above embodiments is used for the memory cells 1445a and 1445b, the transistor 200a can be used as the transistor MW1a, the transistor 200b can be used as the transistor MW1b, the capacitor 100a can be used as the capacitor CS1a, and the capacitor 100b can be used as the capacitor CS1b. Thus, the area occupied by one set consisting of a transistor and a capacitor in the top view can be reduced, so that the memory device of this embodiment can be further highly integrated. Thus, storage capacity per unit area of the memory device of this embodiment can be increased.

The transistor MW1 includes a back gate, and the back gate is electrically connected to the terminal B1. This makes it possible to change the threshold voltage of the transistor MW1 with a voltage of the terminal B1. For example, the voltage of the terminal B1 is a fixed voltage (e.g., a negative constant voltage); alternatively, the voltage of the terminal B1 may be changed in response to the operation of the DOSRAM 1400.

The back gate of the transistor MW1 may be electrically connected to the gate, the first terminal, or the second terminal of the transistor MW1. Alternatively, the back gate is not necessarily provided in the transistor MW1.

The sense amplifier array 1423 includes N local sense amplifier arrays 1426<0> to 1426<N−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a voltage difference between the bit line pair, and a function of retaining the voltage difference. The switch array 1444 has a function of selecting a bit line pair and bringing the selected bit line pair and a global bit line pair into a conduction state.

Here, a bit line pair refers to two bit lines which are compared by a sense amplifier at the same time. A global bit line pair refers to two global bit lines which are compared by a global sense amplifier at the same time. The bit line pair can be referred to as a pair of bit lines, and the global bit line pair can be referred to as a pair of global bit lines. Here, the bit line BLL and the bit line BLR form one bit line pair. The global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. With the selection signal from the column selector 1413, the switch array 1444 of each local sense amplifier array 1426 is controlled. With the control signal from the sense amplifier driver circuit 1414, the plurality of local sense amplifier arrays 1426 are independently driven.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a voltage difference between the global bit line pair (GBLL, GBLR), and a function of retaining the voltage difference. Data is written to and read from the global bit line pair (GBLL, GBLR) by the input/output circuit 1417.

The write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address, the data of the global bit line pair is written to the bit line pair of a column where data is to be written. The local sense amplifier array 1426 amplifies the written data, and retains the amplified data. In the specified local memory cell array 1425, the word line WL of a target row is selected by the row circuit 1410, and the data retained at the local sense amplifier array 1426 is written to the memory cell 1445 of the selected row.

The read operation of the DOSRAM 1400 is briefly described. One row of the local memory cell array 1425 is specified by an address signal. In the specified local memory cell array 1425, the word line WL of a target row is in a selected state, and data of the memory cell 1445 is written to the bit line. The local sense amplifier array 1426 detects a voltage difference between the bit line pair of each column as data, and retains the data. Among the data retained at the local sense amplifier array 1426, the data of a column specified by the address signal is written to the global bit line pair by the switch array 1444. The global sense amplifier array 1416 detects and retains the data of the global bit line pair. The data retained in the global sense amplifier array 1416 is output to the input/output circuit 1417. Thus, the reading operation is completed.

There is theoretically no limitation on the number of rewriting operations of the DOSRAM 1400 because data is rewritten by charging and discharging of the capacitor CS1; and data can be written and read with low energy. In addition, the memory cell 1445 has a simple circuit structure, and thus the capacity can be easily increased.

The transistor MW1 is an OS transistor. The extremely low off-state current of the OS transistor can inhibit charge leakage from the capacitor CS1. Therefore, the retention time of the DOSRAM 1400 is much longer than that of a DRAM. This allows less frequent refresh, which can reduce the power needed for refresh operations. Thus, the DOSRAM 1400 is suitable for a memory device that rewrites a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which can reduce the storage capacitance of the memory cell 1445. In addition, providing the switch array 1444 in the local sense amplifier array 1426 can reduce the number of long bit lines. For the reasons described above, a driving load during access to the DOSRAM 1400 is reduced, enabling a reduction in power consumption.

Thus, a DOSRAM including OS transistors can easily have a large capacity. In addition, the DOSRAM including OS transistors can retain data for a long time, which makes the refresh penalty substantially negligible. Furthermore, the DOSRAM including OS transistors can perform power gating of a peripheral circuit by utilizing the potential of the back gates.

Figure 29:
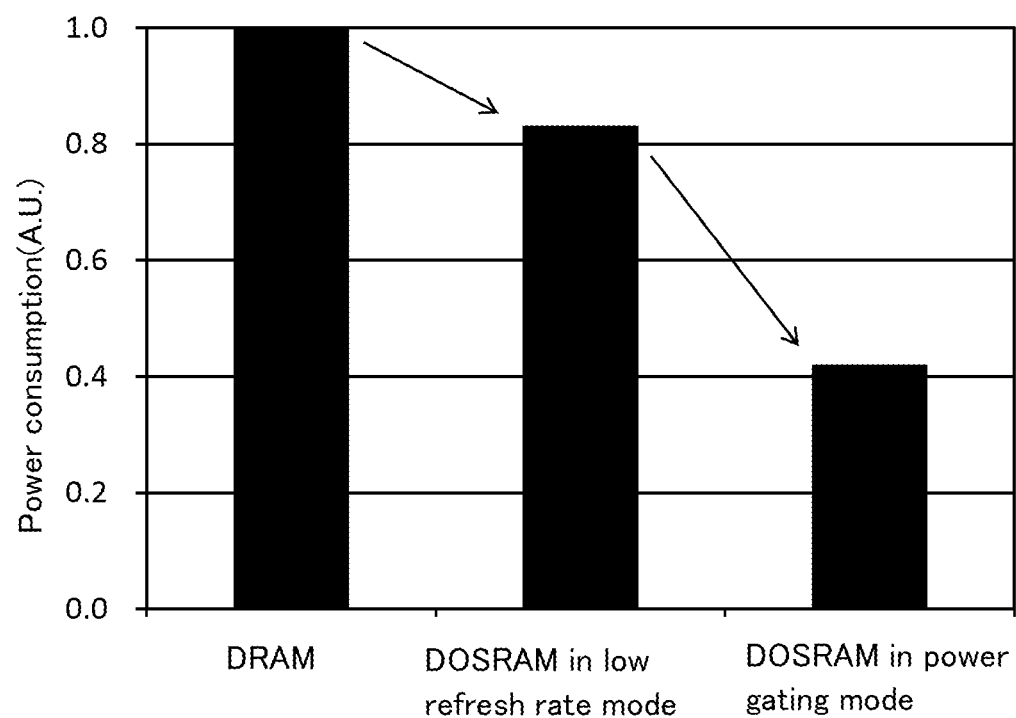
FIG. 29 A graph explaining power consumption of a memory device according to one embodiment of the present invention.

Here, FIG. 29 is a graph comparing the power consumptions of the DOSRAM including OS transistors and a general DRAM. Note that the vertical axis represents the proportion in actual use when the power consumption of the general DRAM is assumed to be 1 (A.U: arbitrary unit) (Power consumption). In the "actual use", the DOSRAM or DRAM is assumed to be active for 10% of a day and on standby or in a self-refresh mode for 90% of the day. As shown in the graph, in the case where the frequency of the refresh operation is reduced (DOSRAM in low refresh rate mode), the power consumption of the DOSRAM including OS transistors can be probably lower than the power consumption of the general DRAM by approximately 20%. Furthermore, in the case where power gating is performed (DOSRAM in power gating mode), the power consumption of the DOSRAM including OS transistors can be probably lower than that of the general DRAM by approximately 60%.

The structures described in this embodiment can be used in an appropriate combination with the structures described in the other embodiments.

Embodiment 4

In this embodiment, an AI system in which the semiconductor device of the above embodiment is used will be described with reference to FIG. 30.

Figure 30:
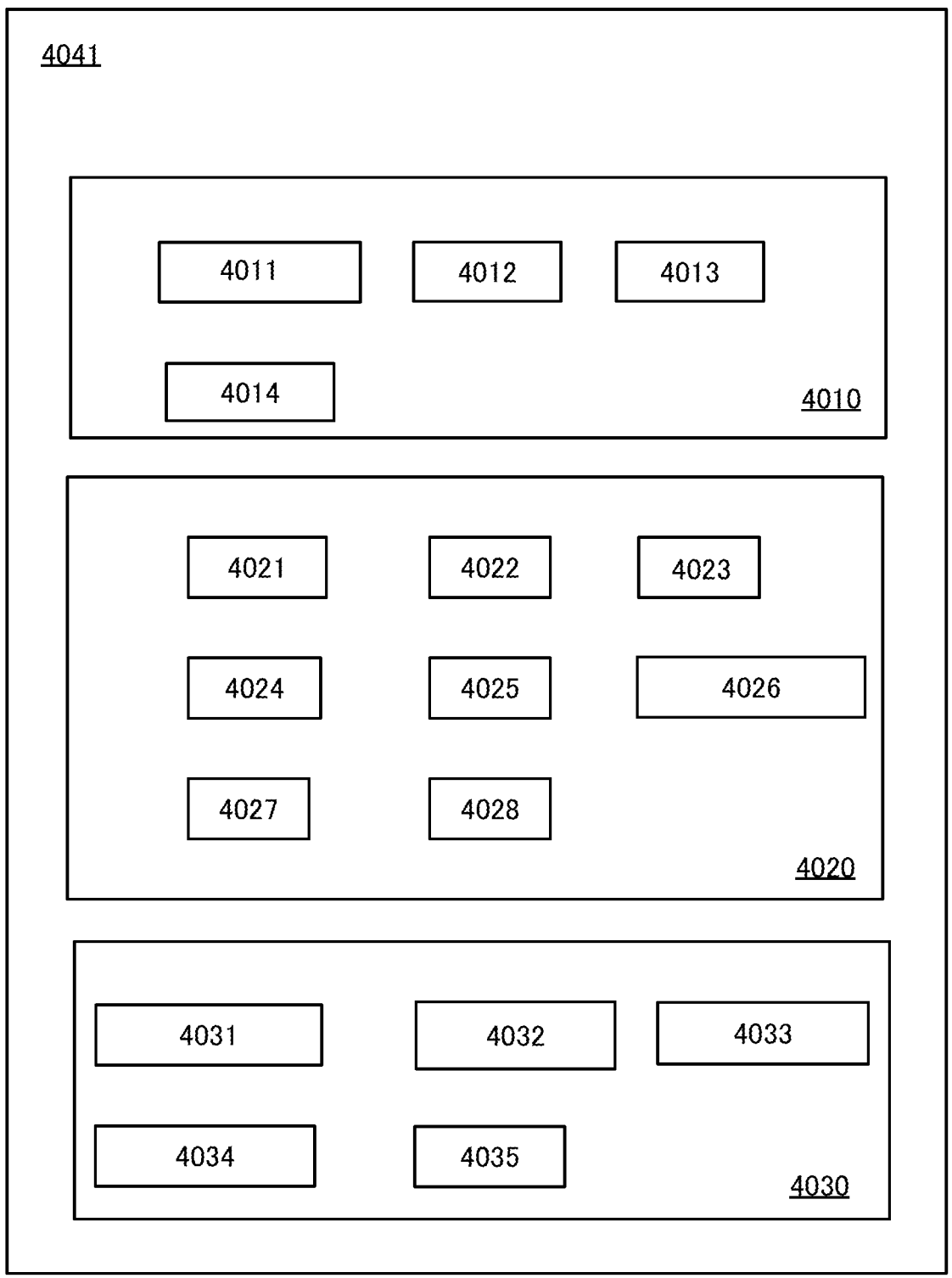
FIG. 30 A block diagram illustrating a structure example of an AI system according to one embodiment of the present invention.

FIG. 30 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA 4014. The DOSRAM 1400 described in the above embodiment can be used as the DOSRAM 4012.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in the SRAM 4024, the input data have to be subdivided and stored because of the circuit area limitation and small storage capacity of the SRAM 4024. The DOSRAM 4012 has a larger storage capacity than the SRAM 4024 because the memory cells can be arranged to be highly integrated even in a limited circuit area. Therefore, the DOSRAM 4012 can efficiently store the input data.

The NOSRAM 4013 is a nonvolatile memory using an OS transistor. NOSRAM (registered trademark) is an abbreviation of "Nonvolatile Oxide Semiconductor RAM", which indicates a RAM including a gain cell (2 T or 3 T) memory cell. As in the DOSRAM, an OS memory can be used in the NOSRAM of this embodiment.

The NOSRAM 4013 consumes less power in data writing than the other nonvolatile memories such as a flash memory, a ReRAM (Resistive Random Access Memory), and an MRAM (Magnetoresistive Random Access Memory). Furthermore, unlike in a flash memory and a ReRAM, elements do not deteriorate by data writing and there is no limitation on the number of times of data writing.

Furthermore, the NOSRAM 4013 can store multilevel data of two or more bits as well as one-bit binary data. Storage of the multilevel data in the NOSRAM 4013 leads to a reduction in the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data is included in the analog data in some cases.

Data and parameters used in the neural network calculation can be once stored in the NOSRAM 4013. The data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 can have a longer bit line than the DOSRAM 4012 and thus can have an increased storage capacity.

The FPGA 4014 is an FPGA using an OS transistor. In the FPGA of this embodiment, an OS memory can be used for a configuration memory and a register. Here, such an FPGA is referred to as an "OS-FPGA". With the use of the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), or a deep belief network (DBN) described later, with hardware. Establishing the connection of the neural network with hardware enables higher speed performance.

The FPGA 4014 is an OS-FPGA. An OS-FPGA can have a smaller memory area than an FPGA including an SRAM. Thus, adding a context switching function only causes a small increase in area. Moreover, an OS-FPGA can transmit data and parameters at high speed by boosting.

In the AI system 4041, the analog arithmetic circuit 4011, the DOSRAM 4012, the NOSRAM 4013, and the FPGA 4014 can be provided on one die (chip). Thus, the AI system 4041 can execute calculation of the neural network quickly with low power consumption. In addition, the analog arithmetic circuit 4011, the DOSRAM 4012, the NOSRAM 4013, and the FPGA 4014 can be fabricated through the same manufacturing process. Therefore, the AI system 4041 can be fabricated at low cost.

Note that the arithmetic portion 4010 does not need to include all of the following: the DOSRAM 4012, the NOSRAM 4013, and the FPGA 4014. One or more selected from the DOSRAM 4012, the NOSRAM 4013, and the FPGA 4014 are provided in accordance with a problem that is desired to be solved by the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing at least one of these methods. Furthermore, part or the whole of the program may be stored in the NOSRAM 4013.

Most of the existing programs used as libraries are premised on processing with a GPU. Therefore, the AI system 4041 preferably includes the GPU 4022. The AI system 4041 can execute the bottleneck product-sum operation among all the product-sum operations used for learning and inference in the arithmetic portion 4010, and can execute the other product-sum operations in the GPU 4022. In this manner, the learning and inference can be executed at high speed.

The power supply circuit 4027 generates not only a low power supply potential for a logic circuit but also a potential for an analog operation. An OS memory may be used for the power supply circuit 4027. When a reference potential is stored in the OS memory, the power consumption of the power supply circuit 4027 can be reduced.

The PMU 4028 has a function of temporarily stopping the power supply to the AI system 4041.

The CPU 4021 and the GPU 4022 preferably include OS memories as registers. By including the OS memories, the CPU 4021 and the GPU 4022 can retain data (logic values) in the OS memories even when power supply is stopped. As a result, the AI system 4041 can save the power.

The PLL 4023 has a function of generating a clock. The AI system 4041 performs an operation on the basis of the clock generated by the PLL 4023. The PLL 4023 preferably includes an OS memory. By including the OS memory, the PLL 4023 can retain an analog potential with which the clock oscillation cycle is controlled.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. Thus, data transmission can be performed at high speed.

Some or all of the circuits illustrated in the control portion 4020 can be formed on the same die as the arithmetic portion 4010. Thus, the AI system 4041 can execute the neural network calculation at high speed with low power consumption.

Data used for the neural network calculation is stored in an external storage device (an HDD (Hard Disk Drive), an SSD (Solid State Drive), or the like) in many cases. Therefore, the AI system 4041 preferably includes the external memory control circuit 4031 functioning as an interface with the external storage device.

Because learning and inference using the neural network often deal with audio and video, the AI system 4041 includes the audio codec 4032 and the video codec 4033. The audio codec 4032 encodes and decodes audio data, and the video codec 4033 encodes and decodes video data.

The AI system 4041 can perform learning or inference using data obtained from an external sensor. For this reason, the AI system 4041 includes the general-purpose input/output module 4034. The general-purpose input/output module 4034 includes a USB (Universal Serial Bus), an I2C (Inter-Integrated Circuit), or the like, for example.

The AI system 4041 can perform learning or inference using data obtained via the Internet. For this reason, the AI system 4041 preferably includes the communication module 4035.

The analog arithmetic circuit 4011 may use a multi-level flash memory as an analog memory. However, the flash memory has a limitation on the number of rewriting times. In addition, it is extremely difficult to embed the multi-level flash memory (to form the arithmetic circuit and the memory on the same die).

Alternatively, the analog arithmetic circuit 4011 may use a ReRAM as an analog memory. However, the ReRAM has a limitation on the number of rewriting times and also has a problem in storage accuracy. Moreover, the ReRAM is a two-terminal element, and thus has a complicated circuit design for separating data writing and data reading.

Further alternatively, the analog arithmetic circuit 4011 may use an MRAM as an analog memory. However, the MRAM has a problem in storage accuracy because of its low magnetoresistive ratio.

In consideration of the above, the analog arithmetic circuit 4011 preferably uses an OS memory as an analog memory.

The structures described in this embodiment can be used in an appropriate combination with the structures described in the other embodiments.

Embodiment 5

Application Example of AI System

In this embodiment, application examples of the AI system described in the above embodiment will be described with reference to FIG. 31.

Figure 31A:
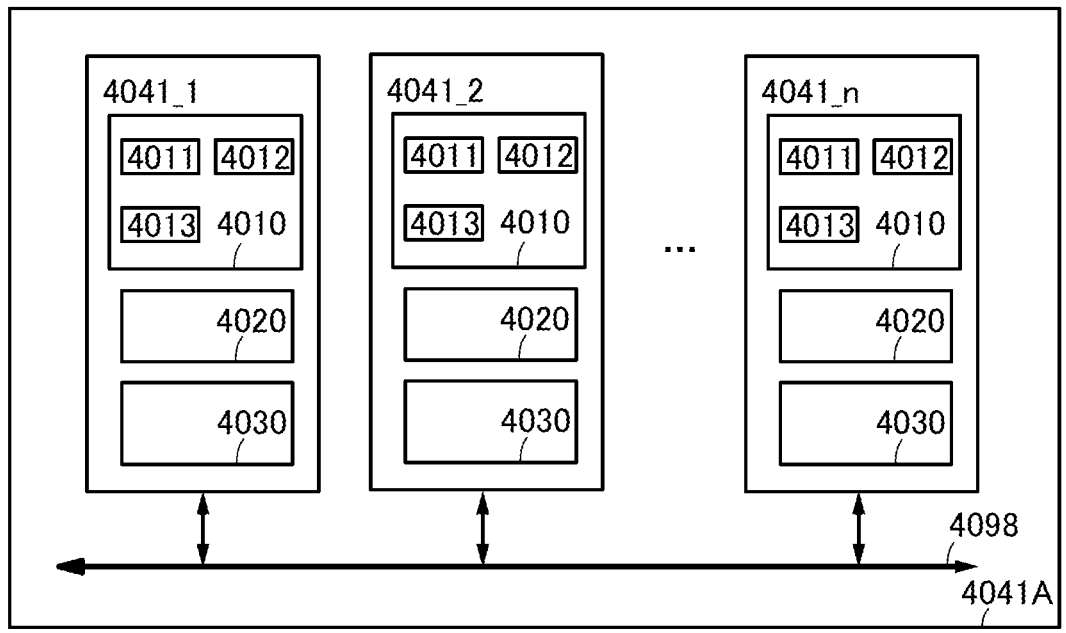
FIGS. 31A and 31B Block diagrams illustrating application examples of an AI system according to one embodiment of the present invention.

FIG. 31(A) is an AI system 4041A in which the AI systems 4041 described with FIG. 30 are arranged in parallel and a signal can be transmitted between the systems via a bus line.

The AI system 4041A illustrated in FIG. 31(A) includes a plurality of AI systems 4041_1 to 4041_*n* (*n* is a natural number). The AI system 4041_1 to the AI system 4041_*n* are connected to each other via a bus line 4098.

Figure 31B:
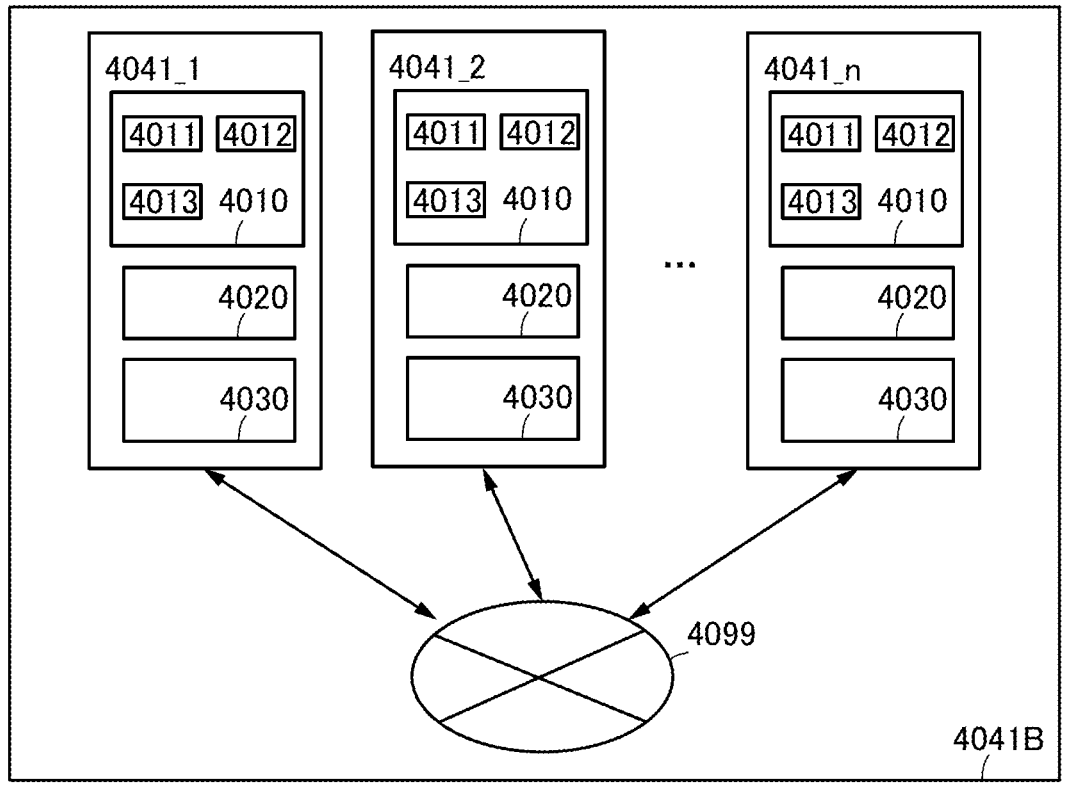

FIG. 31(B) is an AI system 4041B in which the AI systems 4041 described with FIG. 30 are arranged in parallel as in FIG. 31(A) and a signal can be transmitted between the systems via a network.

The AI system 4041B illustrated in FIG. 31(B) includes the plurality of AI systems 4041_1 to 4041_*n*. The AI system 4041_1 to the AI system 4041_*n* are connected to each other via a network 4099.

A structure may be employed in which a communication module is provided for each of the AI system 4041_1 to the AI system 4041_*n* to perform wireless or wired communication via the network 4099. The communication module can perform communication via an antenna. For example, the communication can be performed in such a manner that each electronic device is connected to a computer network such as the Internet that is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a specification that is communication standardized by IEEE such as Wi-Fi (registered trademark), Bluetooth (registered trademark), or ZigBee (registered trademark).

With the structure in FIG. 31(A) or 31(B), analog signals obtained with external sensors or the like can be processed by different AI systems. For example, biological information such as brain waves, a pulse, blood pressure, and body temperature can be obtained with a variety of sensors such as a brain wave sensor, a pulse wave sensor, a blood pressure sensor, and a temperature sensor, and analog signals can be processed by different AI systems. When the signal processing or learning is performed by different AI systems, the amount of information processed by each AI system can be reduced. Accordingly, the signal processing or learning can be performed with a smaller amount of arithmetic processing. As a result, recognition accuracy can be increased. The information obtained with each AI system is expected to enable instant understanding of collective biological information that irregularly changes.

The structures described in this embodiment can be used in an appropriate combination with the structures described in the other embodiments.

Embodiment 6

In this embodiment, an example of an IC into which the AI system described in the above embodiment is incorporated will be described.

In the AI system described in the above embodiment, a digital processing circuit such as a CPU that includes a Si transistor, an analog arithmetic circuit that uses an OS transistor, an OS-FPGA, and an OS memory such as a DOSRAM or a NOSRAM can be integrated into one die.

Figure 32:
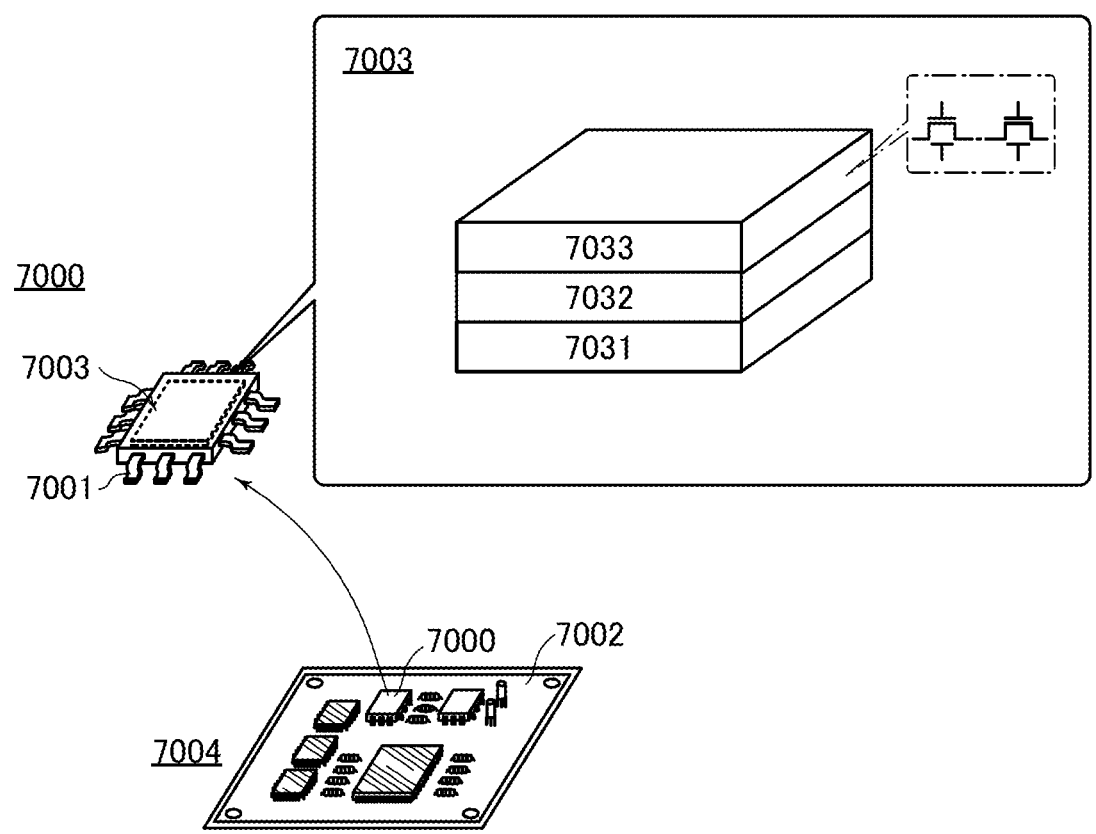
FIG. 32 A schematic perspective view illustrating a structure example of an IC including an AI system according to one embodiment of the present invention.

FIG. 32 illustrates the example of the IC into which the AI system is incorporated. An AI system IC 7000 illustrated in FIG. 32 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a circuit board 7004) is completed. In the circuit portion 7003, the various circuits described in the above embodiment are provided on one die. The circuit portion 7003 has a stacked-layer structure, and is broadly divided into a Si transistor layer 7031, a wiring layer 7032, and an OS transistor layer 7033. Since the OS transistor layer 7033 can be provided to be stacked over the Si transistor layer 7031, the size of the AI system IC 7000 can be easily reduced.

Although a QFP (Quad Flat Package) is used as a package of the AI system IC 7000 in FIG. 32, the embodiment of the package is not limited thereto.

The digital processing circuit such as a CPU, the analog arithmetic circuit that uses an OS transistor, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of constituent elements is increased, and accordingly the AI system can be incorporated into the IC at low cost.

The structure described in this embodiment can be used in combination with the structures described in the other embodiments, as appropriate.

Embodiment 7

<Electronic Device>

A semiconductor device of one embodiment of the present invention can be used for a variety of electronic devices. FIG. 33 illustrates specific examples of the electronic devices using the semiconductor device of one embodiment of the present invention.

Figure 33A:
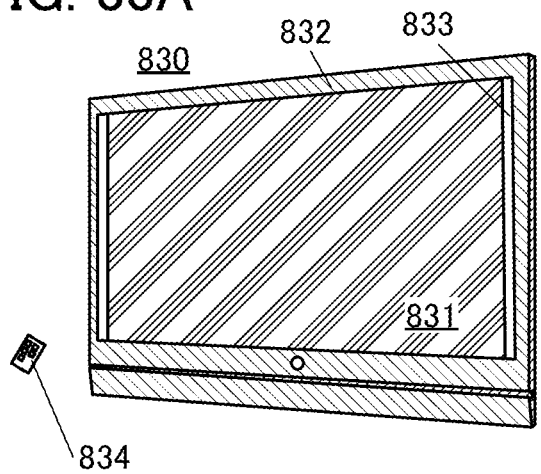
FIGS. 33A to 33F Diagrams each illustrating an electronic device according to one embodiment of the present invention.

FIG. 33(A) illustrates a monitor 830. The monitor 830 includes a display portion 831, a housing 832, a speaker 833, and the like. Furthermore, an LED lamp, operation keys (including a power switch or an operation switch), a connection terminal, a variety of sensors, a microphone, and the like can be included. The monitor 830 can be controlled with a remote controller 834.

The monitor 830 can function as a television device by receiving airwaves.

Examples of the airwaves the monitor 830 can receive include ground waves and waves transmitted from a satellite. The example of the airwaves also include analog broadcasting, digital broadcasting, image-sound-only broadcasting, and sound-only broadcasting. For example, airwaves transmitted in a certain frequency band in a UHF band (higher than or equal to 300 MHz and lower than or equal to 3 GHz) or a VHF band (higher than or equal to 30 MHz and lower than or equal to 300 MHz) can be received. When a plurality of pieces of data received in a plurality of frequency bands is used, the transfer rate can be increased and more information can be obtained. Accordingly, the display portion 831 can display an image with a resolution exceeding the full high definition. An image with a resolution of, for example, 4K2K, 8K4K, 16K8K, or more can be displayed.

A structure may be employed in which an image to be displayed on the display portion 831 is generated using broadcasting data transmitted with a technology for transmitting data via a computer network such as the Internet, a LAN (Local Area Network), or Wi-Fi (registered trademark). In this case, the monitor 830 does not need to include a tuner.

The monitor 830 can be used as a computer monitor when connected to a computer. Several people can see the monitor 830 connected to a computer at the same time; thus, the monitor 830 can be used for a conference system. The monitor 830 can also be used for a videoconference system by display of data in a computer via a network or connection of the monitor 830 itself to a network.

The monitor 830 can also be used as a digital signage.

The semiconductor device of one embodiment of the present invention can be used for, for example, a driver circuit or an image processing portion of the display portion. When the semiconductor device of one embodiment of the present invention is used for the driver circuit or the image processing portion of the display portion, high-speed operation or signal processing can be achieved with low power consumption.

When an AI system using the semiconductor device of one embodiment of the present invention is used for the image processing portion of the monitor 830, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Figure 33B:
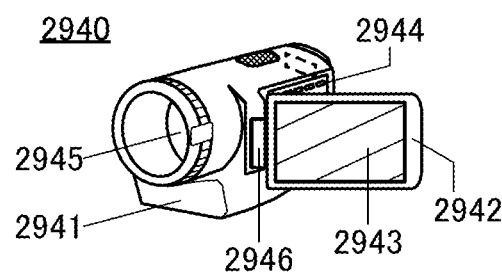

A video camera 2940 illustrated in FIG. 33(B) includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. A structure is employed in which the housing 2941 and the housing 2942 are connected to each other with the joint 2946, and the angle between the housing 2941 and the housing 2942 can be changed with the joint 2946. The orientation of an image displayed on the display portion 2943 may be changed and display and non-display of an image can be switched depending on the angle between the housing 2941 and the housing 2942.

The semiconductor device of one embodiment of the present invention can be used for, for example, a driver circuit or an image processing portion of the display portion. When the semiconductor device of one embodiment of the present invention is used for the driver circuit or the image processing portion of the display portion, high-speed operation or signal processing can be achieved with low power consumption.

When an AI system using the semiconductor device of one embodiment of the present invention is used for the image processing portion of the video camera 2940, imaging appropriate for the surroundings of the video camera 2940 can be achieved. Specifically, imaging can be performed with optimal exposure for the surrounding brightness. In the case of performing imaging with backlighting or imaging under different brightness conditions such as indoors and outdoors at the same time, high-dynamic-range (HDR) imaging can be performed.

Furthermore, the AI system can learn the user's habit and assist in performing imaging. Specifically, the AI system can learn the user's camera shaking habit and correct the camera shaking during imaging, so that blurring of the obtained image associated with camera shaking can be reduced as much as possible. In the case of using a zoom function during imaging, the orientation of the lens or the like can be controlled such that a subject is positioned at the center of an image all the time.

Figure 33C:
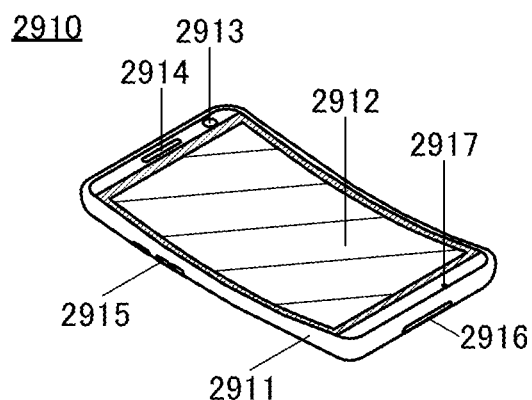

An information terminal 2910 illustrated in FIG. 33(C) includes a housing 2911, a display portion 2912, a microphone 2917, a speaker portion 2914, a camera 2913, an external connection portion 2916, operation switches 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

For example, a memory device using the semiconductor device of one embodiment of the present invention can retain control data, a control program, or the like of the information terminal 2910 for a long time.

When an AI system using the semiconductor device of one embodiment of the present invention is used for an image processing portion of the information terminal 2910, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Furthermore, the AI system can learn the user's habit and assist in operating the information terminal 2910. The information terminal 2910 into which the AI system is incorporated can predict touch input from the motion of the user's fingers, eyes, or the like.

Figure 33D:
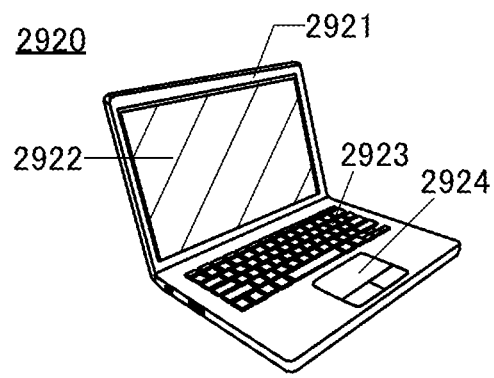

A laptop personal computer 2920 illustrated in FIG. 33(D) includes a housing 2921, a display portion 2922, a keyboard 2923, a pointing device 2924, and the like. The laptop personal computer 2920 also includes an antenna, a battery, and the like inside the housing 2921.

For example, a memory device using the semiconductor device of one embodiment of the present invention can retain control data, a control program, or the like of the laptop personal computer 2920 for a long time.

When an AI system using the semiconductor device of one embodiment of the present invention is used for an image processing portion of the laptop personal computer 2920, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Furthermore, the AI system can learn the user's habit and assist in operating the laptop personal computer 2920. The laptop personal computer 2920 into which the AI system is incorporated can predict touch input to the display portion 2922, from the motion of the user's fingers, eyes, or the like. In inputting text, the AI system predicts input from the past input text data or a text or a diagram such as a photograph around the text, to assist conversion. Accordingly, input mistakes and conversion mistakes can be reduced as much as possible.

Figure 33E:
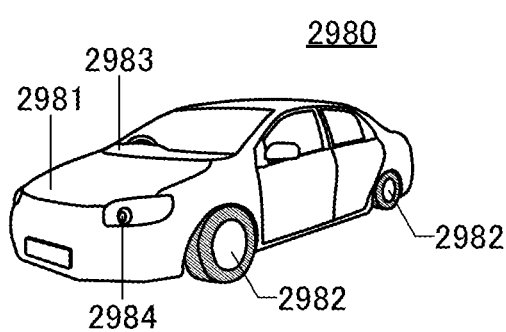
Figure 33F:
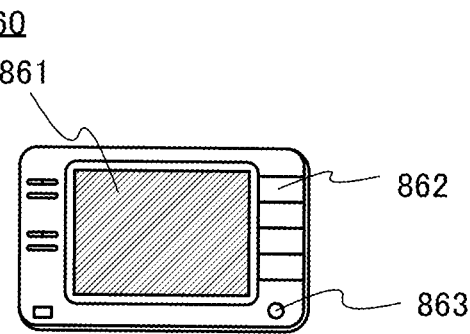

FIG. 33(E) is an external view illustrating an example of an automobile, and FIG. 33(F) illustrates a navigation device 860. An automobile 2980 includes a car body 2981, wheels 2982, a dashboard 2983, lights 2984, and the like. The automobile 2980 also includes an antenna, a battery, and the like. The navigation device 860 includes a display portion 861, operation buttons 862, and an external input terminal 863. The automobile 2980 and the navigation device 860 can be independent of each other; however, it is preferable that a structure be employed in which the navigation device 860 is incorporated into and liked to the automobile 2980.

For example, a memory device using the semiconductor device of one embodiment of the present invention can retain control data, a control program, or the like of the automobile 2980 or the navigation device 860 for a long time. When an AI system using the semiconductor device of one embodiment of the present invention is used for a control device or the like of the automobile 2980, the AI system can learn driver's driving skill and habit and assist in safe driving or driving involving efficient use of fuel such as gasoline or a battery. To assist in safe driving, the AI system learns not only driver's driving skill and habit, but also learns the behavior of the automobile such as the speed and movement of the automobile 2980, road information saved in the navigation device 860, and the like complexly; thus, driving lane departure can be prevented and collision with other automobiles, pedestrians, objects, and the like can be prevented. Specifically, when there is a sharp curve in the traveling direction, the navigation device 860 transmits the road information to the automobile 2980 so that the speed of the automobile 2980 can be controlled and steering can be assisted.

This embodiment can be implemented in an appropriate combination with the structures described in the other embodiments and the like.

REFERENCE NUMERALS

100*a*: capacitor, 100*b*: capacitor, 140*a*: transistor, 140*b*: transistor, 200: transistor, 200*a*: transistor, 200*b*: transistor, 203: conductor, 203_1: conductor, 203_2: conductor, 205: conductor, 205_1: conductor, 2052: conductor, 210: insulator, 212: insulator, 214: insulator, 216: insulator, 218: conductor, 220: insulator, 220_1: insulator, 220_2: insulator, 2203: insulator, 220_4: insulator, 220_5: insulator, 224: insulator, 230: oxide, 231: region, 231*a*: region, 231*b*: region, 234: region, 235: conductor, 235_1: conductor, 235_2: conductor, 2353: conductor, 235_4: conductor, 235_5: conductor, 240: conductor, 242: region, 242_1: region, 242_2: region, 242_3: region, 242_4: region, 242_5: region, 242A: film, 245: conductor, 248: conductor, 250: insulator, 250_1: insulator, 250_2: insulator, 250_3: insulator, 250_4: insulator, 250A: insulating film, 253: conductor, 253_3: conductor, 260: conductor, 260_1: conductor, 260_2: conductor, 260_3: conductor, 260_4: conductor, 260A: conductive film, 273: insulator, 278: dielectric, 280: insulator, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 366: conductor, 372: insulator, 374: insulator, 376: conductor, 400: transistor, 403: conductor, 405: conductor, 450: insulator, 460: conductor, 600: cell, 601: cell, 830: monitor, 831: display portion, 862: operation button, 863: external input terminal, 1003: wiring, 1004*a*: wiring, 1004*b*: wiring, 1005*a*: wiring, 1005*b*: wiring, 1006*a*: wiring, 1006*b*: wiring, 1007: wiring, 1008: wiring, 1009: wiring, 1010: wiring, 1400: DOSRAM, 1405: controller, 1410: row circuit, 1411: decoder, 1412: word line driver circuit, 1413: column selector, 1414: sense amplifier driver circuit, 1415: column circuit, 1416: global sense amplifier array, 1417: input/output circuit, 1420: MC-SA array, 1422: memory cell array, 1423: sense amplifier array, 1425: local memory cell array, 1426: local sense amplifier array, 1444: switch array, 1445: memory cell, 1445*a*: memory cell, 1445*b*: memory cell, 1446: sense amplifier, 1447: global sense amplifier, 2000: CDMA, 2910: information terminal, 2911: housing, 2912: display portion, 2913: camera, 2914: speaker portion, 2915: operation switch, 2916: external connection portion, 2917: microphone, 2920: laptop personal computer, 2921: housing, 2922: display portion, 2923: keyboard, 2924: pointing device, 2940: video camera, 2941: housing, 2942: housing, 2943: display portion, 2944: operation switch, 2945: lens, 2946: joint, 2980: automobile, 2981: car body, 2982: wheel, 2983: dashboard, 2984: light, 3001: wiring, 3002: wiring, 3003: wiring, 3004*a*: wiring, 3004*b*: wiring, 3005*a*: wiring, 3005*b*: wiring, 3006*a*: wiring, 3006*b*: wiring, 3007: wiring, 4010: arithmetic portion, 4011: analog arithmetic circuit, 4012: DOSRAM, 4013: NOSRAM, 4014: FPGA, 4020: control portion, 4021: CPU, 4022: GPU, 4023: PLL, 4024: SRAM, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041_*n*: AI system, 4041_1: AI system, 4041A: AI system, 4041B: AI system, 4098: bus line, 4099: network, 7000: AI system IC, 7001: lead, 7002: printed circuit board, 7003: circuit portion, 7004: circuit board, 7031: Si transistor layer, 7032: wiring layer, 7033: OS transistor layer.

The invention claimed is:

1. A semiconductor device comprising:
a first insulator;
a first conductor and a second conductor over the first insulator;
a third conductor provided between the first conductor and the second conductor;
a dielectric covering the first insulator and the first to third conductors;
an oxide over the dielectric;
a second insulator over and in contact with the oxide;
a fourth conductor over the second insulator;
a fifth conductor over the second insulator; and
a sixth conductor overlapping with the third conductor,
wherein a first part of the second insulator is positioned between the first conductor and the third conductor,
wherein a second part of the second insulator is positioned between the second conductor and the third conductor,
wherein each of a first side surface of the fourth conductor and a second side surface of the fourth conductor is in contact with the first part of the second insulator, and
wherein each of a first side surface of the fifth conductor and a second side surface of the fifth conductor is in contact with the second part of the second insulator.

2. The semiconductor device according to claim 1,
wherein the oxide is in contact with a side surface and a bottom surface of the first part of the second insulator,
wherein the oxide is in contact with a side surface and a bottom surface of the second part of the second insulator,
wherein the first part of the second insulator is in contact with a bottom surface of the fourth conductor, and
wherein the second part of the second insulator is in contact with a bottom surface of the fifth conductor.

3. The semiconductor device according to claim 1,
wherein the oxide comprises In, an element M, and Zn, the element M being Al, Ga, Y, or Sn.

4. The semiconductor device according to claim 1, further comprising:
a third insulator provided over the fourth conductor, the fifth conductor, and the second insulator; and
an opening which is included in the third insulator and through which the oxide is exposed,
wherein the sixth conductor is provided in the opening, and
wherein a seventh conductor functioning as a wiring is provided over the third insulator and the sixth conductor.

5. The semiconductor device according to claim 4,
wherein the first to fifth conductors are provided to be substantially perpendicular to a direction of a long side of the oxide, and
wherein the seventh conductor is provided to be substantially parallel to the direction of the long side of the oxide.

6. A semiconductor device comprising:
a first insulator;
a first conductor and a second conductor over the first insulator;
a third conductor provided between the first conductor and the second conductor;
a dielectric covering the first insulator and the first to third conductors;
an oxide over the dielectric;
a second insulator over and in contact with the oxide;
a fourth conductor over the second insulator;
a fifth conductor over the second insulator; and
a sixth conductor overlapping with the third conductor,
wherein a first part of the second insulator is positioned between the first conductor and the third conductor,
wherein a second part of the second insulator is positioned between the second conductor and the third conductor,
wherein each of a first side surface of the fourth conductor and a second side surface of the fourth conductor is in contact with the first part of the second insulator,
wherein each of a first side surface of the fifth conductor and a second side surface of the fifth conductor is in contact with the second part of the second insulator,
wherein a first transistor comprises the oxide, the first part of the second insulator, and the fourth conductor,
wherein a second transistor comprises the oxide, the second part of the second insulator, and the fifth conductor,
wherein a first capacitor comprises the first conductor, the dielectric, and the oxide,
wherein a second capacitor comprises the second conductor, the dielectric, and the oxide, and
wherein the first transistor and the second transistor are provided between the first capacitor and the second capacitor.

7. The semiconductor device according to claim 6,
wherein one of a source and a drain of the first transistor is also used as one of a source and a drain of the second transistor,
wherein the other of the source and the drain of the first transistor is also used as one electrode of the first capacitor,
wherein the other of the source and the drain of the second transistor is also used as one electrode of the second capacitor, wherein a channel length of the first transistor is larger than a length in a direction parallel to a short side of the fourth conductor, and wherein a channel length of the second transistor is larger than a length in a direction parallel to a short side of the fifth conductor.

8. The semiconductor device according to claim 6, wherein the oxide is in contact with a side surface and a bottom surface of the first part of the second insulator, wherein the oxide is in contact with a side surface and a bottom surface of the second part of the second insulator, wherein the first part of the second insulator is in contact with a bottom surface of the fourth conductor, and wherein the second part of the second insulator is in contact with a bottom surface of the fifth conductor.

9. The semiconductor device according to claim 6, wherein the oxide comprises In, an element M, and Zn, the element M being Al, Ga, Y, or Sn.

10. The semiconductor device according to claim 6, further comprising:

a third insulator provided over the first transistor, the second transistor, the first capacitor, and the second capacitor; and an opening which is included in the third insulator and through which the oxide is exposed, wherein the sixth conductor is provided in the opening, and wherein a seventh conductor functioning as a wiring is provided over the third insulator and the sixth conductor.

11. The semiconductor device according to claim 10, wherein the first to fifth conductors are provided to be substantially perpendicular to a direction of a long side of the oxide, and wherein the seventh conductor is provided to be substantially parallel to the direction of the long side of the oxide.

* * * * *